US011751384B2

(12) United States Patent
Choi

(10) Patent No.: US 11,751,384 B2
(45) Date of Patent: Sep. 5, 2023

(54) SEMICONDUCTOR MEMORY DEVICE AND MANUFACTURING METHOD OF THE SEMICONDUCTOR MEMORY DEVICE

(71) Applicant: SK hynix Inc., Icheon-si (KR)

(72) Inventor: Kang Sik Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 214 days.

(21) Appl. No.: 16/908,362

(22) Filed: Jun. 22, 2020

(65) Prior Publication Data

US 2021/0134821 A1 May 6, 2021

(30) Foreign Application Priority Data

Nov. 1, 2019 (KR) .......................... 10-2019-0138550

(51) Int. Cl.
| | |
|---|---|
| *H10B 43/50* | (2023.01) |
| *H10B 41/50* | (2023.01) |
| *H10B 41/27* | (2023.01) |
| *H01L 23/528* | (2006.01) |
| *G11C 5/02* | (2006.01) |
| *H10B 43/27* | (2023.01) |

(52) U.S. Cl.
CPC ............. *H10B 41/27* (2023.02); *G11C 5/025* (2013.01); *H01L 23/528* (2013.01); *H10B 43/27* (2023.02)

(58) Field of Classification Search
None
See application file for complete search history.

(56) References Cited

U.S. PATENT DOCUMENTS

| | | | |
|---|---|---|---|
| 9,449,987 B1 | 9/2016 | Miyata et al. | |
| 10,651,196 B1* | 5/2020 | Sharangpani | ..... H01L 21/76876 |
| 11,152,284 B1* | 10/2021 | Sato | ..................... H01L 23/481 |
| 2015/0104945 A1* | 4/2015 | Koh | .................... H01L 21/0271 |
| | | | 438/703 |
| 2016/0225785 A1* | 8/2016 | Kim | ................. H01L 27/11582 |
| 2018/0366486 A1* | 12/2018 | Hada | ................ H01L 27/11565 |
| 2019/0206727 A1* | 7/2019 | Matovu | ............ H01L 21/76811 |
| 2020/0075627 A1* | 3/2020 | Ahn | ................... H01L 27/11565 |
| 2020/0127006 A1* | 4/2020 | Otsu | ................ H01L 21/31144 |
| 2020/0381447 A1* | 12/2020 | Kim | ..................... H01L 23/5226 |
| 2021/0313281 A1* | 10/2021 | Kaminaga | ......... H01L 27/11556 |
| 2021/0335806 A1* | 10/2021 | Wu | .................... H01L 27/11565 |
| 2021/0335812 A1* | 10/2021 | Wu | .................... H01L 27/11582 |

FOREIGN PATENT DOCUMENTS

| | | |
|---|---|---|
| KR | 101119875 B1 | 4/2012 |
| KR | 1020170131945 A | 12/2017 |

* cited by examiner

*Primary Examiner* — Sarah K Salerno
(74) *Attorney, Agent, or Firm* — WILLIAM PARK & ASSOCIATES LTD.

(57) ABSTRACT

A semiconductor memory device includes a first stack including lower conductive patterns separated from each other and stacked on a substrate to form a lower stepped structure, a support pillar passing through the first stack and including an insulating layer, a second stack including upper conductive patterns separated from each other and stacked on the first stack, the upper conductive patterns including an upper stepped structure that does not overlap with the lower stepped structure and the support pillar, a channel structure passing through the second stack and the first stack, and a memory layer surrounding a sidewall of the channel structure.

16 Claims, 49 Drawing Sheets

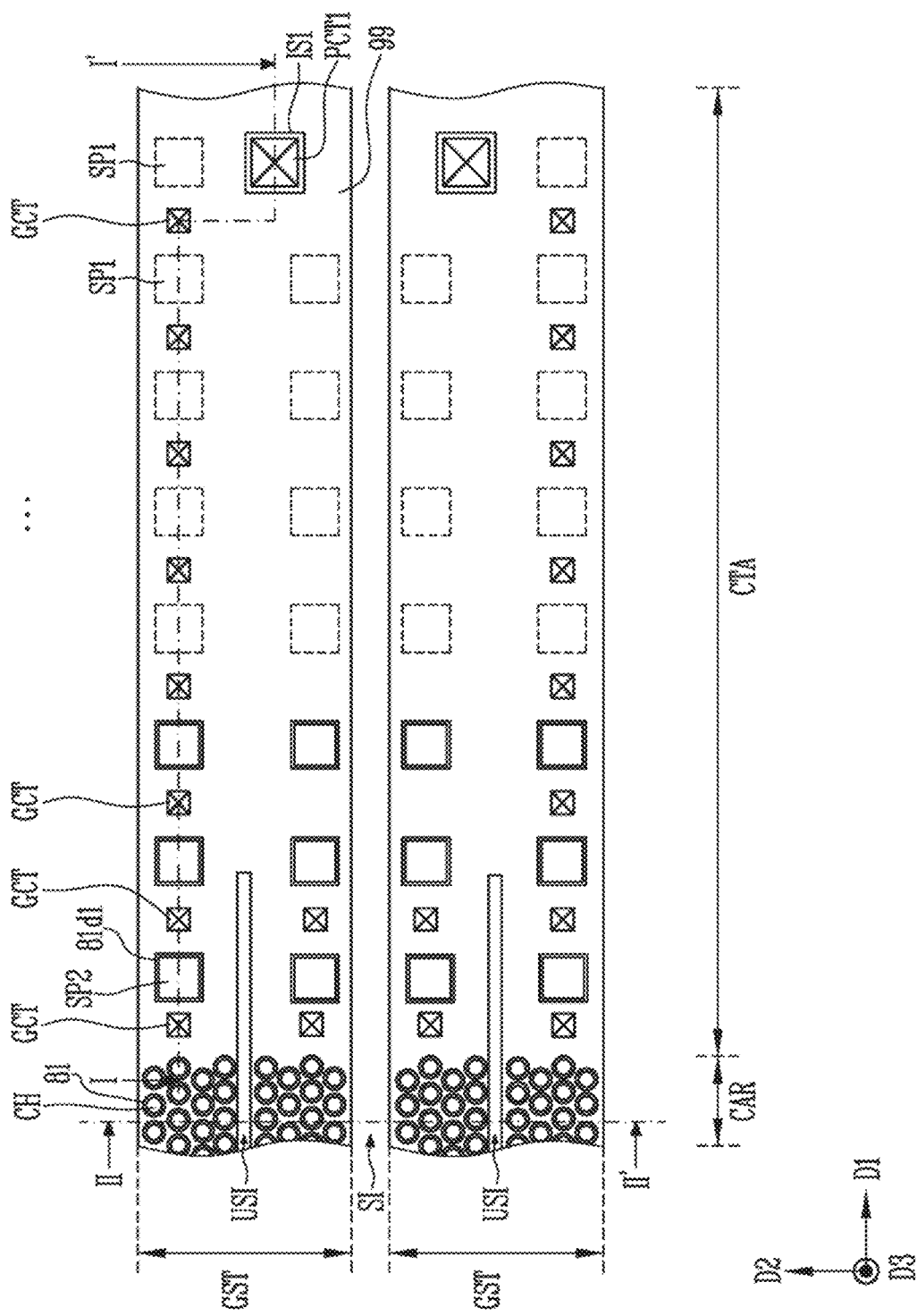

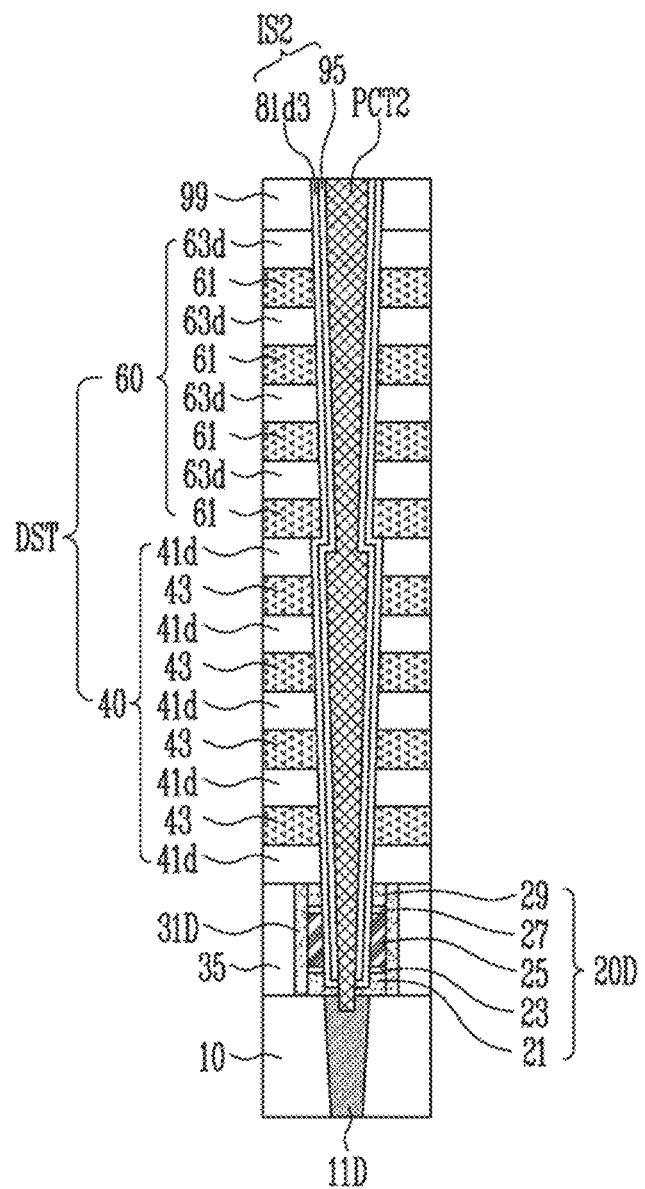

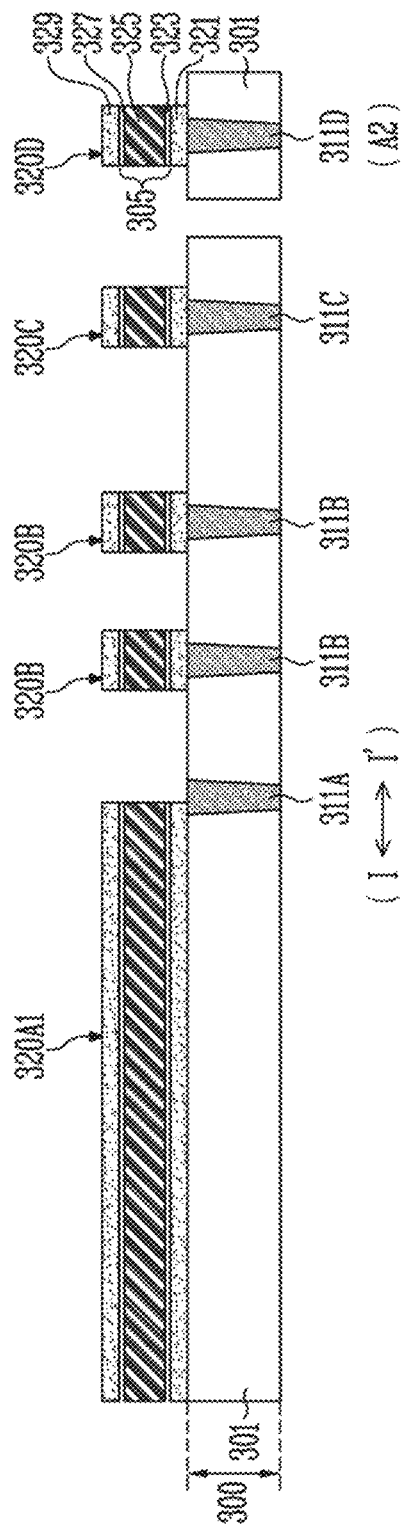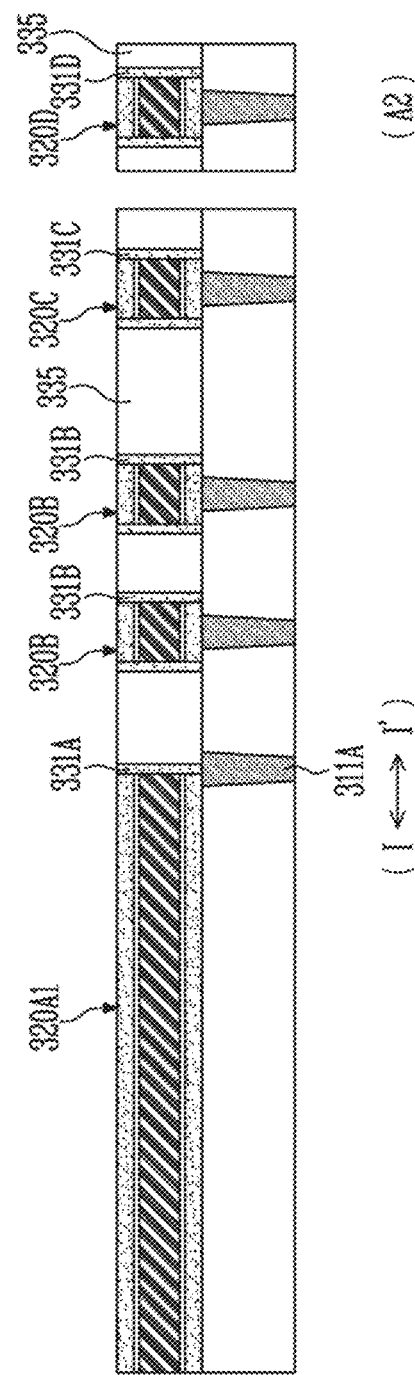

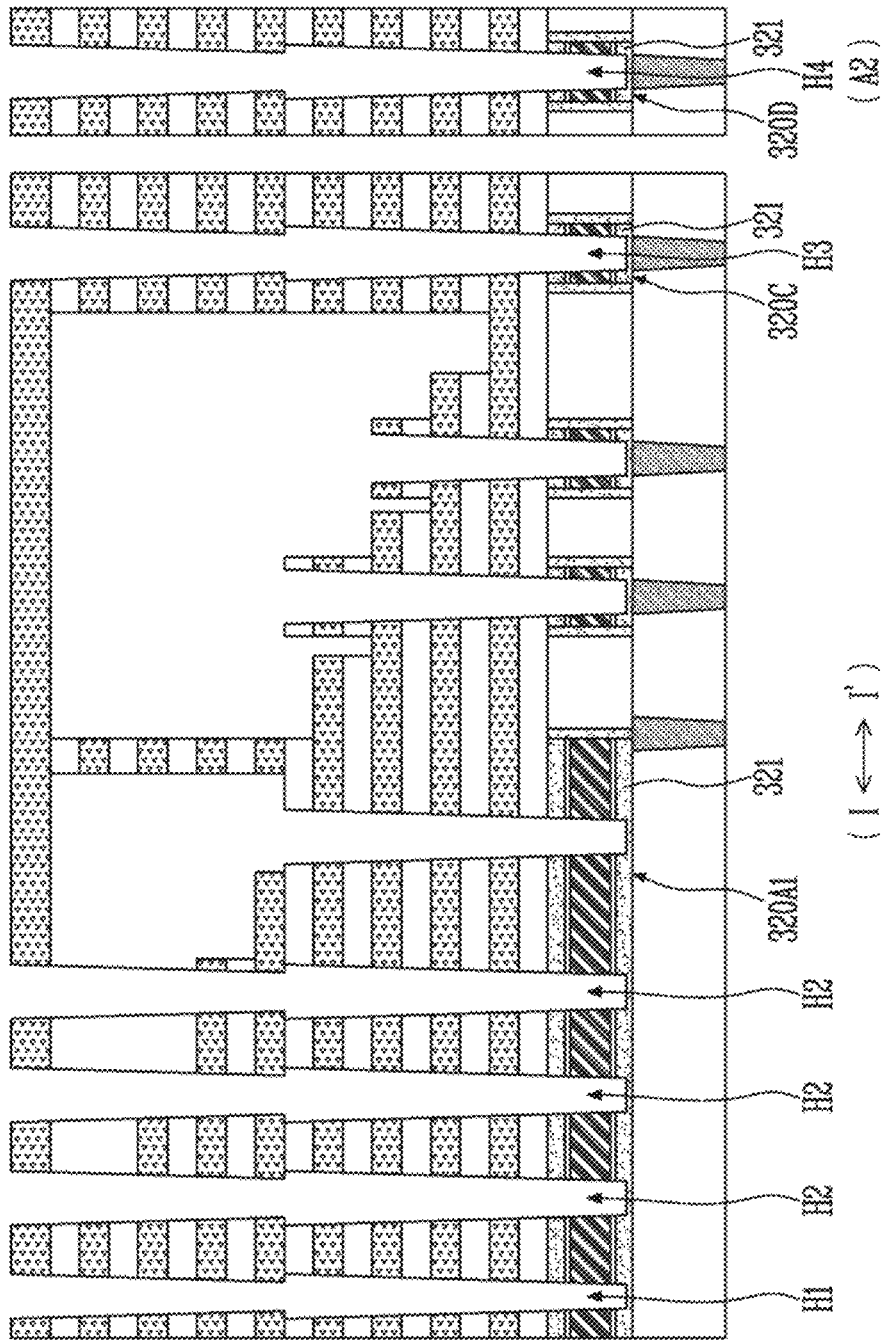

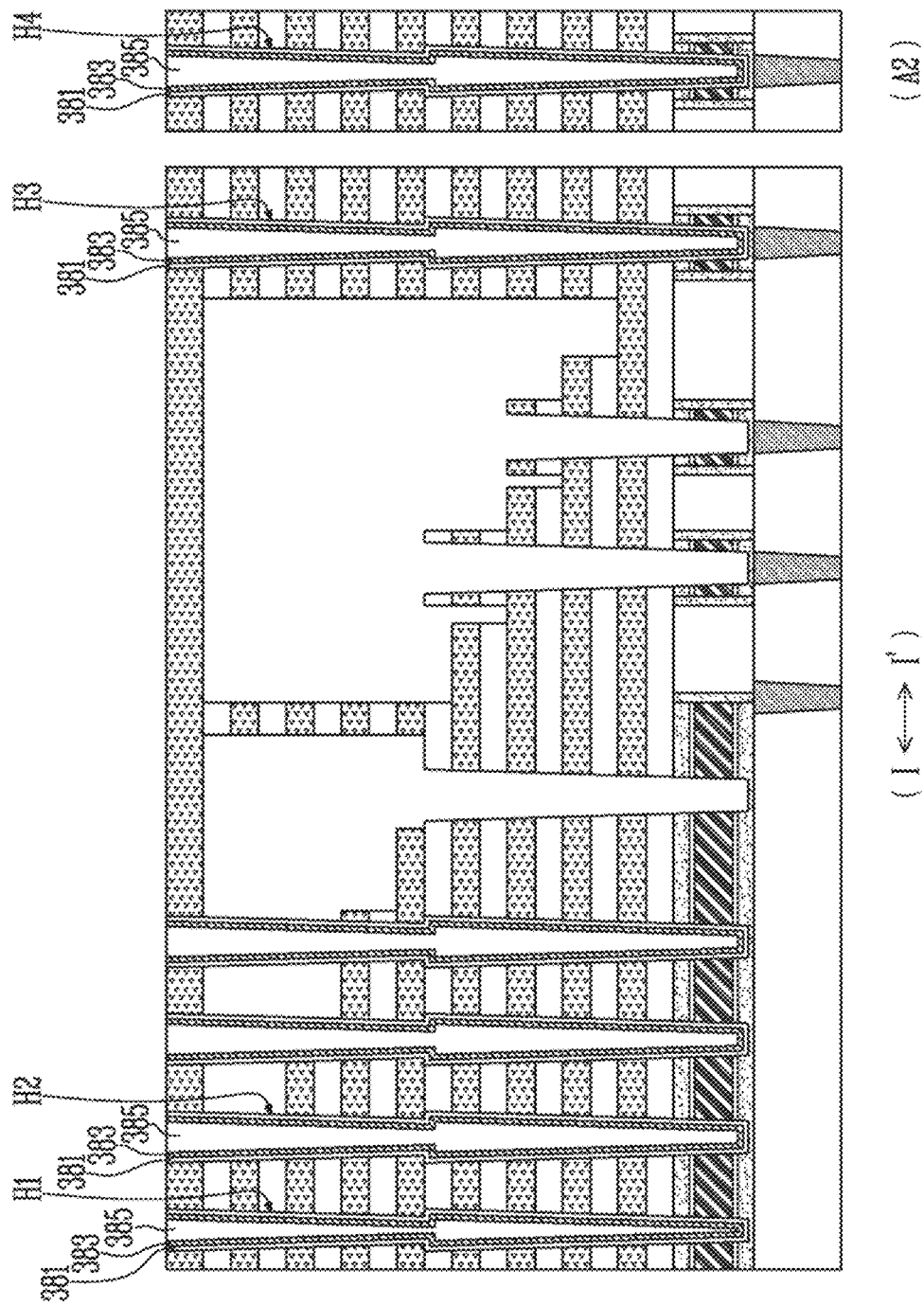

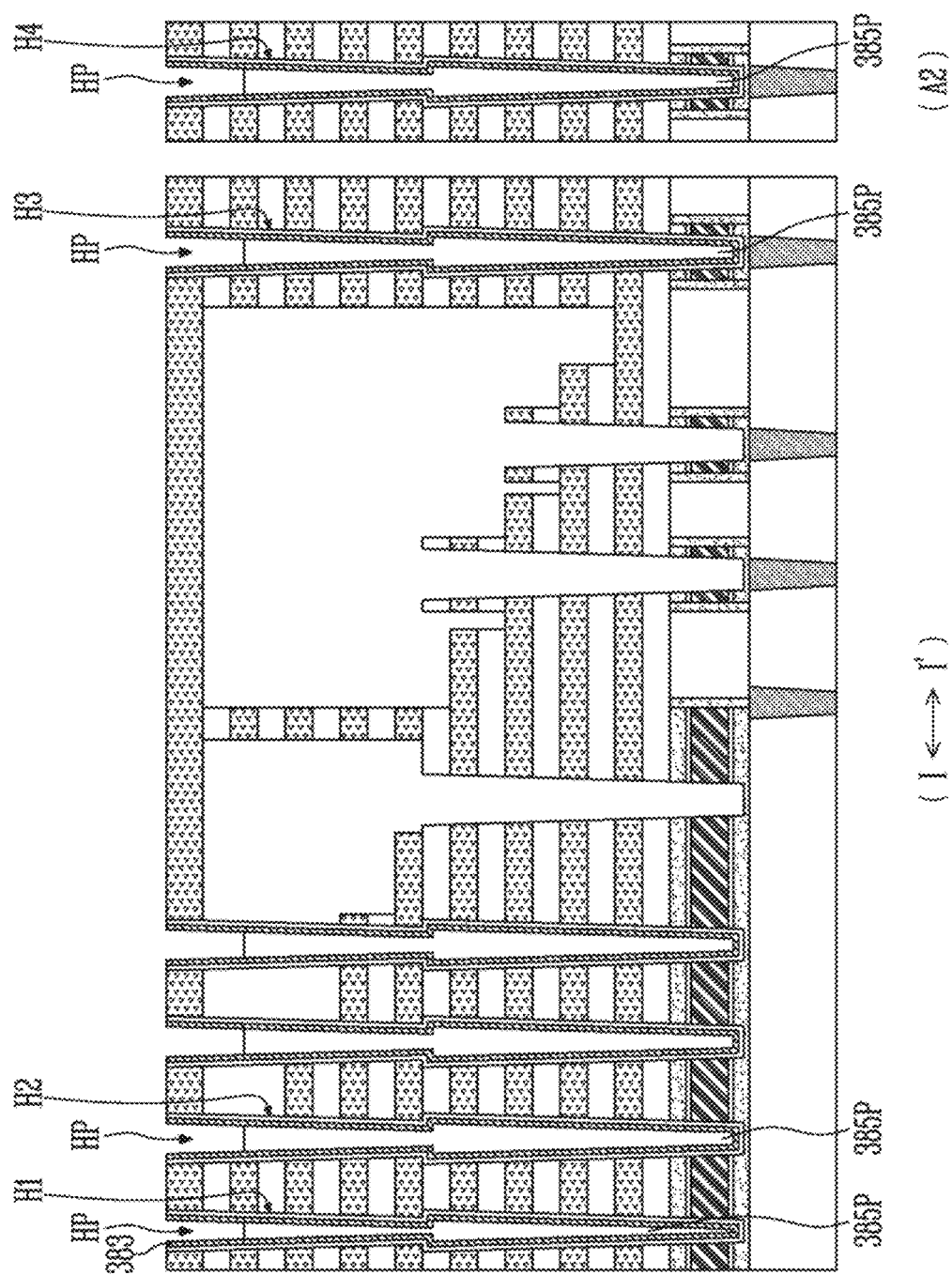

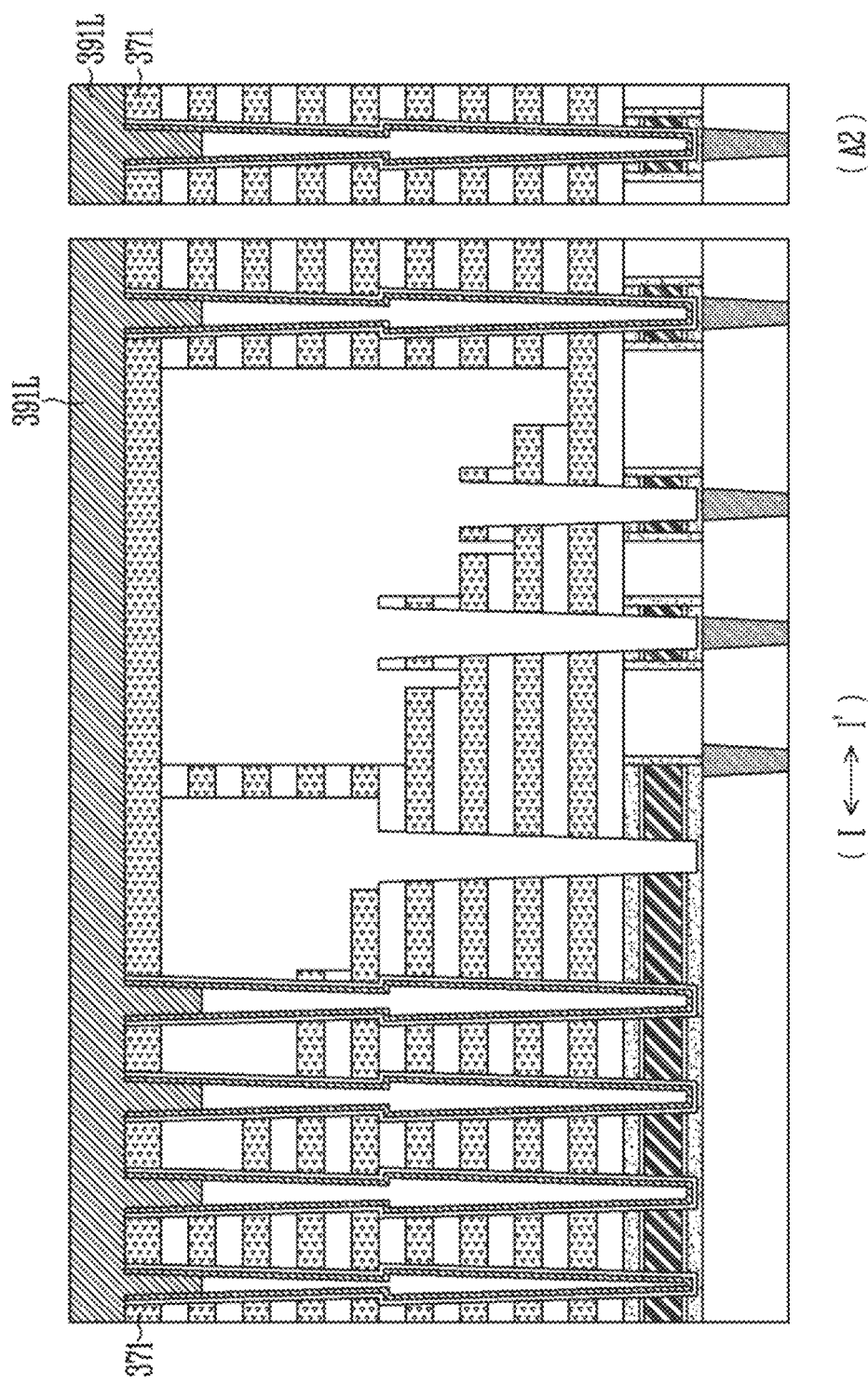

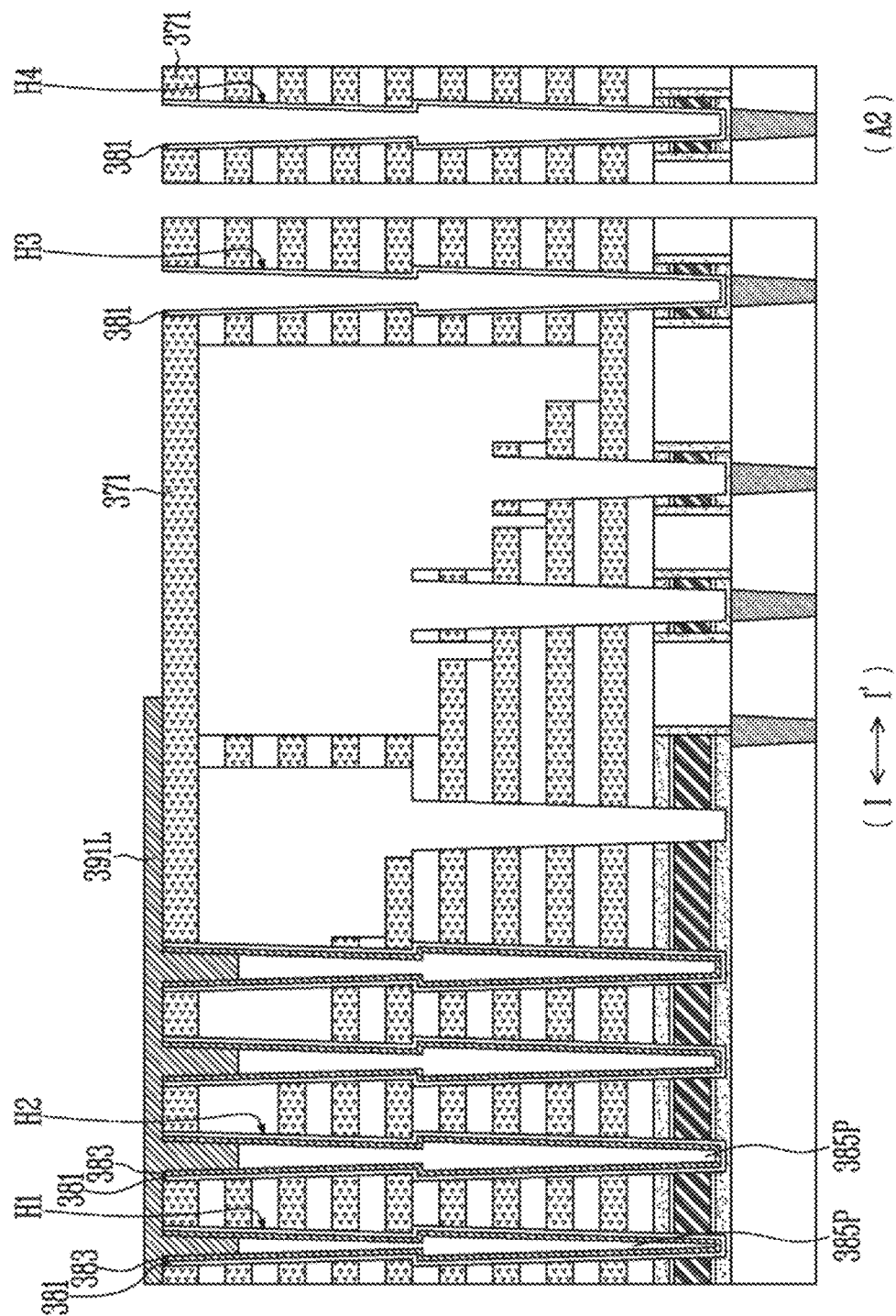

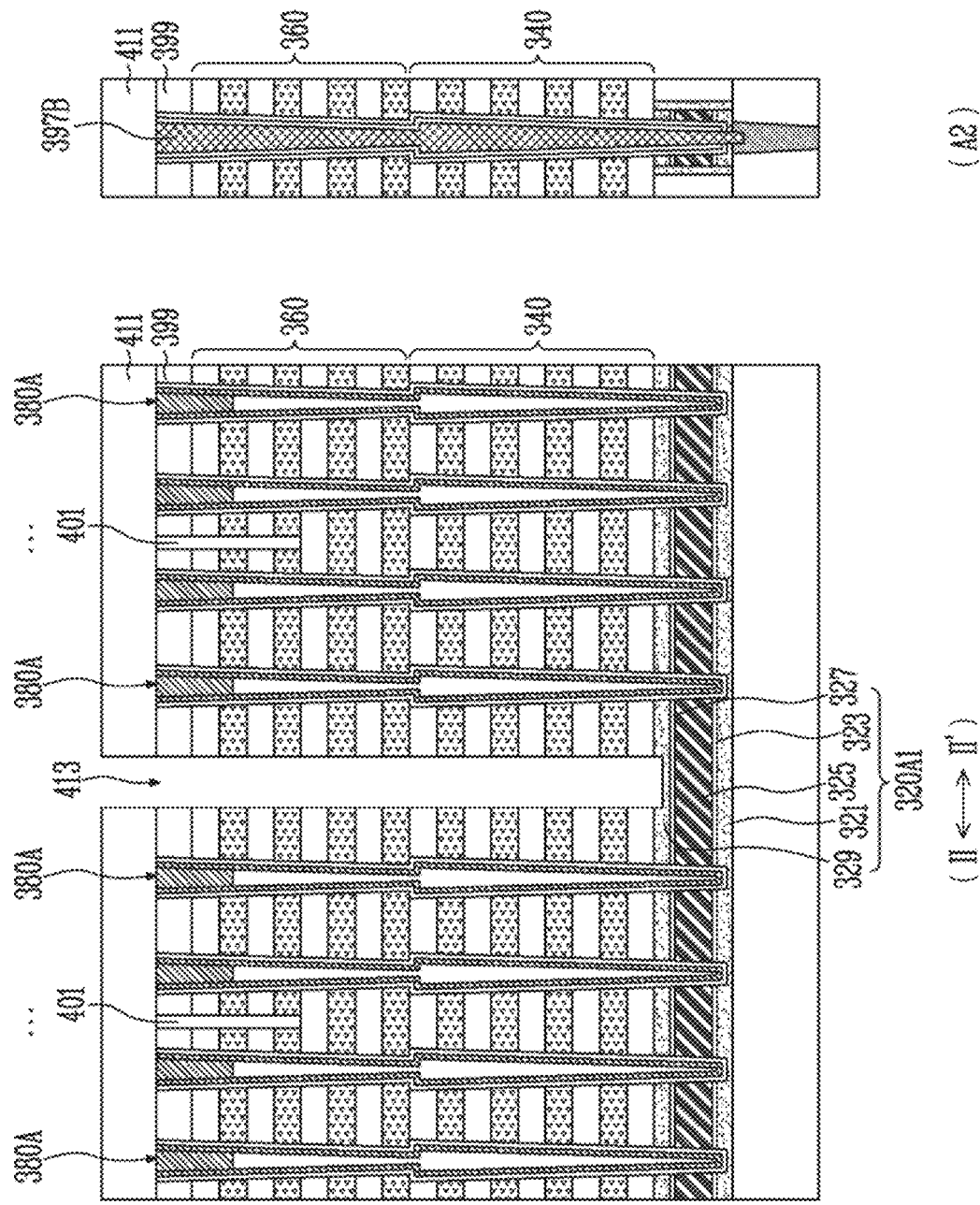

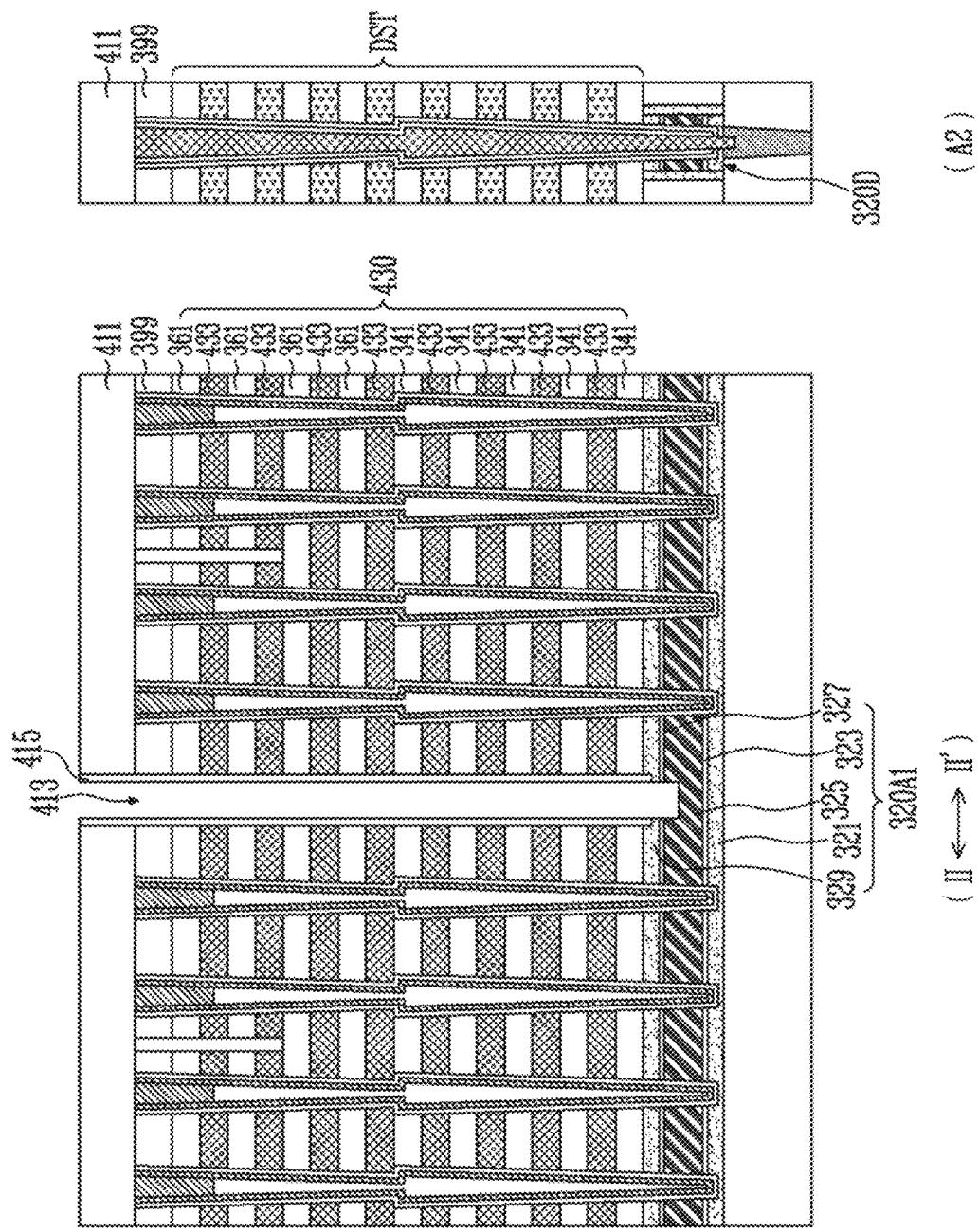

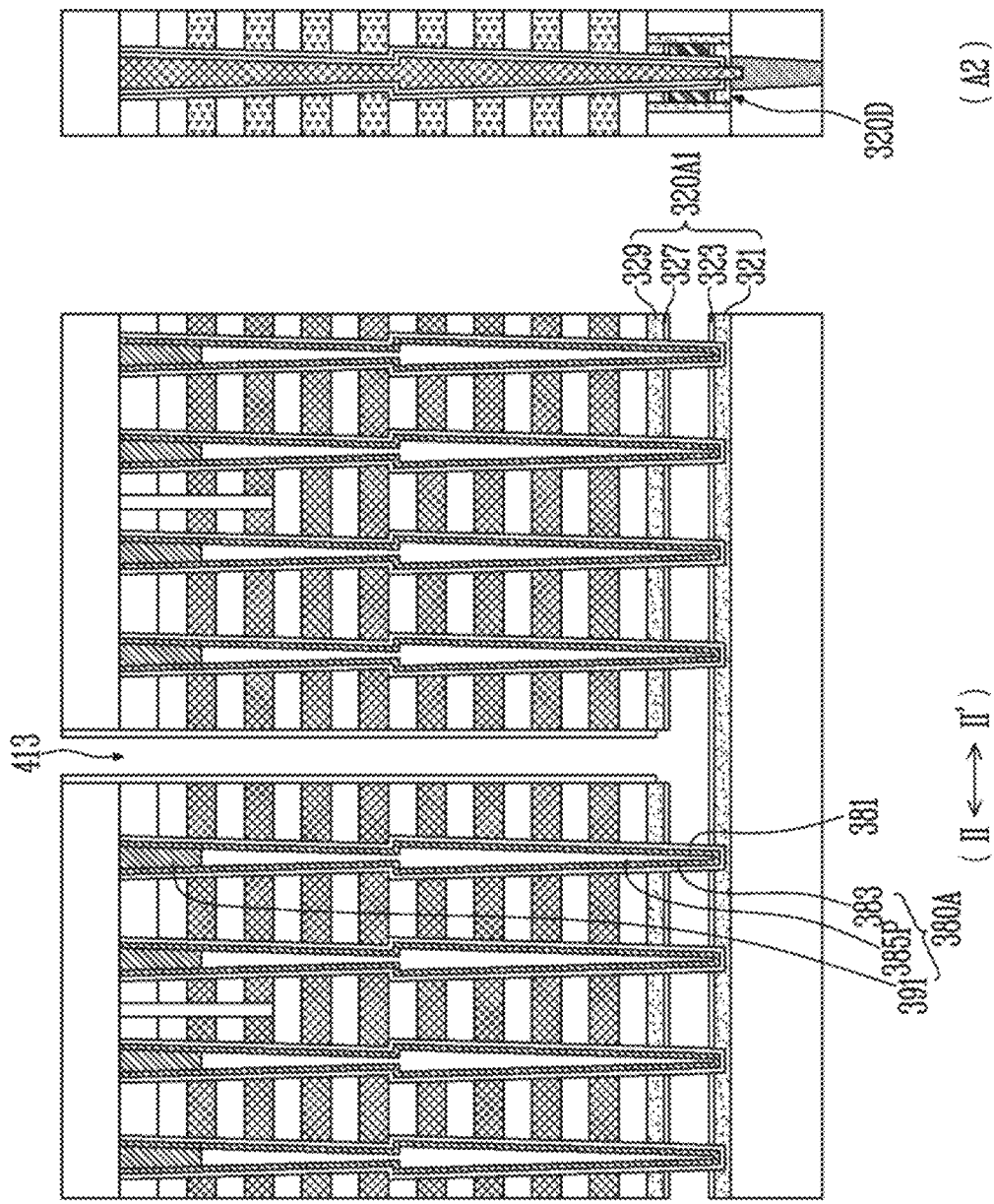

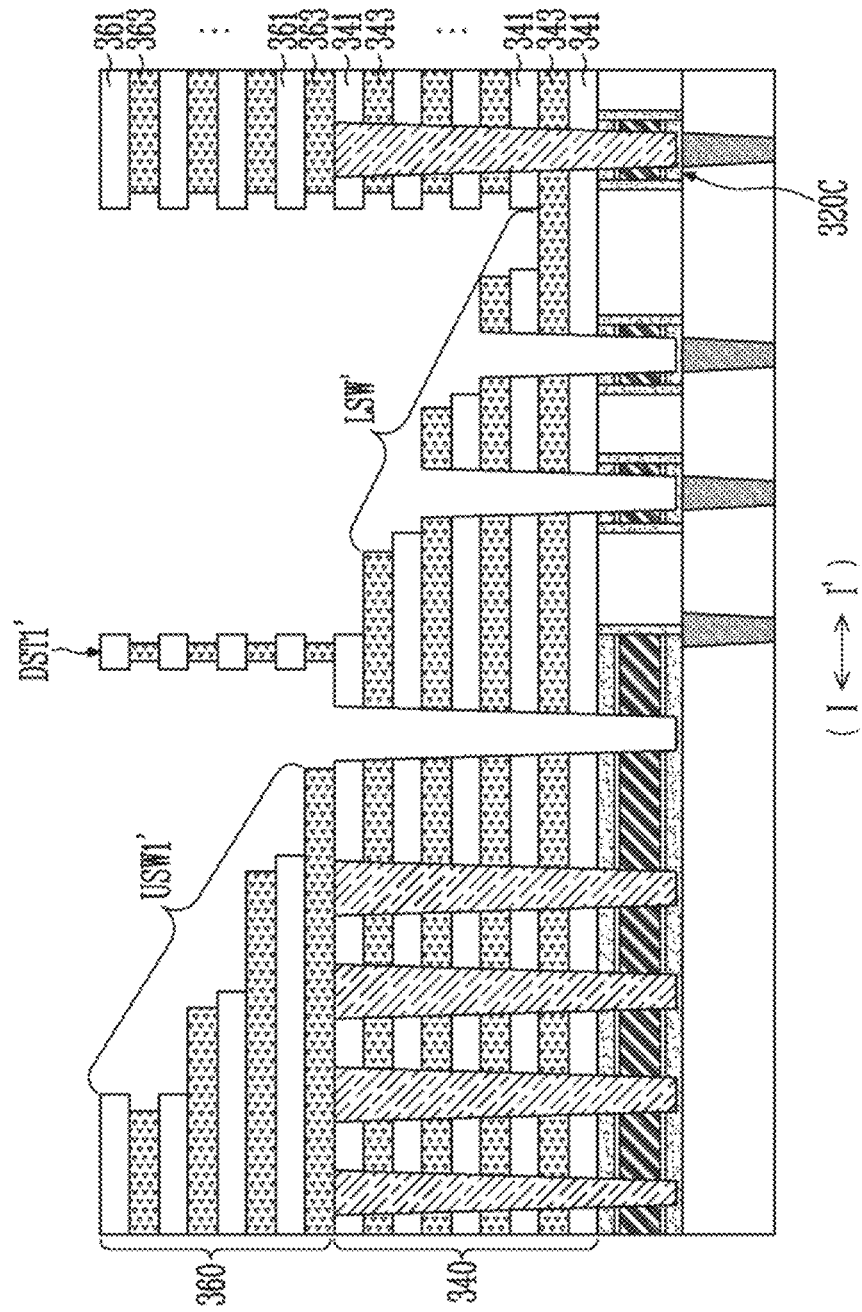

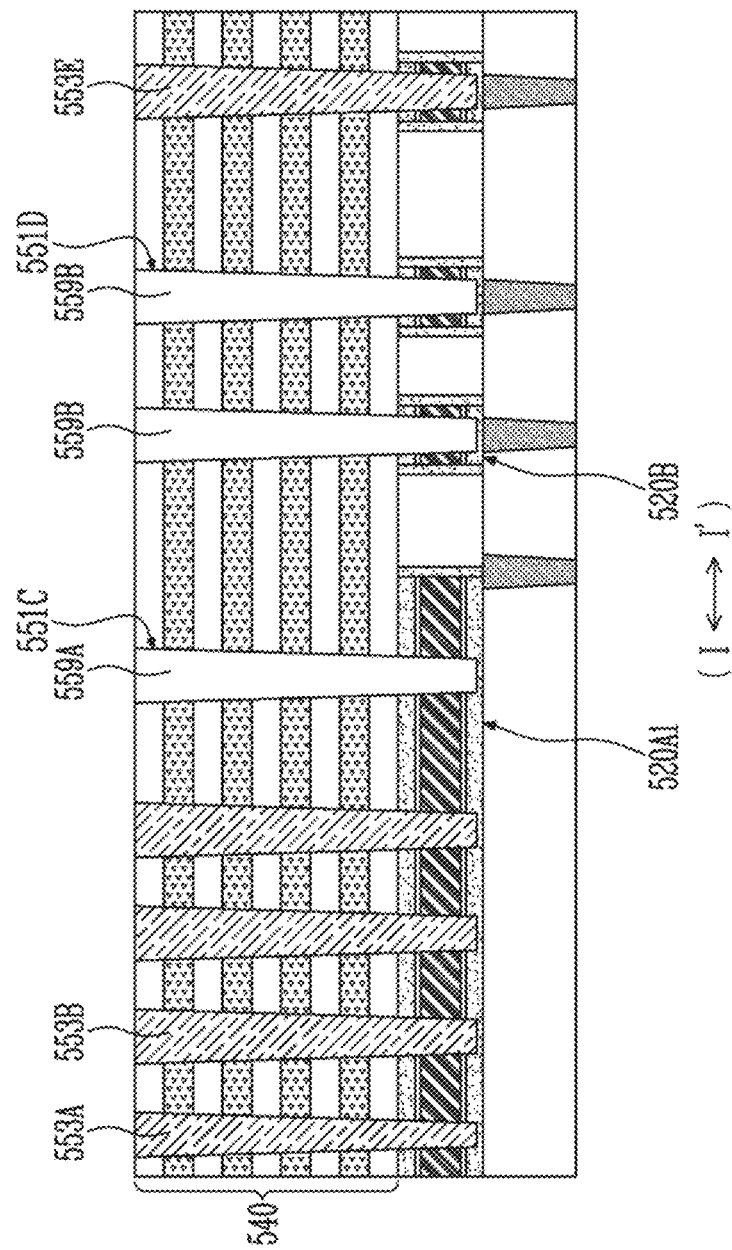

SEMICONDUCTOR MEMORY DEVICE AND MANUFACTURING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2019-0138550 filed on Nov. 1, 2019, in the Korean Intellectual Property Office, the entire disclosure of which is incorporated by reference herein.

BACKGROUND

1. Technical Field

Various embodiments relate generally to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device may include a memory cell array and a peripheral circuit coupled to the memory cell array. The memory cell array may include a plurality of memory cell array and the peripheral circuit may be configured to operate various operations of the peripheral circuit.

The plurality of memory cells may be arranged in three dimensions so as to manufacture a three-dimensional semiconductor memory device. In a three-dimensional semiconductor memory device, gate electrodes of memory cells may be coupled to a plurality of word lines stacked over a substrate. The number of word lines stacked on top of each other may be increased to increase the degree of integration of a three-dimensional semiconductor memory device. However, stability of manufacturing processes and structural stability may be deteriorated as the number of stacked word lines increases.

SUMMARY

In accordance with an embodiment of the present disclosure, a semiconductor memory device may include a first stack including lower conductive patterns separated from each other and stacked on a substrate to form a lower stepped structure, a support pillar passing through the first stack and including an insulating layer, a second stack including upper conductive patterns separated from each other and stacked on the first stack, the upper conductive patterns including an upper stepped structure that does not overlap with the lower stepped structure and the support pillar, a channel structure passing through the second stack and the first stack, and a memory layer surrounding a sidewall of the channel structure.

In accordance with an embodiment of the present disclosure, a semiconductor memory device may include a substrate including a first area and a second area, a first semiconductor pattern and a second semiconductor pattern overlapping with the first area and separated from each other in a plane parallel to an upper surface of the substrate, a first stack including lower conductive patterns separately stacked on the first and second semiconductor patterns to form a lower stepped structure, a first insulating pillar passing through the first stack and extending into the first semiconductor pattern, a second insulating pillar passing through the first stack and extending into the second semiconductor pattern, a second stack including upper conductive patterns separately stacked on the first stack, the upper conductive patterns including an upper stepped structure that does not overlap with the lower stepped structure and the first and second insulating pillars, a channel structure passing through the second stack and the first stack and extending into the first semiconductor pattern, and a memory layer surrounding a sidewall of the channel structure.

In accordance with an embodiment of the present disclosure, a method of manufacturing a semiconductor memory device may include forming a first stacked body on a substrate having a lower structure; forming a first sacrificial pillar and a second sacrificial pillar passing through the first stacked body; forming a second stacked body on the first stacked body to cover the first and second sacrificial pillars; forming a stepped structure by etching the second stacked body and the first stacked body to expose the second sacrificial pillar; removing the second sacrificial pillar; and forming an insulating layer filling a region from which the second sacrificial pillar is removed, and extending to cover the stepped structure, wherein each of the first stacked body and the second stacked body includes interlayer insulating layers and sacrificial layers stacked alternately with each other.

In accordance with an embodiment of the present disclosure, a method of manufacturing a semiconductor memory device may include forming a first stacked body on a substrate including a lower structure, forming sacrificial pillars and support pillars passing through the first stacked body, forming a second stacked body on the first stacked body to cover the sacrificial pillars and the support pillar, forming a stepped structure by etching the second stacked body and the first stacked body to expose the support pillar, and forming an insulating layer extending to cover the support pillar and the stepped structure.

BRIEF DESCRIPTION OF THE DRAWINGS

FIG. 2 is a diagram illustrating a portion of a semiconductor memory device which overlaps with a cell array region and a contact region according to an embodiment of the present disclosure;

FIG. 4 is a cross-sectional view of a dummy stacked body of a semiconductor memory device according to an embodiment of the present disclosure;

FIGS. 8A and 8B are cross-sectional views illustrating an embodiment of step ST1A shown in FIG. 7;

FIGS. 13A, 13B, 13C, 13D, 13E, 13F, 13G, 13H and 13I are cross-sectional views illustrating an embodiment of step ST11A shown in FIG. 7;

FIGS. 14A, 14B, and 14C are cross-sectional views illustrating an embodiment of step ST13A shown in FIG. 7;

FIGS. 15A, 15B, 15C, and 15D are cross-sectional views illustrating a process of forming a channel connecting pattern;

FIG. 17A is a cross-sectional view illustrating a cleaning process performed after step ST7A as shown in FIG. 7

FIGS. 19A, 19B, 19C, 19D, and 19E are cross-sectional views of structures corresponding to processes according to a manufacturing method of FIG. 18;

DETAILED DESCRIPTION

The specific structural or functional descriptions disclosed herein are merely illustrative for the purpose of describing embodiments according to the concept of the present disclosure. The embodiments may be implemented in various forms, and should not be construed as being limited to the specific embodiments set forth herein.

The above terminologies are used to distinguish one component from the other component, for example, a first component may be referred to as a second component without departing from a scope in accordance with the concept of the present disclosure and similarly, a second component may be referred to as a first component.

Various embodiments of the present disclosure provide a semiconductor memory device capable of improving stability of manufacturing processes and structural stability.

Figure 1:
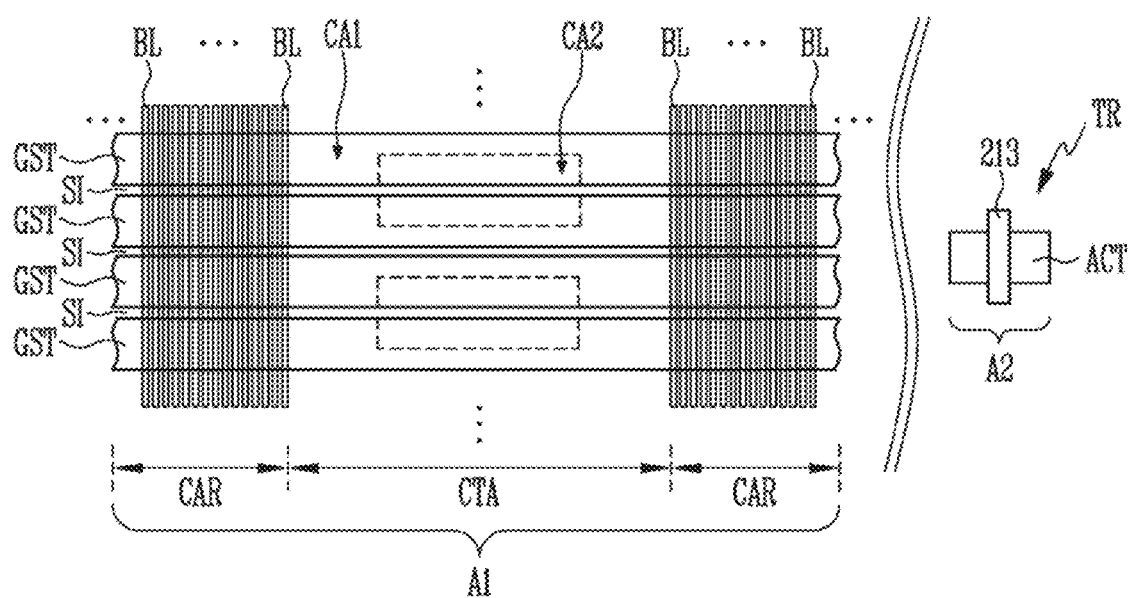
FIG. 1 is a schematic view of a semiconductor memory device according to an embodiment of the present disclosure.

FIG. 1 is a schematic view of a semiconductor memory device according to an embodiment of the present disclosure.

Figure 6:
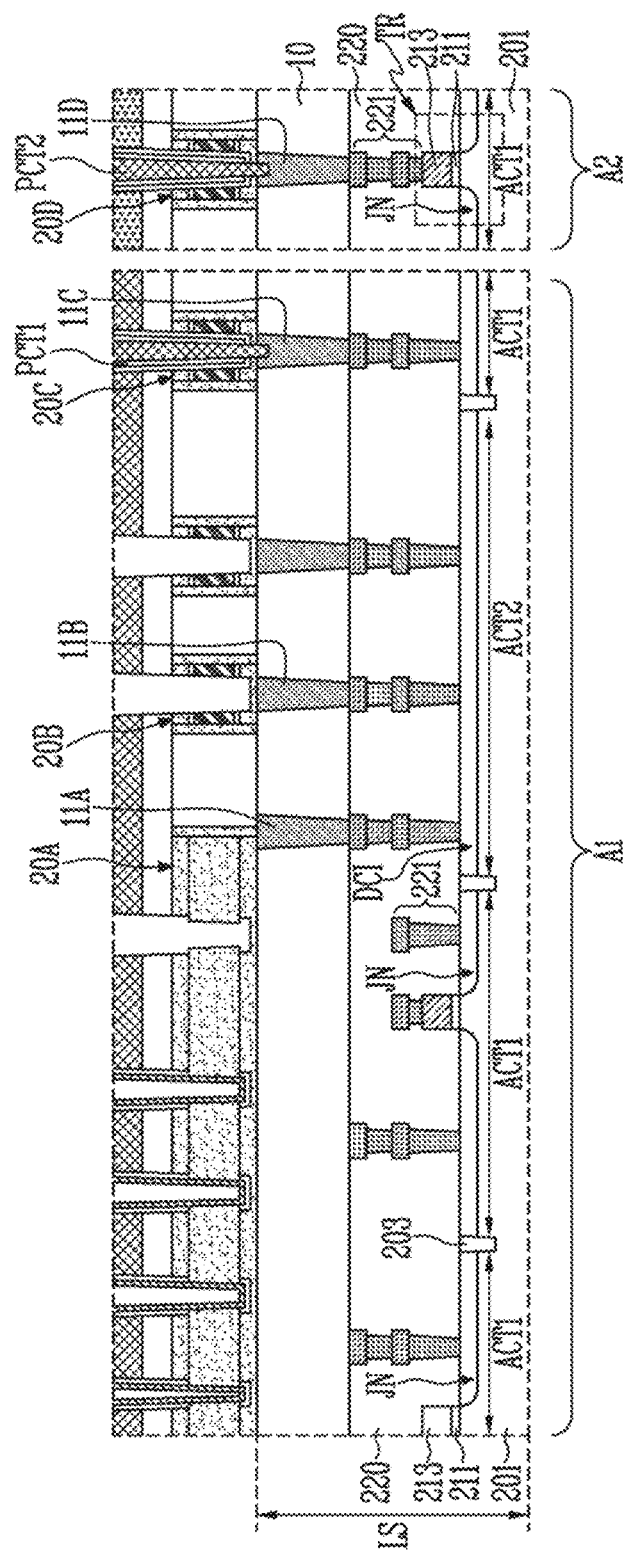
FIG. 6 is a diagram illustrating a substrate including a lower structure according to an embodiment of the present disclosure.

Referring to FIG. 1, a semiconductor memory device may include a peripheral circuit and a memory cell array arranged on a substrate 201 shown in FIG. 6 that includes a first area A1 and a second area A2. The first area A1 may be defined as an area overlapping with gate stacked structures GST constituting the memory cell array. The second area A2 may be defined as an area not overlapping with the gate stacked structures GST.

Though not shown in FIG. 1, the peripheral circuit may include a row decoder, a page buffer, a control circuit, etc. The row decoder, the page buffer and the control circuit may include transistors TR. A first group of transistors among the transistors TR included in the peripheral circuit may be arranged on the second area A2 of the substrate. A second group of transistors among the transistors TR included in the peripheral circuit may be arranged on the first area A1 of the substrate and overlap with the gate stacked structures GST. A gate electrode 213 of each of the transistors TR may be arranged on an active region ACT defined in the substrate. Junctions JN, as shown in FIG. 6, which serve as source and drain of each of the transistors TR may be formed in the active region ACT at both sides of the gate electrode 213.

The gate stacked structures GST may be spaced apart from each other through a slit SI. Each of the gate stacked structures GST may include a cell array region CAR and a contact region CTA. The contact region CTA may extend from the cell array region CAR. According to an embodiment, each of the gate stacked structures GST may include at least two cell array regions CAR and the contact region CTA arranged between neighboring cell array regions CAR. However, the present disclosure is not limited thereto. In an embodiment, the contact region CTA of each of the gate stacked structures GST may be arranged at an edge of the corresponding gate stacked structure.

The contact region CTA may include a first connection area CA1 and a second connection area CA2. The first connection area CA1 may overlap with gate contact plugs GCT as shown in FIG. 2. The second connection area CA2 may overlap with first contact plugs PCT1 as shown in FIG. 2.

Figure 5A:
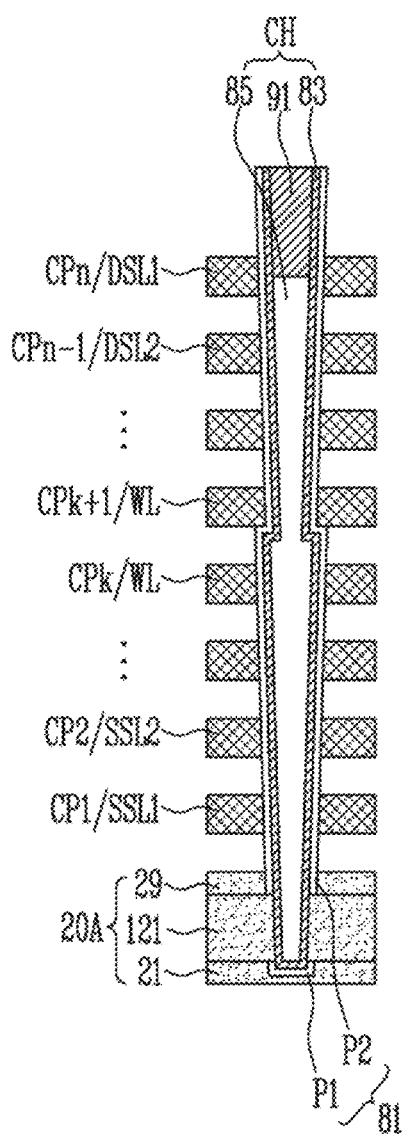
FIG. 5A is a diagram illustrating a memory string according to an embodiment of the present disclosure and FIG. 5B is a diagram illustrating a memory layer according to an embodiment of the present disclosure.

The cell array region CAR may include a plurality of word lines WL as shown in FIG. 5A and select lines SSL1, SSL2, DSL1, and DSL2 as shown in FIG. 5A which are coupled to the memory strings. The memory strings may be coupled to bit lines BL arranged above the gate stacked structures GST.

In an embodiment, the transistor TR arranged on the second area A2 may overlap with a dummy stacked body located in the same level as the gate stacked structures GST. In an embodiment, the dummy stacked body may be omitted.

FIG. 2 is a diagram illustrating a portion of a semiconductor memory device which overlaps with the cell array region CAR and the contact region CTA according to an embodiment of the present disclosure.

Referring to FIG. 2, the gate stacked structure GTS may be covered by an upper insulating layer 99. The gate stacked structure GST and the upper insulating layer 99 overlapping with the cell array region CAR may be penetrated by the channel structures CH. The gate stacked structure GST may extend in a first direction D1 and a second direction D2. The channel structures CH may extend in a third direction D3 orthogonal to the plane extending in the first direction D1 and the second direction D2. According to an embodiment, the first direction D1, the second direction D2 and the third direction D3 may correspond to the x-axis, the y-axis, and the z-axis, respectively.

A sidewall of each of the channel structures CH may be surrounded by a memory layer 81. The channel structures CH may be arranged in a matrix format in the gate stacked structure GST corresponding to the channel structures CH. The present disclosure is not limited thereto. In an embodiment, the channel structures CH may form a zigzag. Each of the channel structures CH may have various cross-sectional shapes such as a circle, an ellipse, a polygon, and a rectangle.

The channel structures CH may be arranged at both sides of an upper slit USI formed in the gate stacked structure GST. The upper slit USI and the slit SI may extend in the first direction D1 and the third direction D3.

The gate stacked structure GST and the upper insulating layer 99 overlapping with the contact region CTA may be penetrated by the gate contact plugs GCT and the first contact plugs PCT1. First support pillars SP1 may be arranged in the gate stacked structure GST overlapping with the contact region CTA. The gate stacked structure GST and the upper insulating layer 99 overlapping with the contact region CTA may be penetrated by second support pillars SP2.

The gate contact plugs GCT, the first support pillars SP1, the second support pillars SP2 and the first contact plugs PCT1 may have various cross-sectional shapes such as a circle, an ellipse, a polygon and a square. The arrangements of the gate contact plugs GCT, the first support pillars SP1, the second support pillars SP2 and the first contact plugs PCT1 is not limited to FIG. 2 and may be variously changed. In the plane extending in the first direction D1 and the second direction D2, each of the first support pillars SP1, the second support pillars SP2, and the first contact plugs PCT1 may have a greater area than each of the channel structures CH.

A sidewall of each of the first contact plugs PCT1 may be surrounded by a first insulating structure IS1. Each of the first contact plugs PCT1 may be insulated from the gate stacked structure GST by the first insulating structure IS1.

The first support pillars SP1 may have a more simplified structure than the second support pillars SP2. According to an embodiment, each of the first support pillars SP1 may include a single insulating material, and each of the second support pillars SP2 may include the same material as each of the channel structures CH. The second support pillars SP2 may extend in the third direction D3 to be longer than the first support pillars SP1. A sidewall of each of the second support pillars SP2 may be surrounded by a first dummy memory layer 81d1. The first dummy memory layer 81d1 may include the same material as the memory layer 81.

Figure 3A:
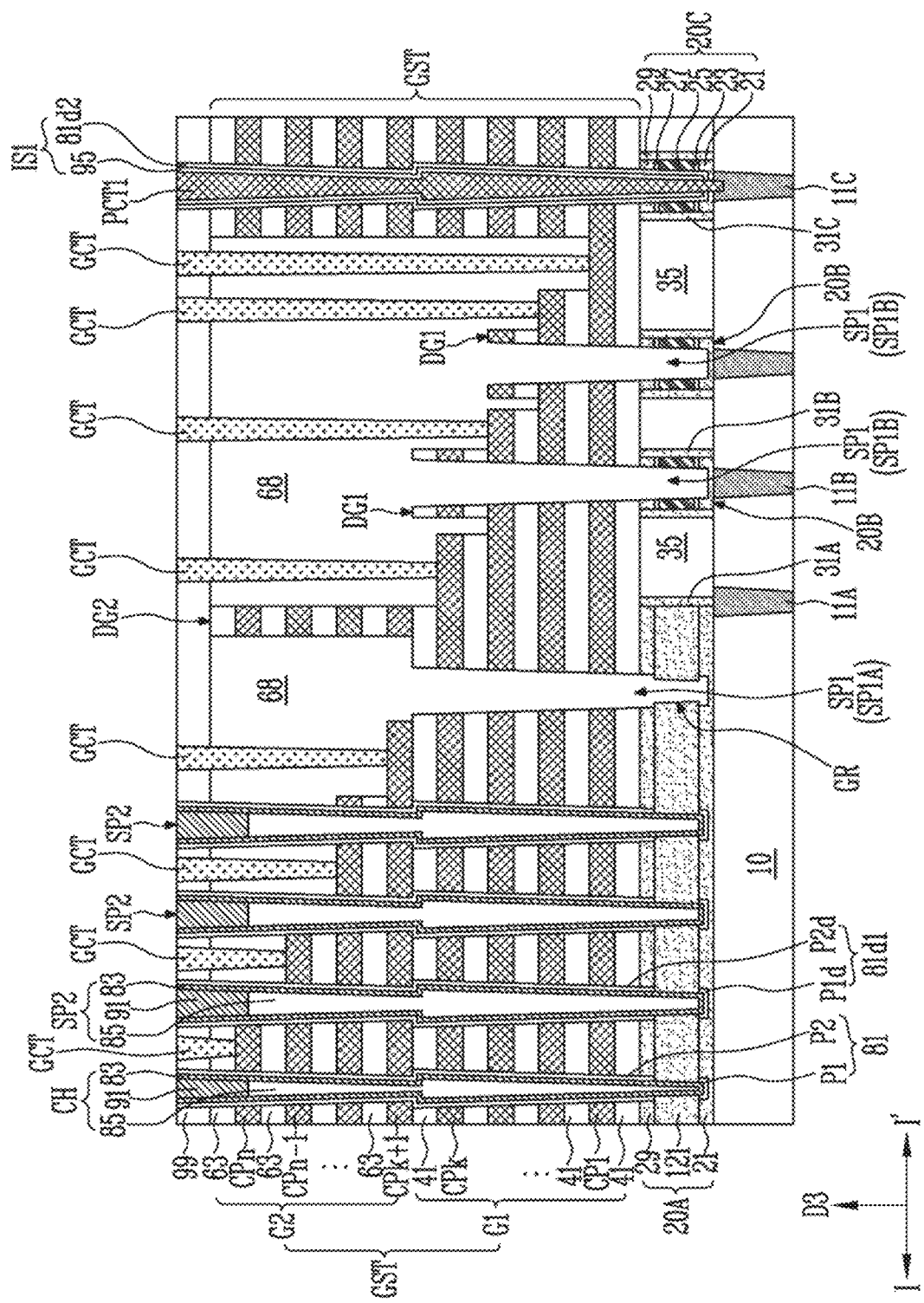
FIGS. 3A and 3B are cross-sectional views taken along line I-I' and II-II' of FIG. 2.
Figure 3B:
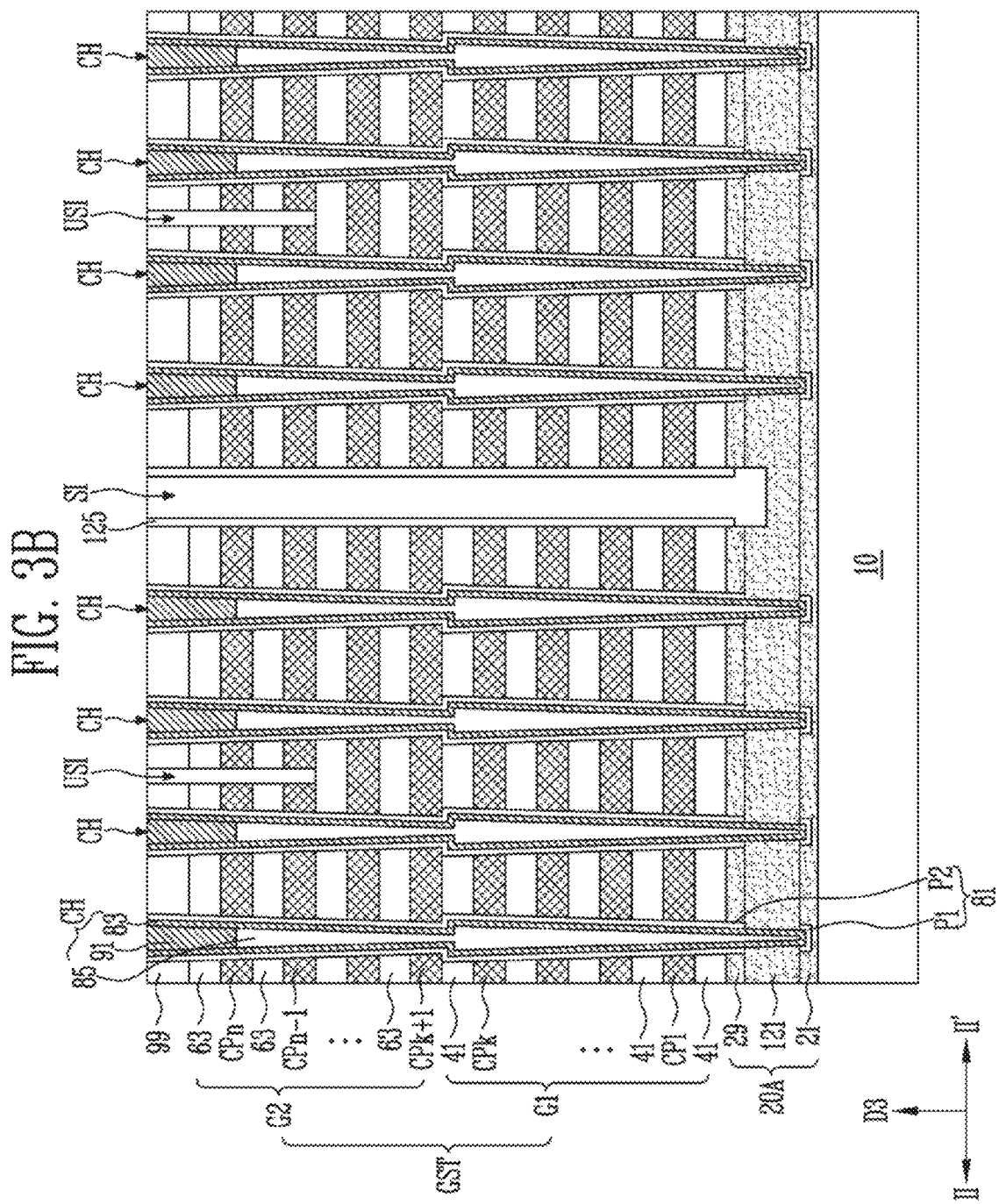

FIGS. 3A and 3B are cross-sectional views taken along line I-I' and II-II' of FIG. 2.

Referring to FIGS. 3A and 3B, each of the gate stacked structures GST may include interlayer insulating layers 41 and 63 and conductive patterns CP1 to CPn stacked alternately with each other, where n is a natural number. The conductive patterns CP1 to CPn may be spaced apart from and stacked on each other in the third direction D3 by the interlayer insulating layers 41 and 63 interposed between the conductive patterns CP1 to CPn. The conductive patterns CP1 to CPn may include various conductive materials such as a doped semiconductor layer, a metal layer, and a conductive metal nitride. Each of the conductive patterns CP1 to CPn may include a conductive material, or two types of conductive materials. Each of the interlayer insulating layers 41 and 63 may include a silicon oxide layer.

The gate stacked structures GST may be spaced apart from each other through the slit SI. The upper slit USI passing through a top portion of each of the gate stacked structures GST may be shorter than the slit SI in the third direction D3. According to an embodiment, the upper slit USI may be deep enough to pass through at least an nth conductive pattern CPn located at the uppermost layer among the conductive patterns CP1 to CPn. The present disclosure are not limited thereto. In an embodiment, the upper slit USI may pass through one or more layers sequentially arranged under the nth conductive pattern CPn. Conductive patterns, for example, the nth conductive pattern and an (n−1)th conductive pattern penetrated by the upper slit USI may be separated by select lines. Conductive patterns serving as the word lines WL as shown in FIG. 5A might not be penetrated by the upper slit USI.

A sidewall of each of the gate stacked structure GST may be protected by a sidewall insulating layer 125 covering a sidewall of the slit SI. Each gate stacked structure GST may include a first stack G1 and a second stack G2 stacked on the first stack G1. The conductive patterns CP1 to CPn may include lower conductive patterns CP1 to CPk and upper conductive patterns CPk+1 to CPn, where k is a natural number less than n. The interlayer insulating layers 41 and 63 may include first interlayer insulating layers 41 and second interlayer insulating layers 63. The first stack G1 may include the first interlayer insulating layers 41 and the lower conductive patterns CP1 to CPk stacked alternately with each other, and the second stack G2 may include the upper conductive patterns CPk+1 to CPn and the second interlayer insulating layers 63 stacked alternately with each other.

The lower conductive patterns CP1 to CPk may be separated from and stacked on each other in the third direction D3 to form a lower stepped structure, and the upper conductive patterns CPK+1 to CPn may be separated from and stacked on each other in the third direction D3 to form an upper stepped structure. The lower stepped structure and the upper stepped structure may overlap with the contact region CTA as shown in FIG. 2. The lower stepped structure may be penetrated by the first support pillars SP1. The second stack G2 having the upper stepped structure might not overlap with the lower stepped structure to open the first support pillars SP1.

Each of the first support pillars SP1 may pass through the first stack G1 and include the insulating layer 68. The insulating layer 68 may extend to cover the lower stepped structure of the first stack G1 and the upper stepped structure of the second stack G2. In other words, the first support pillars may be insulating pillars formed of a portion of the insulating layer 68. The first support pillars SP1 may be surrounded by at least one of the lower conductive patterns CP1 to CPk.

Each of the channel structures CH may pass through the first stack G1 and the second stack G2 and be separated from each of the lower conductive patterns CP1 to CPk and the upper conductive patterns CPk+1 to CPn by the memory layer 81. Each of the second support pillars SP2 may pass through the first stack G1 and the second stack G2 and be separated from each of the lower conductive patterns CP1 to CPk and the upper conductive patterns CPk+1 to CPn by the first dummy memory layer 81d1.

Each of the second support pillars SP2 may include the same material as each of the channel structures CH. According to an embodiment, each of the channel structures CH and the second support pillars SP2 may include a channel layer 83, a core insulating pattern 85, and a capping pattern 91. The channel layer 83 may be formed on the memory layer 81 or the first dummy memory layer 81d1, and may include a semiconductor material. In an embodiment, the channel layer 83 may include silicon. The channel layer 83 of each of the channel structures CH may serve as a channel of a memory string. The core insulating pattern 85 and the capping pattern 91 may fill a central area of the channel layer 83. The core insulating pattern 85 may include an oxide. The capping pattern 91 may be arranged on the core insulating pattern 85 and include a sidewall surrounded by a top end of the channel layer 83. The capping pattern 91 may include a doped semiconductor layer including at least one of n type impurities and p type impurities. According to an embodiment, the core insulating pattern 85 may be omitted and the channel layer 83 may fill a central area of the memory layer 81 or the first dummy memory layer 81d1.

The first contact plugs PCT1 may pass through the second stack G2 and the first stack G1. The first insulating structure IS1 surrounding each of the first contact plugs PCT1 may include a second dummy memory layer 81d2 including the same material as the memory layer 81. In other words, the second dummy memory layer 81d2 may surround a sidewall of the corresponding first contact plug PCT1 and extend between the first contact plug PCT1 and the gate stacked structure GST. The first insulating structure IS1 may further include an oxide layer 95 arranged between the second dummy memory layer 81d2 and the corresponding first contact plug PCT1.

The channel structures CH, the second support pillars SP2 and the first contact plugs PCT1 may be formed in holes passing through the gate stacked structure GST. Each of the holes may be configured in such a manner that a lower hole passing through the first stack G1 and an upper hole passing through the second stack G2 are coupled to each other. An etching process of forming each of the lower hole and the upper hole may be easier to manufacture than an etching process of forming a long hole passing through the first and second stacks G1 and G2. Accordingly, the present disclosure may increase the stability of manufacturing processes.

The lower conductive patterns CP1 to CPk and the upper conductive patterns CPk+1 to CPn may be coupled to the gate contact plugs GCT. The gate contact plugs GCT may be coupled to some of the lower conductive patterns CP1 to CPk forming the lower stepped structure and some of the upper conductive patterns CPk+1 to CPn forming the upper stepped structure. The gate contact plugs GCT may extend in the third direction D3.

First dummy gate stacked structures DG1 and a second dummy gate stacked structure DG2 may overlap with the lower stepped structure of the first stack G1. Each of the first dummy gate stacked structures DG1 may be arranged in the same level as some of the first interlayer insulating layers 41 and the lower conductive patterns CP1 to CPk of the first stack G1. Each of the first dummy gate stacked structures DG1 may be penetrated by the first support pillar SP1. The second dummy gate stacked structure DG2 may include the same material as the upper conductive patterns CPk+1 to CPn and the second interlayer insulating layers 63 of the second stack G2, and may be arranged in the same level as the second stack G2.

A step defined by the lower stepped structure and the upper stepped structure may be relieved by the insulating layer 68. The insulating layer 68 and the gate stacked structure GTS may be covered by the upper insulating layer 99. The channel structures CH, the second support pillars SP2, the gate contact plugs GCT, and the first contact plugs PCT1 may extend to pass through the upper insulating layer 99.

The gate stacked structure GST may be arranged on semiconductor patterns 20A to 20C separated by a gap-filling insulating layer 35. The semiconductor patterns 20A to 20C may include a first semiconductor pattern 20A, second semiconductor patterns 20B and a third semiconductor pattern 20C that overlap with the first stack G1.

In an embodiment, each of the first to third semiconductor patterns 20A to 20C may include a first semiconductor layer 21 and a second semiconductor layer 29 overlapping with the first semiconductor layer 21. In an embodiment, a second semiconductor layer 29 may be omitted. The first semiconductor pattern 20A may include a channel connecting pattern 121 disposed between the first semiconductor layer 21 and the second semiconductor layer 29. Each of the second and third semiconductor patterns 20B and 20C may include a sacrificial stack disposed between the first semiconductor layer 21 and the second semiconductor layer 29. The sacrificial stack may include a first protective layer 23, a sacrificial layer 25 and a second protective layer 27 stacked sequentially on the first semiconductor layer 21.

Each of the first semiconductor layer 21 and the channel connecting pattern 121 may include n type or p type impurities. According to an embodiment, for a gate induced drain leakage (GIDL) erase method of performing an erase operation using GIDL current, the channel connecting pattern 121 and the first semiconductor layer 21 may include the n type impurities. According to an embodiment, for a well erase method of performing an erase operation by supplying holes, the channel connecting pattern 121 and the first semiconductor layer 21 may include the p type impurities. The second semiconductor layer 29 may be an undoped semiconductor layer, or a doped semiconductor layer including the same type of impurities as the first semiconductor layer 21 and the channel connecting pattern 121.

The sacrificial layer 25 may include a material having a different etch rate from the first protective layer 23 and the second protective layer 27 so as to achieve selective etch. In an embodiment, the sacrificial layer 25 may include an undoped silicon layer. Each of the first protective layer 23 and the second protective layer 27 may include an oxide layer.

The first semiconductor pattern 20A may extend to overlap the slit SI and the channel structures CH. The first semiconductor pattern 20A may extend to overlap the second support pillars SP2.

The channel structures CH and the second support pillars SP2 may extend into the first semiconductor pattern 20A. According to an embodiment, the channel structures CH and the second support pillars SP2 may extend into the first semiconductor layer 21 of the first semiconductor pattern 20A. In this manner, the first semiconductor layer 21 of the first semiconductor pattern 20A may surround a lower portion of each of the channel structures CH, a lower portion of each of the second support pillars SP2, a lower portion of the memory layer 81, and a lower portion of the first dummy memory layer 81d1.

The memory layer 81 may be penetrated by the channel connecting pattern 121 to be separated into a first memory pattern P1 and a second memory pattern P2. The first memory pattern P1 may be arranged between the corresponding channel structure CH and the first semiconductor layer 21 of the first semiconductor pattern 20A. The second memory pattern P2 may be arranged between the corresponding channel structure CH and the gate stacked structure GST. The first dummy memory layer 81d1 may be penetrated by the channel connecting pattern 121 to be separated into a first dummy pattern P1d and a second dummy pattern P2d. The first dummy pattern P1d may be arranged between the corresponding the second support pillar SP2 and the first semiconductor layer 21 of the first semiconductor pattern 20A. The second dummy pattern P2d may be arranged between the corresponding second support pillar SP2 and the gate stacked structure GST. The channel connecting pattern 121 may extend to surround the channel structures CH and the second support pillars SP2 and penetrate the memory layer 81 and the first dummy memory layer 81d1 to contact the channel layer 83 of each of the channel structures CH and the second support pillars SP2.

The first support pillars SP1 may include at least one insulating pillar SP1A overlapping with the first semiconductor pattern 20A and second insulating pillars SP1B overlapping with the second semiconductor patterns 20B, respectively.

The first insulating pillar SP1A may pass through the second semiconductor layer 29 and the channel connecting pattern 121 of the first semiconductor pattern 20A and may extend into the first semiconductor layer 21 of the first semiconductor pattern 20A. A sidewall of the first insulating pillar SP1A surrounded by the channel connecting pattern 121 may include a groove GR into which the channel connecting pattern 121 is inserted.

The second semiconductor patterns 20B may be spaced apart from each other. The second semiconductor patterns 20B may be separated from the first semiconductor pattern 20A. The second semiconductor patterns 20B may be arranged under the lower stepped structure of the first stack G1. Each of the second insulating pillars SP1B may penetrate the second semiconductor layer 29, the second protective layer 27, the sacrificial layer 25 and the first protective layer 23 of the corresponding second semiconductor pattern 20B, and may extend into the first semiconductor layer 21 of the corresponding second semiconductor pattern 20B. Each of the semiconductor patterns 20B may have a greater width than the second insulating pillar SP1B corresponding thereto.

The third semiconductor pattern 20C may be spaced apart from the first and second semiconductor patterns 20A and 20B and be penetrated by the first contact plug PCT1. The third semiconductor pattern 20C may have a greater width than the first contact plug PCT1. The first semiconductor layer 21, the first protective layer 23, the sacrificial layer 25, the second protective layer 27, and the second semiconductor layer 29 of the third semiconductor pattern 20C may surround the first contact plug PCT1. The first contact plug PCT1 may penetrate the first insulating structure IS1 and extend to be longer than the first insulating structure IS1.

A first vertical doped semiconductor pattern 31A may be formed on a sidewall of the first semiconductor pattern 20A, a second vertical doped semiconductor pattern 31B may be formed on a sidewall of each of the second semiconductor patterns 20B, and a third vertical doped semiconductor pattern 31C may be formed on a sidewall of the third semiconductor pattern 20C. The first to third vertical doped semiconductor patterns 31A to 31C may include n type or p type impurities. According to an embodiment, the first to third vertical doped semiconductor patterns 31A to 31C may include the same type of impurities as the first semiconductor layer 21.

The first to third semiconductor patterns 20A to 20C may be arranged on a lower insulating layer 10 penetrated by lower contact plugs 11A, 11B, and 11C. The lower contact plugs 11A, 11B, and 11C may include a first lower contact plug 11A, second lower contact plugs 11B, and a third lower contact plug 11C. The first lower contact plug 11A may be coupled to the first semiconductor pattern 20A, the second lower contact plugs 11B may be coupled to the second semiconductor patterns 20B, respectively, and the third lower contact plug 11C may be coupled to the third semiconductor pattern 20C.

The first semiconductor pattern 20A and the first vertical doped semiconductor pattern 31A may overlap the first lower contact plug 11A. Each of the second semiconductor patterns 20B may overlap with the corresponding second lower contact plug 11B. The third semiconductor pattern 20C and the first contact plug PCT1 may overlap with the third lower contact plug 11C. The first contact plug PCT1 may pass through the third semiconductor pattern 20C to contact the third lower contact plug 11C.

FIG. 4 is a cross-sectional view of a dummy stacked body DST of a semiconductor memory device according to an embodiment of the present disclosure. The dummy stacked body DST may overlap with the second area A2 as shown in FIG. 1.

Referring to FIG. 4, the lower insulating layer 10 and the gap-filling insulating layer 35 as described with reference to FIGS. 3A and 3B may extend to overlap with the second area A2 as shown in FIG. 1.

The lower contact plugs passing through the lower insulating layer 10 may further include a fourth lower contact plug 11D overlapping with the second area A2 as shown in FIG. 1. The semiconductor patterns separated from each other by the gap-filling insulating layer 35 may further include a fourth semiconductor pattern 20D overlapping with the fourth lower contact plug 11D.

The fourth semiconductor pattern 20D may include the same material as the second and third semiconductor patterns 20B and 20C as shown in FIG. 3A. In other words, the fourth semiconductor pattern 20D may include the first semiconductor layer 21, the first protective layer 23, the sacrificial layer 25, the second protective layer 27, and the second semiconductor layer 29 stacked sequentially on each other. The fourth semiconductor pattern 20D may overlap with the fourth lower contact plug 11D. A fourth vertical doped semiconductor pattern 31D may be formed on a sidewall of the fourth semiconductor pattern 20D. The fourth vertical doped semiconductor pattern 31D may include the same type of impurities as the first semiconductor layer 21.

The fourth semiconductor pattern 20D and the fourth vertical doped semiconductor pattern 31D may be covered by the dummy stacked body DST. The dummy stacked body DST may include dummy interlayer insulating layers 41d and 63d and sacrificial layers 43 and 61 stacked alternately on the fourth semiconductor pattern 20D and the fourth vertical doped semiconductor pattern 31D. The dummy interlayer insulating layers 41d and 63d may include the same material as the interlayer insulating layers 41 and 63 as described with reference to FIGS. 3A and 3B, and may be located in the same levels as the interlayer insulating layers 41 and 63. The sacrificial layers 43 and 61 may be arranged at the same levels as those of the conductive patterns CP1 to CPn described with reference to FIGS. 3A to 3B. The sacrificial layers 43 and 61 may include a material having a different etch rate from the dummy interlayer insulating layers 41d and 63d to achieve selective etch. In an embodiment, each of the sacrificial layers 43 and 61 may include a nitride layer.

The dummy stacked body DST and the fourth semiconductor pattern 20D may be penetrated by a second contact plug PCT2. The second contact plug PCT2 may extend to contact the fourth lower contact plug 11D.

A sidewall of the second contact plug PCT2 may be surrounded by a second insulating structure IS2. The second insulating structure IS2 may include the same material as the first insulating structure IS1 as described with reference to FIG. 3A. According to an embodiment, the second insulating structure IS2 may include a third dummy memory layer 81*d*3 having the same material as the memory layer 81 as shown in FIGS. 3A and 3B, and the oxide layer 95 arranged between the third dummy memory layer 81*d*3 and the second contact plug PCT2. The third dummy memory layer 81*d*3 and the oxide layer 95 may extend to pass through the dummy stacked body DST.

The upper insulating layer 99 as described with FIGS. 3A and 3B may extend to cover the dummy stacked body DST and be penetrated by the second contact plug PCT2 and the second insulating structure IS2. The fourth semiconductor pattern 20D may have a greater width than the second contact plug PCT2.

The first to fourth lower contact plugs 11A to 11D and the first and second contact plugs PCT1 and PCT2 as shown in FIGS. 3A, 3B, and 4 may include various conductive materials capable of transferring electrical signals.

Figure 5B:
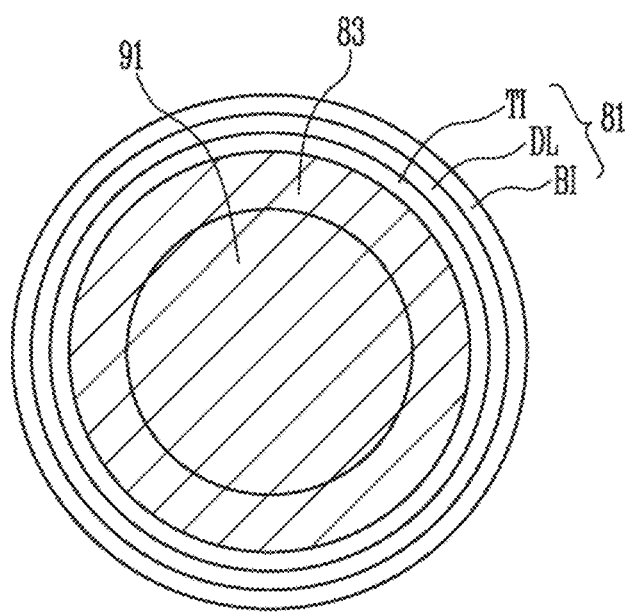

FIG. 5A is a diagram illustrating a memory string according to an embodiment of the present disclosure and FIG. 5B is a diagram illustrating a memory layer according to an embodiment of the present disclosure.

Referring to FIG. 5A, a memory string may be coupled to the plurality of word lines WL and the select lines SSL1, SSL2, DSL1, and DSL2. The select lines SSL1, SSL2, DSL1, and DSL2 may include at least one layer of source select lines SSL1 and SSL2 and at least one layer of drain select lines DSL1 and DSL2. The source select lines SSL1 and SSL2 may be coupled to gate electrodes of source select transistors. The drain select lines DSL1 and DSL2 may be coupled to gate electrodes of drain select transistors. The word lines WL may be coupled to gate electrodes of memory cells.

The source select lines SSL1 and SSL2, the word lines WL, and the drain select lines DSL1 and DSL2 may include the conductive patterns CP1 to CPn as described with reference to FIGS. 3A and 3B The first conductive pattern CP1 disposed adjacent to the first semiconductor pattern 20A, or at least two conductive patterns sequentially stacked and on disposed adjacent to the first semiconductor pattern 20A may serve as the source select line. In an embodiment, the source select lines SSL1 and SSL2 may include a first select line SSL1 formed of the first conductive pattern CP1 and a second select line SSL2 formed of the second conductive pattern CP2. The nth conductive pattern CPn located most distant from the first semiconductor pattern 20A, or the nth conductive pattern CPn and at least one layer of conductive patterns arranged sequentially under the nth conductive pattern CPn may serve as the drain select line. In an embodiment, the drain select lines DSL1 and DSL2 may include a first drain select line DSL1 formed of the nth conductive pattern CPn and a second drain select line DSL2 formed of the (n−1)th conductive pattern CPn−1 located under the nth conductive pattern CPn. Conductive patterns disposed between the second drain select line DSL2 and the second source select line and SSL2 adjacent to each other may serve as the word lines WL.

According to the above-described structure, a drain select transistor may be formed at an intersection between each of the drain select lines DSL1 and DSL2 and the channel structure CH. A source select transistor may be formed at an intersection between each of the source select lines SSL1 and SSL2 and the channel structure CH. Memory cells may be formed at intersections between the word lines WL and the channel structure CH. The memory cells may be coupled in series between the source select transistor and the drain select transistor by the channel layer 83 of the channel structure CH. The source select transistor may be coupled to the channel connecting pattern 121 of the first semiconductor pattern 20A by the channel layer 83. The capping pattern 91 of the channel structure CH may serve as a junction of the drain select transistor.

The first memory pattern P1 of the memory layer 81 may extend between the first semiconductor layer 21 of the first semiconductor pattern 20A and the channel structure CH. The second memory pattern P2 of the memory layer 81 may extend between the second semiconductor layer 29 the first semiconductor pattern 20A and the channel structure CH. Each of the first memory pattern P1 and the second memory pattern P2 of the memory layer 81 may include a tunnel insulating layer TI, a data storage layer DL and a blocking insulating layer BI as shown in FIG. 5B.

FIG. 5B is a cross-sectional view illustrating the memory layer 81 surrounding the channel layer 83.

Referring to FIG. 5B, a central area of the memory layer 81 may be filled the channel layer 83, the core insulating pattern 85, and the capping pattern 91. The tunnel insulating layer TI of the memory layer 81 may surround the channel layer 83, the data storage layer DL of the memory layer 81 may surround the tunnel insulating layer TI, and the blocking insulating layer BI of the memory layer 81 may surround the data storage layer DL.

The data storage layer DL may include a material layer capable of storing varying data using Fowler-Nordheim tunneling. The data storage layer DL may include various materials. In an embodiment, the charge trap layer may include a nitride layer to serve as a charge trap layer. The present disclosure is not limited thereto. In an embodiment the data storage layer DL may include a phase change material, nano dots, and the like. The blocking insulating layer BI may include an oxide layer capable of blocking charges. The tunnel insulating layer may include a silicon oxide layer enabling charge tunneling.

The first dummy memory layer 81*d*1 and the second dummy memory layer 81*d*2 as shown in FIG. 3A and the third dummy memory layer 81*d*3 as shown in FIG. 4 may include the same material layers as the tunnel insulating layer TI, the data storage layer DL and the blocking insulating layer BI, respectively, as described above.

FIG. 6 is a diagram illustrating the substrate 201 including a lower structure LS according to an embodiment of the present disclosure.

Referring to FIG. 6, the substrate 201 may be a semiconductor layer. For example, the substrate 201 may be a bulk silicon substrate, a silicon-on-insulator substrate, a germanium substrate, a germanium-on-insulator substrate, a silicon-germanium substrate, or an epitaxial layer formed by a selective epitaxial growth method.

The lower structure LS may include isolation layers 203 formed in the substrate 201, the transistors TR of the peripheral circuit, a discharge impurity region DCI, interconnection structures 221, and the first to fourth lower contact plugs 11A to 11D described with reference to FIGS. 3A and 4. The first to fourth semiconductor patterns 20A to 20D as described with reference to FIGS. 3A and 4 may be located on the lower structure LS, or may be separated from each other in the plane parallel to a top surface of the substrate 201.

The isolation layers 203 may divide active regions ACT1 and ACT2 in the substrate 201. The active regions ACT1 and ACT2 may include first active regions ACT1 and a second active region ACT2. The transistors TR may be arranged on the first active regions ACT1 and the discharge impurity region DCI may be arranged in the second active region ACT2.

The interconnection structures 221 may be connected to the transistors TR and the discharge impurity region DCI. The discharge impurity region DCI and the transistors TR may be covered by an insulating layer stacked body 220 having two or more insulating layers stacked on each other. The interconnection structures 221 may pass through the insulating layer stacked body 220.

The first semiconductor pattern 20A may be connected to the discharge impurity region DCI through the first lower contact plug 11A connected to the first semiconductor pattern 20A and the interconnection structure 221 corresponding to the first lower contact plug 11A. Each of the semiconductor patterns 20B may be connected to the discharge impurity region DCI through the second lower contact plug 11B connected to each of the semiconductor patterns 20B and the interconnection structure 221 corresponding to the second lower contact plug 11B. The discharge impurity region DCI may be provided so as to discharge charges accumulated in the first semiconductor pattern 20A and the second semiconductor pattern 20B.

Each of the transistors TR may include a gate insulating layer 211, a gate electrode 213 and the junctions JN. The gate insulating layer 211 and the gate electrode 213 of each of the transistors TR may be stacked on the first active region ACT1 corresponding thereto. The junctions JN of each of the transistors TR may be formed by injecting n type or p type impurities into the first active region ACT1 protruding on both sides of the gate electrode 213.

The first contact plug PCT1 may be connected to the transistor TR corresponding to the first contact plug PCT1 through the third lower contact plug 11C connected to the first contact plug PCT1 and the interconnection structure 221 corresponding to the third lower contact plug 11C. The second contact plug PCT2 may be connected to the transistor TR corresponding to the second contact plug PCT2 through the fourth lower contact plug 11D connected to the second contact plug PCT2 and the interconnection structure 221 corresponding to the fourth lower contact plug 11D.

Figure 7:
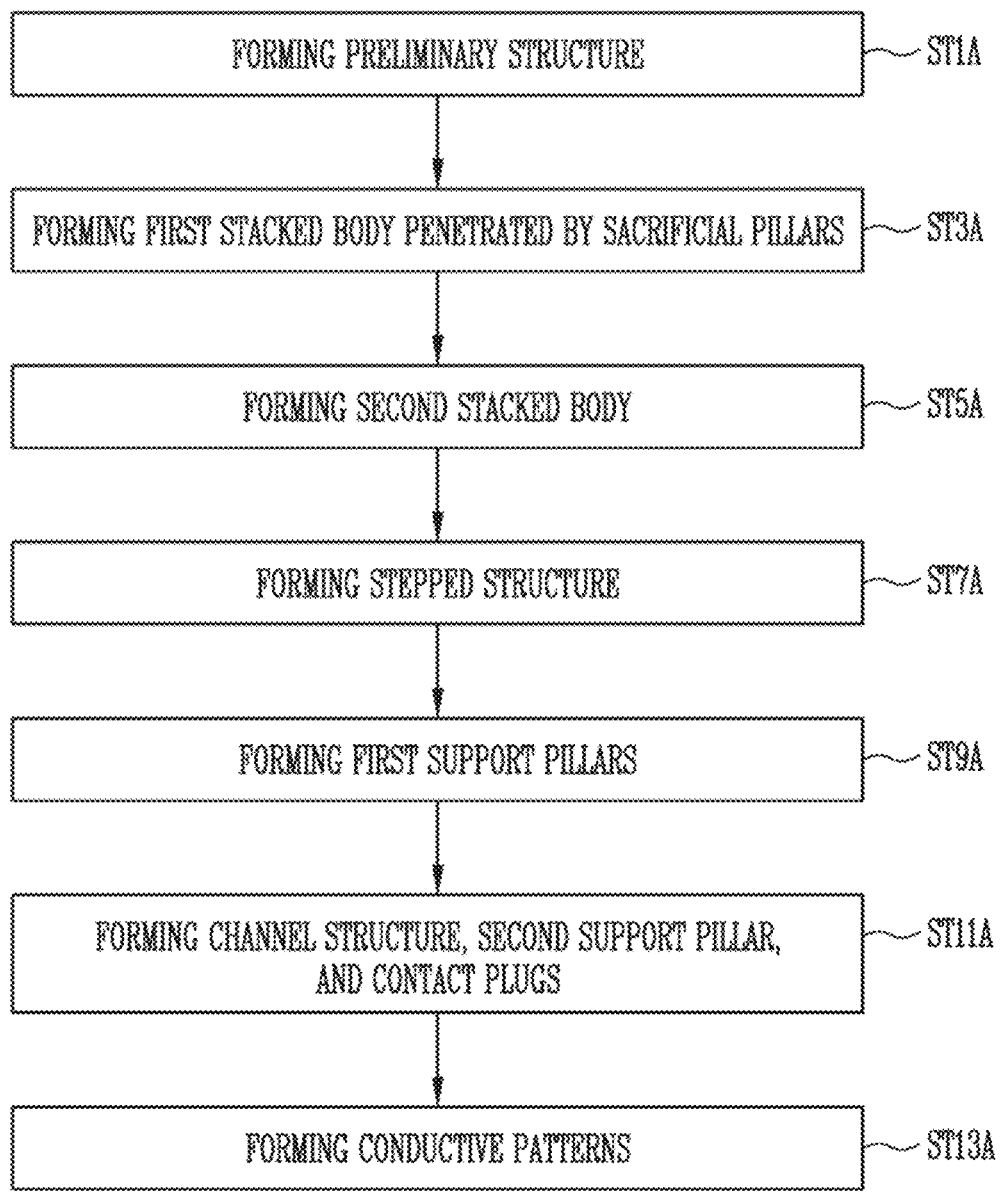
FIG. 7 is a schematic view illustrating a method of manufacturing a semiconductor memory device according to an embodiment of the present disclosure.

FIG. 7 is a schematic flowchart illustrating a method of manufacturing a semiconductor memory device according to an embodiment of the present disclosure.

Referring to FIG. 7, a method of manufacturing a semiconductor memory device may include step ST1A of forming a preliminary structure, step ST3A of forming a first stacked body penetrated by sacrificial pillars, step ST5A of forming a second stacked body, step ST7A of forming a stepped structure, step ST9A of forming first support pillars, step ST11A of forming a second support pillar and contact plugs, and step ST13A of forming conductive patterns.

Step ST1A may be performed after the substrate 201 including the lower structure LS as described above with reference to FIG. 6 is formed. In other words, the preliminary structure may be formed on the substrate 201 including the lower structure LS as described above with reference to FIG. 6.

Hereinafter, a method of manufacturing a semiconductor memory device according to an embodiment is described with reference to FIGS. 8A and 8B, FIGS. 9A to 9C, FIG. 10, FIGS. 11A and 11B, FIGS. 12A and 12B, FIGS. 13A to 13I, FIGS. 14A to 14C, FIGS. 15A to 15D, and FIGS. 16A and 16B. Drawings below are cross-sectional views illustrating structures formed on the first area A1 and the second area A2 of the substrate as shown in FIG. 1 according to manufacturing processes. The cross-sectional views of the structures formed on the first area A1 according to the manufacturing processes are taken along line I-I' or II-II' of FIG. 2.

FIGS. 8A and 8B are cross-sectional views illustrating an embodiment of step ST1A shown in FIG. 7. Step ST1A may include forming semiconductor patterns 320A1 to 320D and forming vertical doped semiconductor patterns 331A to 331D.

Referring to FIG. 8A, forming the semiconductor patterns 320A1 to 320D may include sequentially stacking a first semiconductor layer 321, a sacrificial stacked body 305, and a second semiconductor layer 329 on a substrate including a lower structure 300, and etching the first semiconductor layer 321, the sacrificial stacked body 305, and the second semiconductor layer 329.

The lower structure 300 may include a lower insulating layer 301 penetrated by first to fourth lower contact plugs 311A to 311D. The first to fourth lower contact plugs 311A to 311D may correspond to the first to fourth lower contact plugs 11A to 11D, respectively, as described above with reference to FIG. 6. Although the lower structure 300 shows a portion of the lower structure LS as described with reference to FIG. 6, the semiconductor patterns 320A1 to 320D may be formed on the substrate 201 including the lower structure LS as shown in FIG. 6.

The semiconductor patterns 320A1 to 320D may include a preliminary first semiconductor pattern 320A1 overlapping with the first lower contact plug 311A, second semiconductor patterns 320B overlapping with the second lower contact plugs 311B, a third semiconductor pattern 320C overlapping with the third lower contact plug 311C, and a fourth semiconductor pattern 320D overlapping with the fourth lower contact plug 311D. An edge of the preliminary first semiconductor pattern 320A1 may overlap with the first lower contact plug 311A. Each of the second semiconductor patterns 320B may have a greater width than the corresponding second lower contact plug 311B and protrude on both sides of the corresponding second lower contact plug 311B. The third semiconductor pattern 320C may have a greater width than the third lower contact plug 311C and protrude on both sides of the third lower contact plug 311C. The fourth semiconductor pattern 320D may have a greater width than the fourth lower contact plug 311D and protrude on both sides of the fourth lower contact plug 311D. The preliminary first semiconductor pattern 320A1, the second semiconductor patterns 320B and the third semiconductor pattern 320C may be arranged on the first area A1 of the substrate as described above with reference to FIG. 1. The fourth semiconductor pattern 320D may be arranged on the second area A2 of the substrate.

The first semiconductor layer 321 may include n type or p type impurities. The sacrificial stacked body 305 may include a first protective layer 323, a sacrificial layer 325 and a second protective layer 327 stacked sequentially on each other. The sacrificial layer 325 may include a material having a different etch rate from the first protective layer 323 and the second protective layer 327 to realize selective etch. The first protective layer 323 and the second protective layer 327 may include a material capable of protecting the first semiconductor layer 321 and the second semiconductor layer 329 while the sacrificial layer 325 is etched. In an embodiment, the sacrificial layer 325 may include an undoped silicon layer. Each of the first protective layer 323 and the second protective layer 327 may include an oxide layer. The second semiconductor layer 329 may include an undoped semiconductor layer, or a doped semiconductor layer including the same impurities as the first semiconductor layer 321. In an embodiment, at least one of the first protective layer 323, the second protective layer 327, and the second semiconductor layer 329 may be omitted.

Referring to FIG. 8B, step ST1A may include forming the vertical doped semiconductor patterns 331A to 331D on sidewalls of the preliminary first semiconductor pattern 320A1 and the second to fourth semiconductor patterns 320B to 320D. The vertical doped semiconductor patterns 331A to 331D may include a first vertical doped semiconductor pattern 331A formed on a sidewall of the preliminary first semiconductor pattern 320A1, a second vertical doped semiconductor pattern 331B formed on a sidewall of each of the second semiconductor patterns 320B, a third vertical doped semiconductor pattern 331C formed on a sidewall of the third semiconductor pattern 320C, and a fourth vertical doped semiconductor pattern 331D formed on a sidewall of the fourth semiconductor pattern 320D. The first to fourth vertical doped semiconductor patterns 331A to 331D may include the same impurities as the first semiconductor layer 321 as described with FIG. 8A.

Step ST1A may include filling gaps between the preliminary first semiconductor pattern 320A1, the second semiconductor patterns 320B, the third semiconductor pattern 320C and the fourth semiconductor pattern 320D with a gap-filling Insulating layer 335.

Through the above-described processes as described with reference to FIGS. 8A and 8B, a preliminary structure including the preliminary semiconductor pattern 320A1 and the second to fourth semiconductor patterns 320B to 320D which are separated from each other by the gap-filling insulating layer 335 may be provided on the lower structure 300.

Figure 9A:
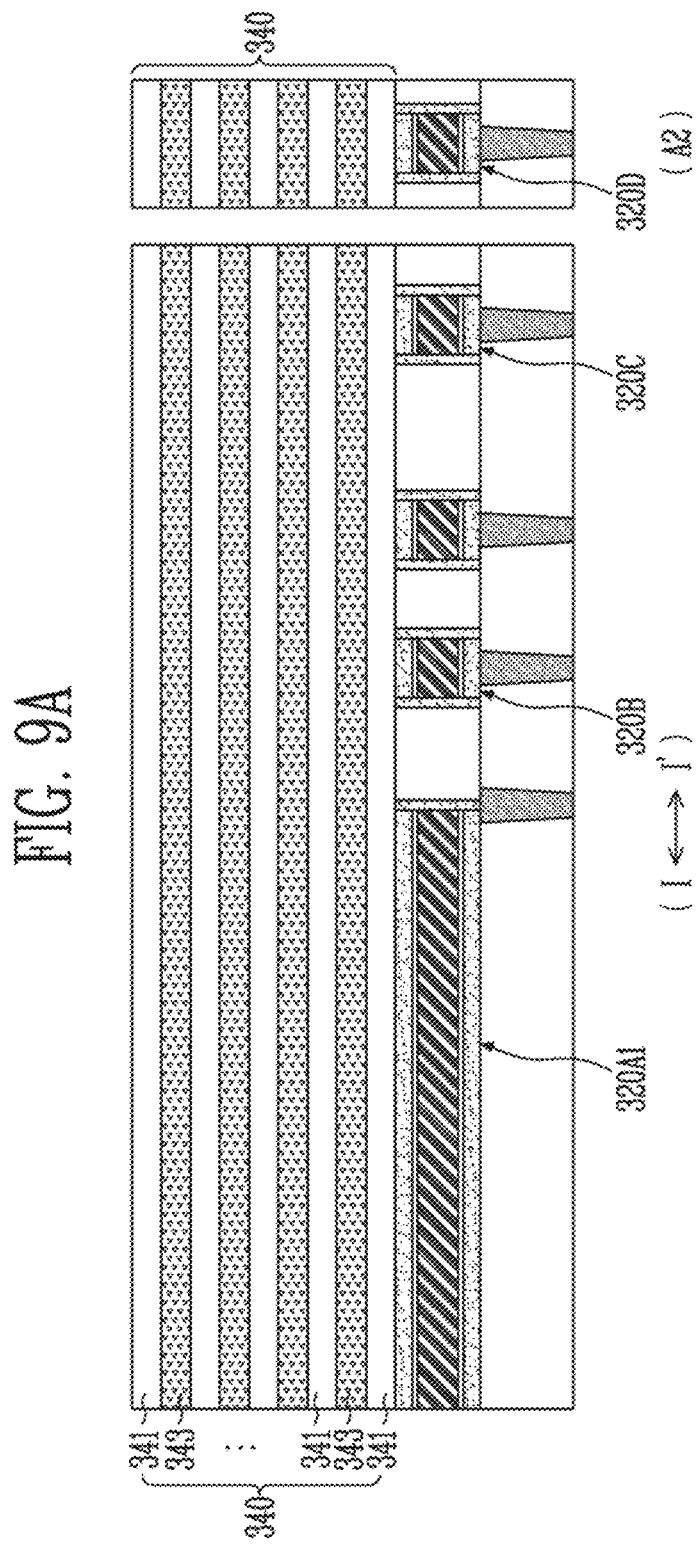
FIGS. 9A, 9B, and 9C are cross-sectional views illustrating an embodiment of step ST3A shown in FIG. 7.
Figure 9B:
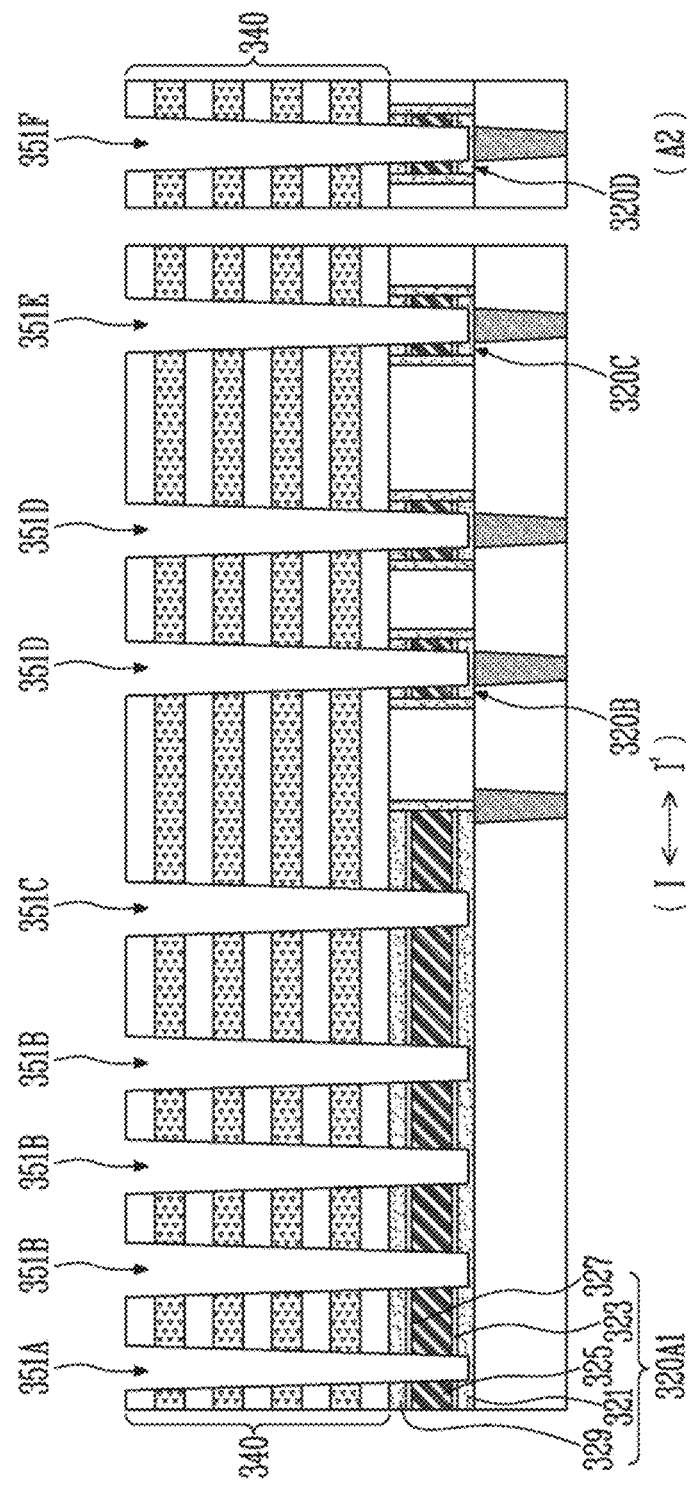
Figure 9C:
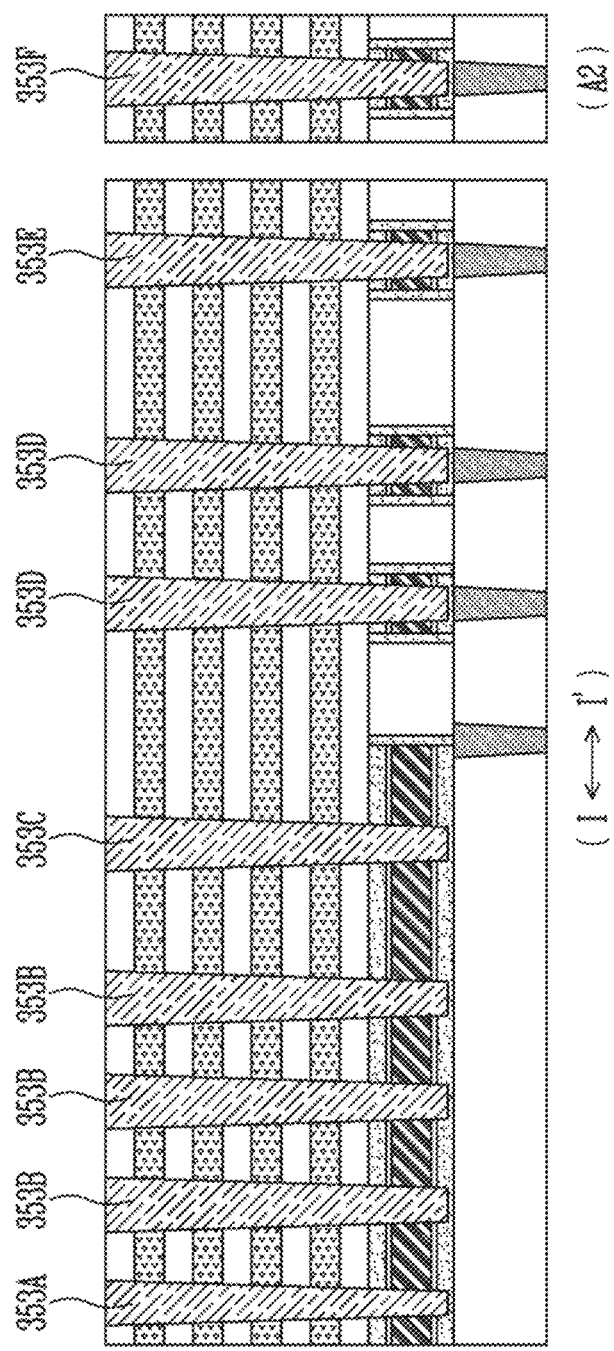

FIGS. 9A to 9C are cross-sectional views illustrating an embodiment of step ST3A shown in FIG. 7.

Referring to FIG. 9A, step ST3A may include forming a first stacked body 340 on the preliminary structure. The first stacked body 340 may include first interlayer insulating layers 341 and first sacrificial layers 343 stacked alternately with each other. The first interlayer insulating layers 341 and the first sacrificial layers 343 may extend to overlap with the preliminary first semiconductor pattern 320A1 and the second to fourth semiconductor patterns 320B to 320D.

Each of the first interlayer insulating layers 341 may include a first material layer and each of the first sacrificial layers 343 may include a second material layer. The second material layer may include an insulating material having a different etch rate from the first material layer to allow for selective etch. In an embodiment, the first material layer may include an oxide layer and the second material layer may include a nitride layer.

Referring to FIG. 9B, step ST3A may include forming lower holes 351A to 351F passing through the first stacked body 340. The lower holes 351A to 351F may be formed at the same time. During an etch process of forming the lower holes 351A to 351F, each of the preliminary first semiconductor pattern 320A1 and the second to fourth semiconductor patterns 320B to 320D may serve as an etch stop layer.

The lower holes 351A to 351F may include a first lower hole 351A, a second lower hole 351B, a third lower hole 351C, a fourth lower hole 351D, a fifth lower hole 351E, and a sixth lower hole 351F.

The first to third lower holes 351A to 351C may overlap with the preliminary first semiconductor pattern 320A1. The second lower hole 351B may be arranged between the first lower hole 351A and the third lower hole 351C. The third lower hole 351C may be arranged closer to an edge of the preliminary first semiconductor pattern 320A1 than the first lower hole 351A. Each of the first to third lower holes 351A to 351C may pass through the first stacked body 340 and extend into the preliminary first semiconductor pattern 320A1.

The fourth to sixth lower holes 351D to 351F may overlap with the second to fourth semiconductor patterns 320B to 320D. The fourth to sixth lower holes 351D to 351F may overlap with the first stacked body 340 and extend into the second to fourth semiconductor patterns 320B to 320D.

Each of the first to sixth lower holes 351A to 351F may pass through the second semiconductor layer 329, the second protective layer 327, the sacrificial layer 325, and the first protective layer 323, and may extend into the first semiconductor layer 321. Each of the first to sixth lower holes 351A to 351F may have a smaller width than a corresponding semiconductor pattern.

Referring to FIG. 9C, step ST3A may including filling the first to sixth lower holes 351A to 351F as shown in FIG. 9B with first to sixth sacrificial pillars 353A to 353F, respectively. The first to sixth sacrificial pillars 353A to 353F may include a material having a different etch rate from the first material layer and the second material layer as described with reference to FIG. 9A. According to an embodiment, the first to sixth sacrificial pillars 353A to 353F may include metal such as tungsten.

Figure 10:
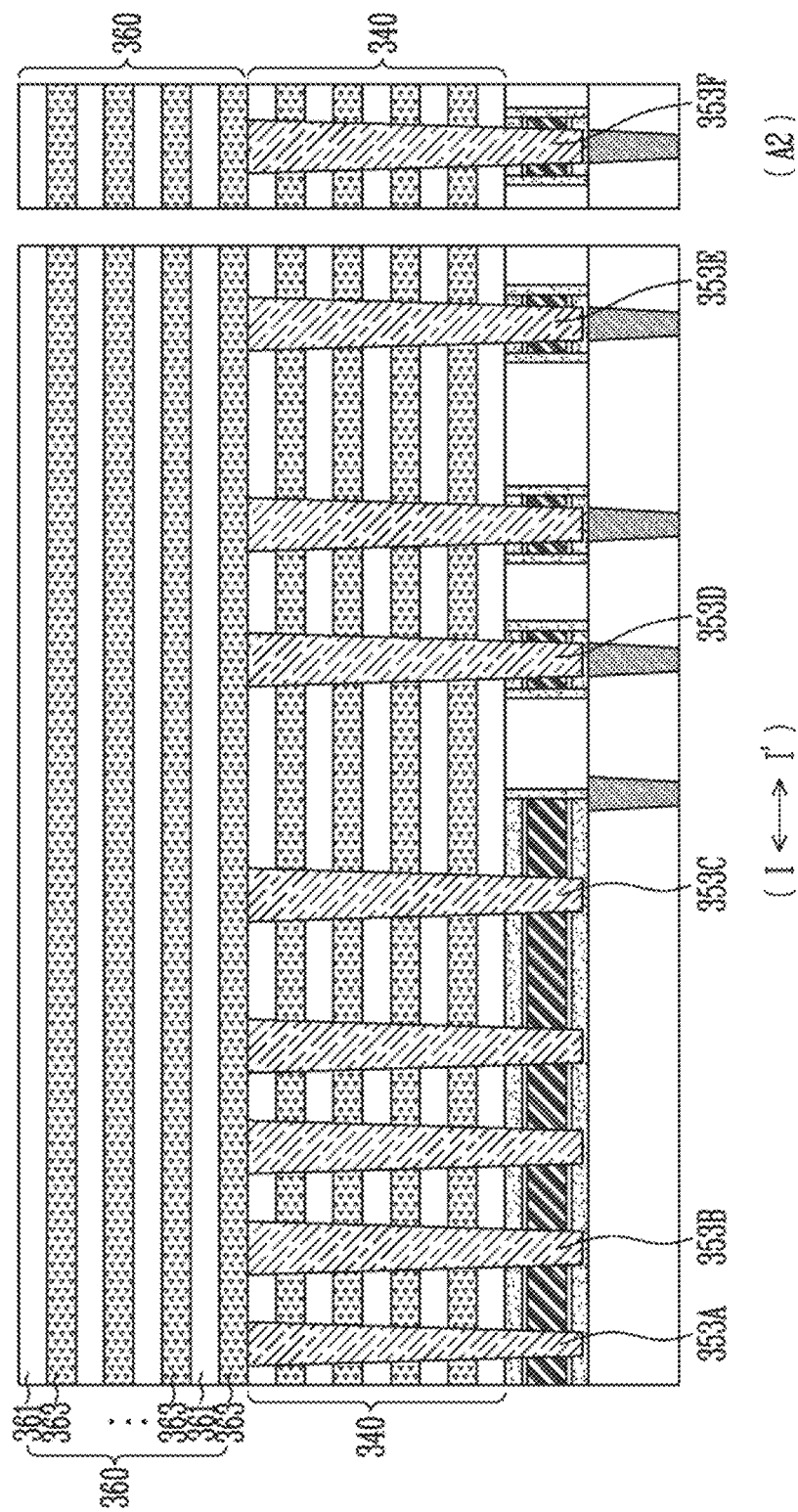
FIG. 10 is a cross-sectional view illustrating an embodiment of step ST5A shown in FIG. 7.

FIG. 10 is a cross-sectional view illustrating an embodiment of step ST5A shown in FIG. 7.

Referring to FIG. 10, step ST5A may include forming a second stacked body 360 extending to cover the first to sixth sacrificial pillars 353A to 353F on the first stacked body 340. The second stacked body 360 may include second interlayer insulating layers 363 and second interlayer insulating layers 361 stacked alternately with each other. Each of the second interlayer insulating layers 361 may include the first material layer as described with reference to FIG. 9A, and each of the second sacrificial layers 363 may include the second material layer as described above with reference to FIG. 9A.

Figure 11A:
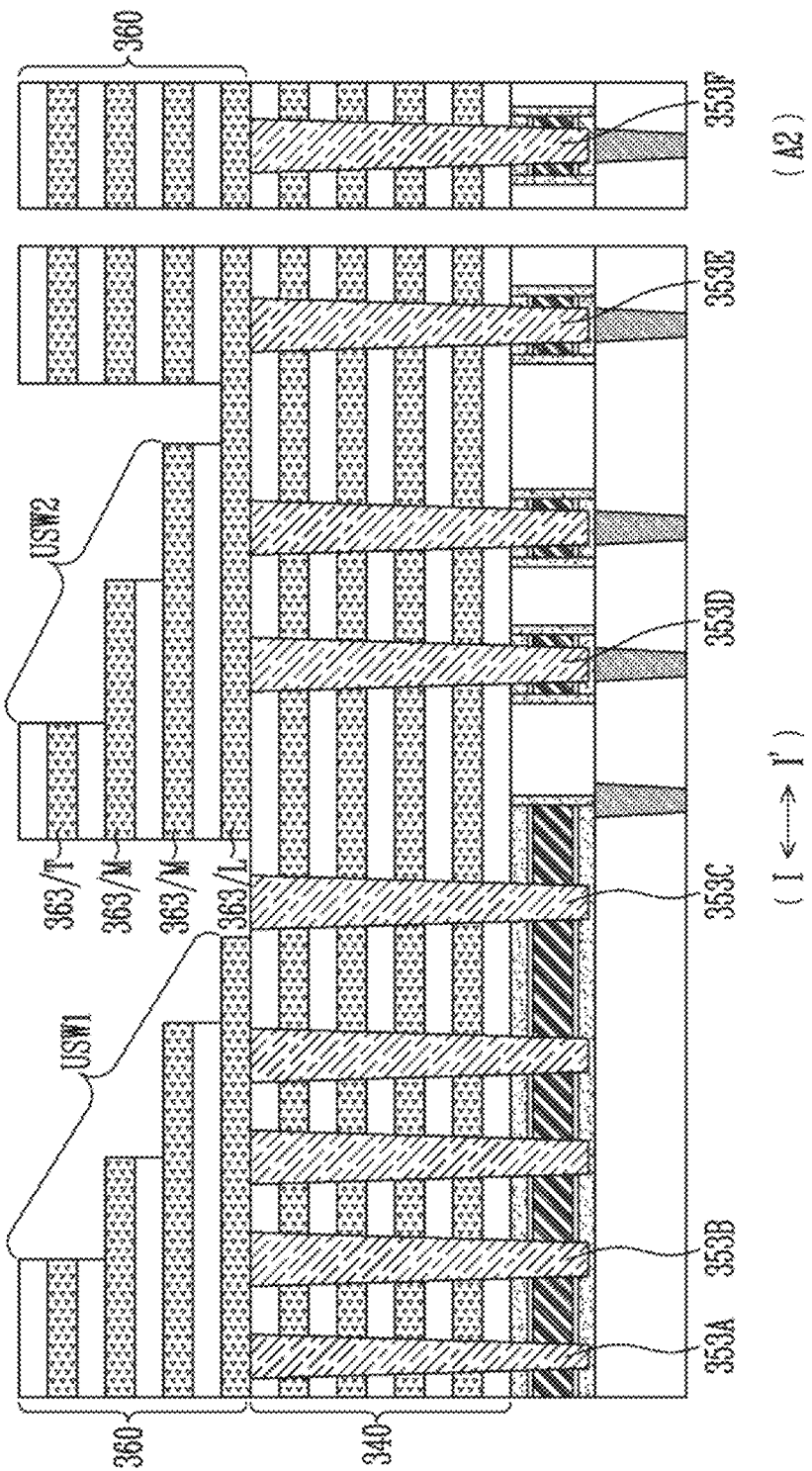
FIGS. 11A and 11B are cross-sectional views illustrating an embodiment of step ST7A shown in FIG. 7.
Figure 11B:
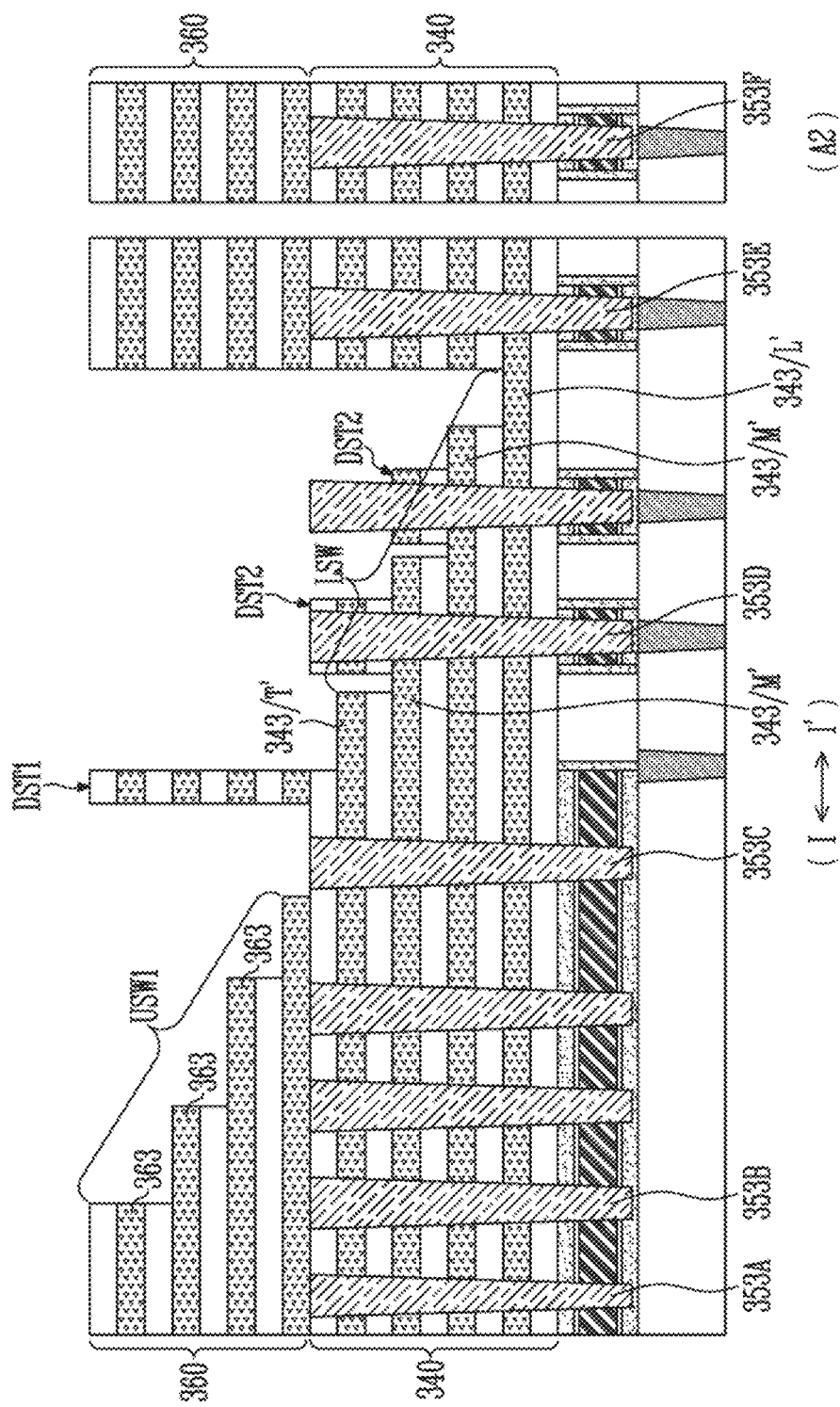

FIGS. 11A and 11B are cross-sectional views illustrating an embodiment of step ST7A shown in FIG. 7.

Referring to FIG. 11A, step ST7A may include forming upper stepped structures USW1 and USW2 by etching the second stacked body 360. The upper stepped structures USW1 and USW2 may include a first upper stepped structure USW1 overlapping with the second sacrificial pillar 353B and a second upper stepped structure USW2 overlapping with the fourth sacrificial pillar 353D.

The second sacrificial layers 363 of the second stacked body 360 may include a lowermost layer L, an uppermost layer T and one or more intermediate layers M arranged between the uppermost layer T and the lowermost layer L. An etch process of forming the first and second upper stepped structures USW1 and USW2 may be controlled that the lowermost layer L, the intermediate layers M, and the uppermost layer T may remain while overlapping with the first sacrificial pillar 353A, the fifth sacrificial pillar 353E and the sixth sacrificial pillar 353F, respectively. The etch process of forming the first and second upper stepped structures USW1 and USW2 may be controlled so as to expose the third sacrificial pillar 353C.

The upper stepped structures USW1 and USW2 according to an embodiment may the first upper stepped structure USW1 and the second upper stepped structure USW2 that have different depths from each other in the second stacked body 360. In an embodiment, steps of the first upper stepped structure USW1 may include the lowermost layer L, the intermediate layers M, and the uppermost layer T. and respective steps of the second upper stepped structure USW2 may include the intermediate layers M and the uppermost layer T stacked on the lowermost layer L.

Though not shown, in an embodiment, the upper stepped structure USW1 and USW2 may include the first upper stepped structure USW1 and the second upper stepped structure USW2 having the same depth.

The shape of the mask pattern serving as an etch barrier when the second stacked body 360 is etched, the number of etch processes for etching the second stacked body 360, and an etch amount of the second stacked body 360 may vary depending on the structures of the targeted first and second upper stepped structures USW1 and USW2.

Referring to FIG. 1B, step ST7A may include forming a lower stepped structure LSW on the first stacked body 340. The lower stepped structure LSW may be formed by etching the first stacked body 340 so that the second upper stepped structure USW2 as shown in FIG. 11A may be transcribed onto a first stacked body 320 and the fourth sacrificial pillar 353D may be exposed. The lower stepped structure LSW may surround the fourth sacrificial pillar 353D.

While the lower stepped structure LSW is formed, the first and second dummy stacked bodies DST1 and DST2 may be formed. The first dummy stacked body DST1 may be arranged between the first upper stepped structure USW1 and the lower stepped structure LSW and disposed on the first stacked body 340. The second dummy stacked body DST2 may be arranged on the lower stepped structure LSW and surround the fourth sacrificial pillar 353D.

The first sacrificial layers 343 of the first stacked body 340 may include a lowermost layer L', an uppermost layer T' and one or more intermediate layers M' arranged between the uppermost layer T' and the lowermost layer L'. An etch process of forming the lower stepped structure LSW may be controlled so that the lowermost layer L', the intermediate layers M', and the uppermost layer T' may remain while surrounding the first sacrificial pillar 353A, the second sacrificial pillar 353B, the fifth sacrificial pillar 353E, and the sixth sacrificial pillar 353F, respectively. The etch process of forming the lower stepped structure LSW may be controlled so as to maintain the first upper stepped structure USW1. Steps of the lower stepped structure LSW may include the intermediate layers M' and the uppermost layer T' arranged on the lowermost layer L'.

The shape of the mask pattern serving as an etch barrier when the first stacked body 340 is etched, the number of etch processes for etching the first stacked body 340, and an etch amount of the first stacked body 340 may vary depending on the targeted lower stepped structure LSW.

Through the above-described processes as described with reference to FIGS. 11A and 11B, a stepped structure may be formed on each of the first stacked body 340 and the second stacked body 360, and the third and fourth sacrificial pillars 353C and 353D may be exposed. According to an embodiment, after the second stacked body 360 is formed on the first stacked body 340, the second upper stepped structure USW2 formed on the second stacked body 360 may be transcribed onto the first stacked body 340, thereby forming the lower stepped structure LSW. As a result, according to an embodiment of the present disclosure, the etch process of the lower stepped structure LSW may be simplified.

Figure 12A:
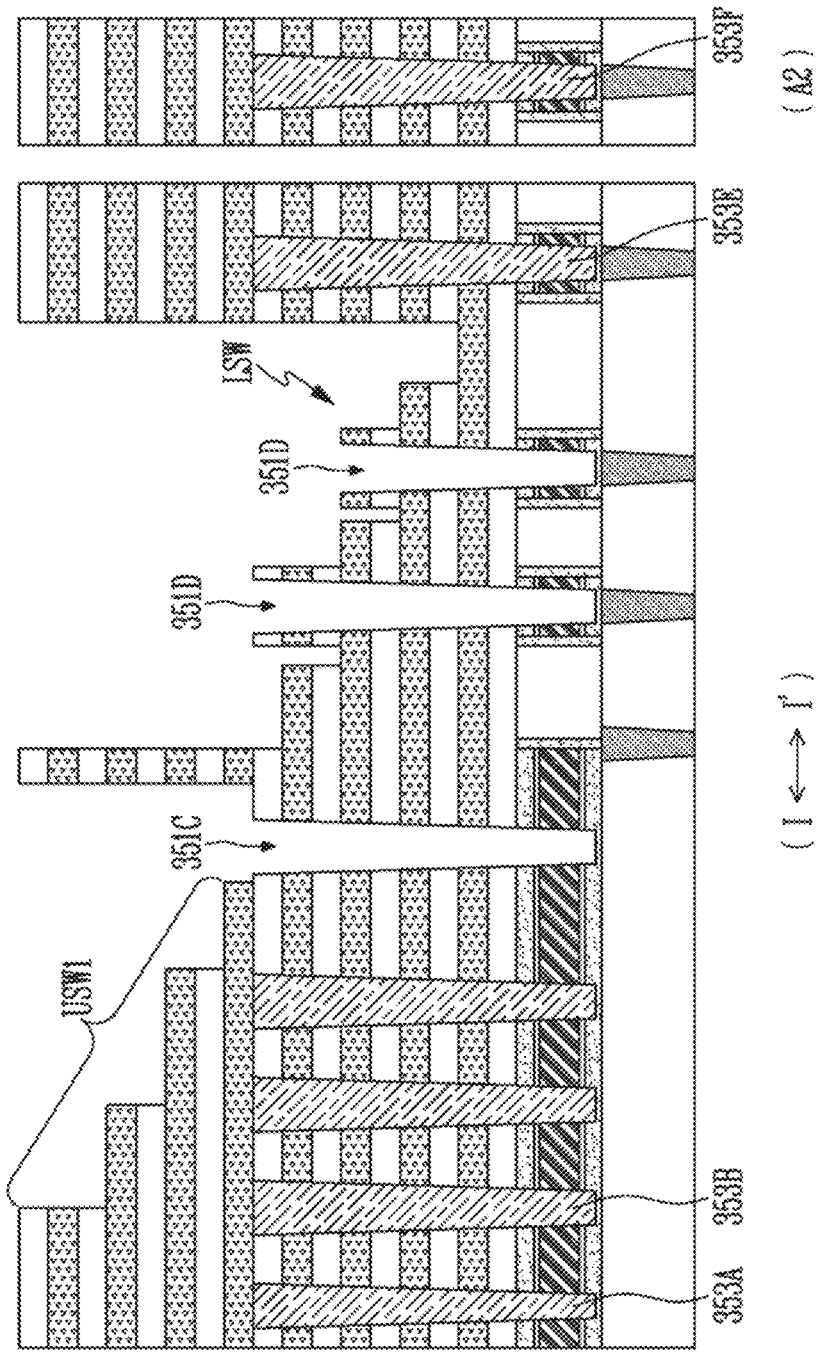
FIGS. 12A and 12B are cross-sectional views illustrating an embodiment of step ST9A shown in FIG. 7.
Figure 12B:
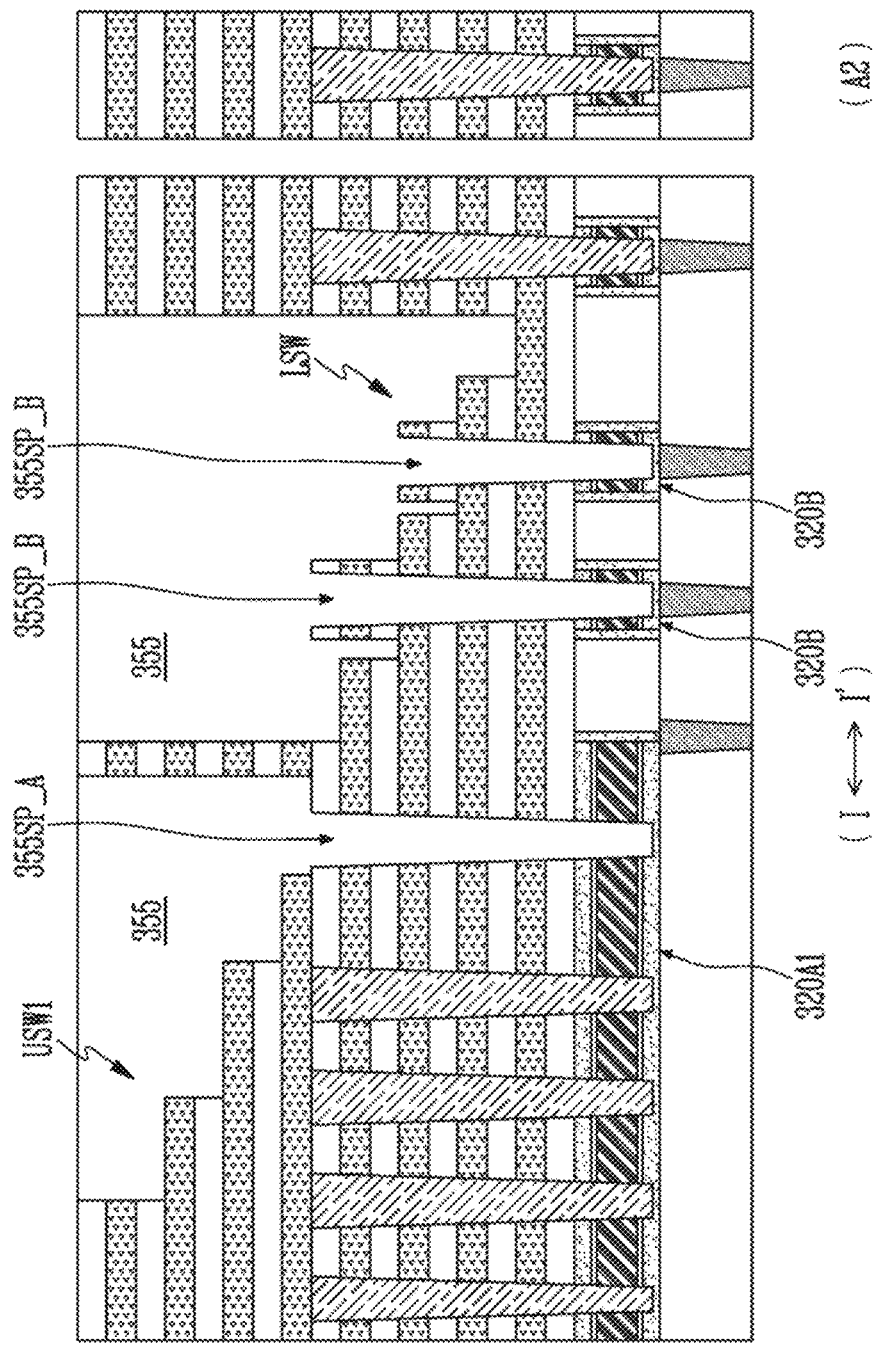

FIGS. 12A and 12B are cross-sectional diagrams illustrating an embodiment of step ST9A shown in FIG. 7.

Referring to FIG. 12A, step ST9A may include removing the third and fourth sacrificial pillars 353C and 353D as shown in FIG. 11B. As a result, the third and fourth lower holes 351C and 351D may be opened.

Referring to FIG. 12B, step ST9A may include forming an insulating layer 355 filling the third and fourth lower holes 351C and 351D as shown in FIG. 12A and covering the first upper stepped structure USW1 and the lower stepped structure LSW. Portions of the insulating layer 355 filling the third and fourth lower holes 351C and the 351D may be defined as first support pillars 355SP_A and 355SP_B. The first insulating pillar 355SP_A may overlap with the first semiconductor pattern 320A1 and the second insulating pillars 355SP_B may overlap with the second semiconductor pattern 320B.

FIGS. 13A to 13I are cross-sectional diagrams illustrating an embodiment of step ST11A shown in FIG. 7.

Figure 13A:
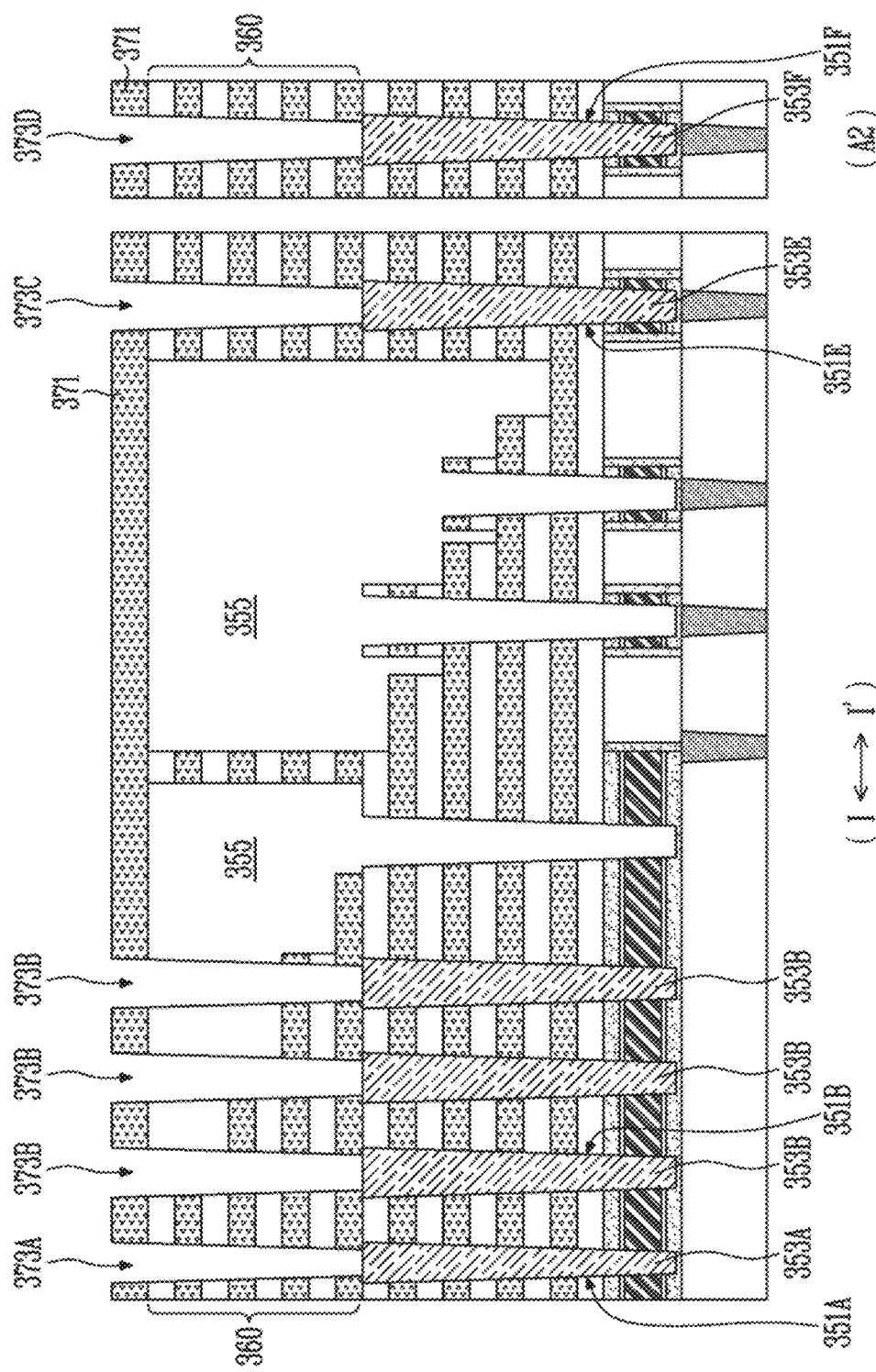

Referring to FIG. 13A, step ST11A may including etching the second stacked body 360 so as to form a first upper hole 373A, a second upper hole 373B, a third upper hole 373C, and a fourth upper hole 373D that expose the first sacrificial pillar 353A, the second sacrificial pillar 353B, the fifth sacrificial pillar 353E, and the sixth sacrificial pillar 353F, respectively. The first upper hole 373A may be coupled to the first lower hole 351A, the second upper hole 373B may be coupled to the second lower hole 351B, the third upper hole 373C may be coupled to the fifth lower hole 351E, and the fourth upper hole 373D may be coupled to the sixth lower hole 351F.

A process of etching the second stacked body 360 may include forming a mask pattern 371 including a plurality of opening holes on the second stacked body 360, and performing an etch process using the mask pattern 371 as an etch barrier. During the etch process using the mask pattern 371 as an etch barrier, the insulating layer 355 overlapping with the second sacrificial pillar 353B may be etched.

Referring to FIG. 13B, step ST11A may include removing the first sacrificial pillar 353A, the second sacrificial pillar 353B, the fifth sacrificial pillar 353E, and the sixth sacrificial pillar 353F through the first upper hole 373A, the second upper hole 373B, the third upper hole 373C, and the fourth upper hole 373D, respectively. As a result, first to fourth holes H1 to H4 may be opened.

The first hole H1 may be defined by connecting the first upper hole 373A and the first lower hole 351A as shown in FIG. 13A, and may expose the first semiconductor layer 321 of the preliminary first semiconductor pattern 320A1. The second hole H2 may be defined by connecting the second upper hole 373B and the second lower hole 351B to each other as shown in FIG. 13A, and may expose the first semiconductor layer 321 of the preliminary first semiconductor pattern 320A1. The third hole H3 may be defined by connecting the third upper hole 373C and the fifth lower hole 351E to each other as shown in FIG. 13A, and may expose the first semiconductor layer 321 of the third semiconductor pattern 320C. The fourth hole H4 may be defined by connecting the fourth upper hole 373D and the sixth lower hole 351F to each other as shown in FIG. 13A, and may expose the first semiconductor layer 321 of the fourth semiconductor pattern 320D.

Referring to FIG. 13C, step ST11A may include forming a memory layer 381 on the surface of each of the first to fourth holes H1 to H4, forming a channel layer 383 on the memory layer 381, and filling a central area of the channel layer 383 with a core insulating layer 385.

The memory layer 381 may be formed by sequentially stacking the blocking insulating layer BI, the data storage layer DL and the tunnel insulating layer TI as described above with reference to FIG. 5B. The memory layer 381 may be simultaneously formed on the surfaces of the first to fourth holes H1 to H4.

The channel layer 383 may have various structures on the memory layer 381. According to an embodiment, the channel layer 383 may be conformally formed on the memory layer 381, the core insulating layer 385 may be formed by filling central areas of the first to fourth holes H1 to H4, which are not filled with the channel layer 383, with a flowable material layer, and curing the flowable material layer. The flowable material layer may include polysilazane (PSZ).

Referring to FIG. 13D, step ST11A may include removing an upper end of the core insulating layer 385 as shown in FIG. 13C so that a hollow portion HP may be defined in an upper end of the central area of the channel layer 383. As a result, a core insulating pattern 385P may be formed in each of the first to fourth holes H1 to H4 so that the core insulating pattern 385p may open the upper end of the channel layer 383 corresponding to the core insulating pattern 385P.

Referring to FIG. 13E, step ST11A may include forming a doped semiconductor layer 391L to fill the hollow portion HP as shown in FIG. 13D. The doped semiconductor layer 391L may include at least one of n type impurities or p type impurities.

Referring to FIG. 13F, step ST11A may include removing a portion of the doped semiconductor layer 391L, and the core insulating pattern 385P and the channel layer 383 included in each of the third hole H3 and the fourth hole H4 so as to expose the memory layer 381 formed in each of the third hole H3 and the fourth hole H4. Though not shown in FIG. 13F, the portion of the doped semiconductor layer 391L may be removed by an etch process using a mask pattern (not shown) overlapping with the first and second holes H1 and H2 and exposing the third hole H3 and the fourth hole H4 as an etch barrier. When the core insulating pattern 385P and the channel layer 383 arranged in each of the third hole H3 and the fourth hole H4 are removed, the remaining doped semiconductor layer 391L may be used as an etch barrier.

Figure 13G:
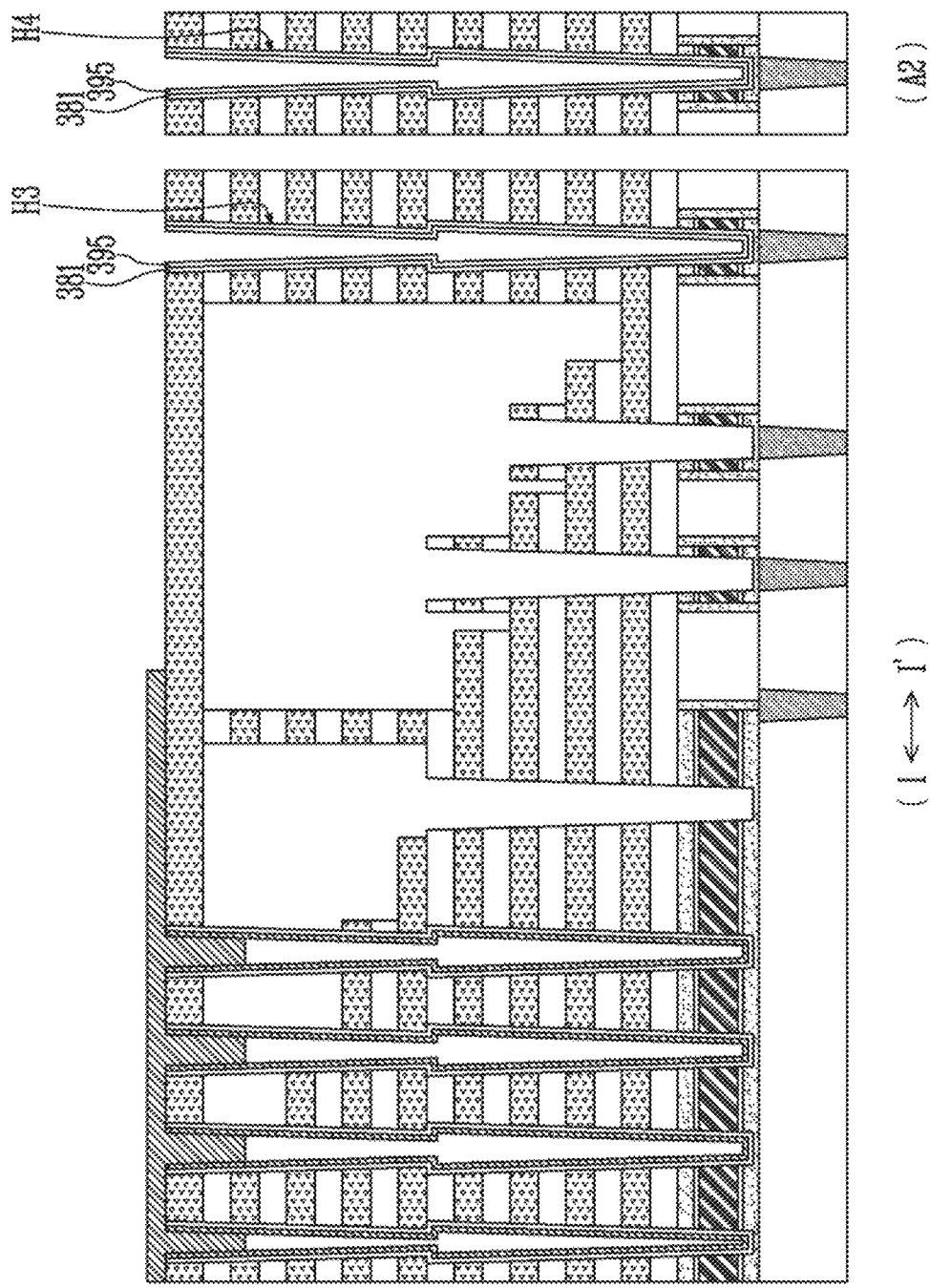

Referring to FIG. 13G, step ST11A may include forming an oxide layer 395 on the memory layer 381 exposed through the third and fourth holes H3 and H4. The oxide layer 395 may be formed to supplement insulation characteristics of the memory layer 381. According to an embodiment, a process of forming the oxide layer 395 may be omitted.

Figure 13H:
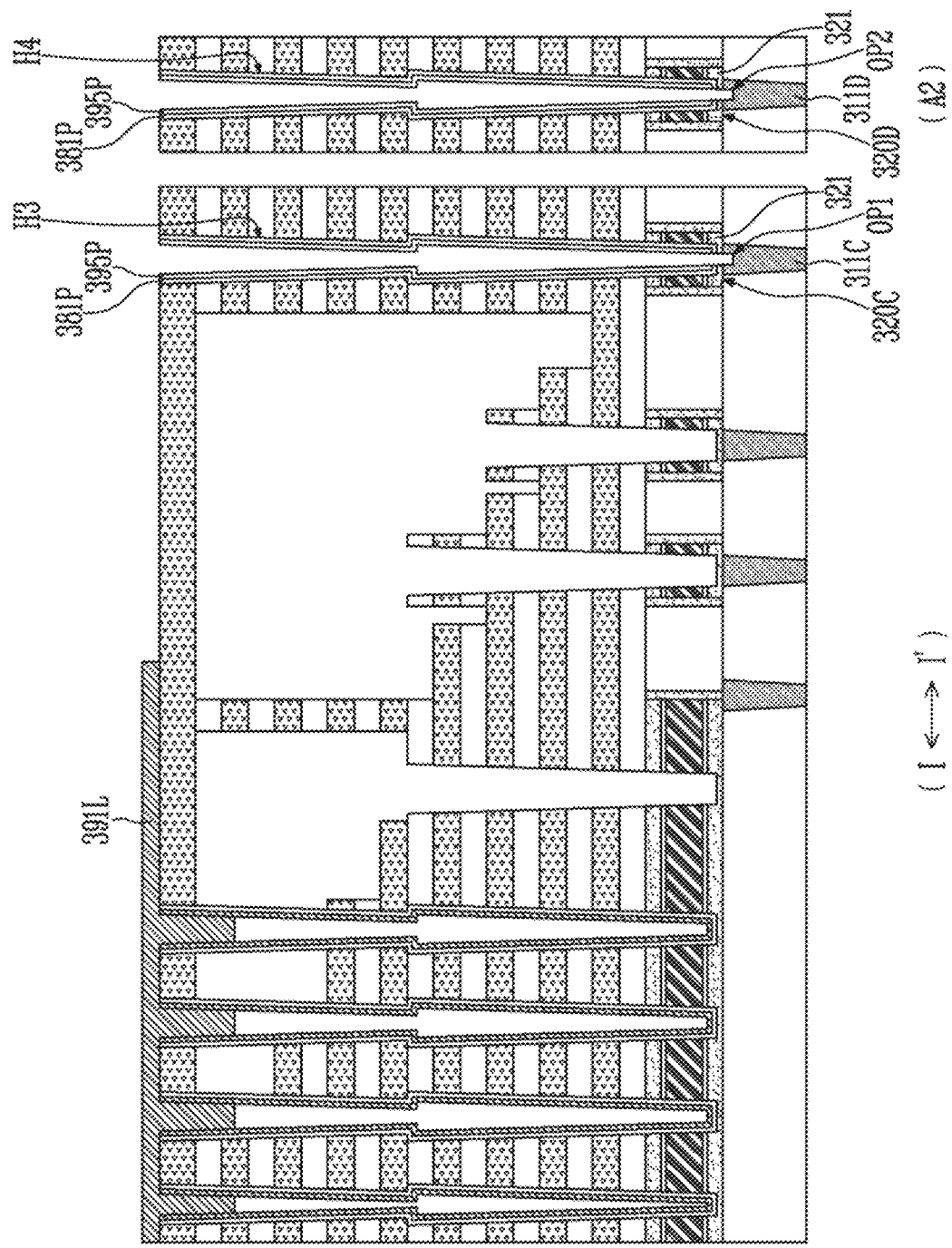

Referring to FIG. 13H, step ST11A may include forming a first opening OP1 and a second opening OP2 coupled to the third hole H3 and the fourth hole H4, respectively, and passing through the memory layer and the oxide layer. Hereinafter, the memory layer and the oxide layer remaining in each of the third hole H3 and the fourth hole H4 will be referred to as a dummy memory layer 381P and an oxide layer pattern 395P, respectively.

The first opening OP1 may pass through the first semiconductor layer 321 of the third semiconductor pattern 320C so as to expose the third lower contact plug 311C. The second opening OP2 may pass through the first semiconductor layer 321 of the fourth semiconductor pattern 320D so as to expose the fourth lower contact plug 311D.

Figure 13I:
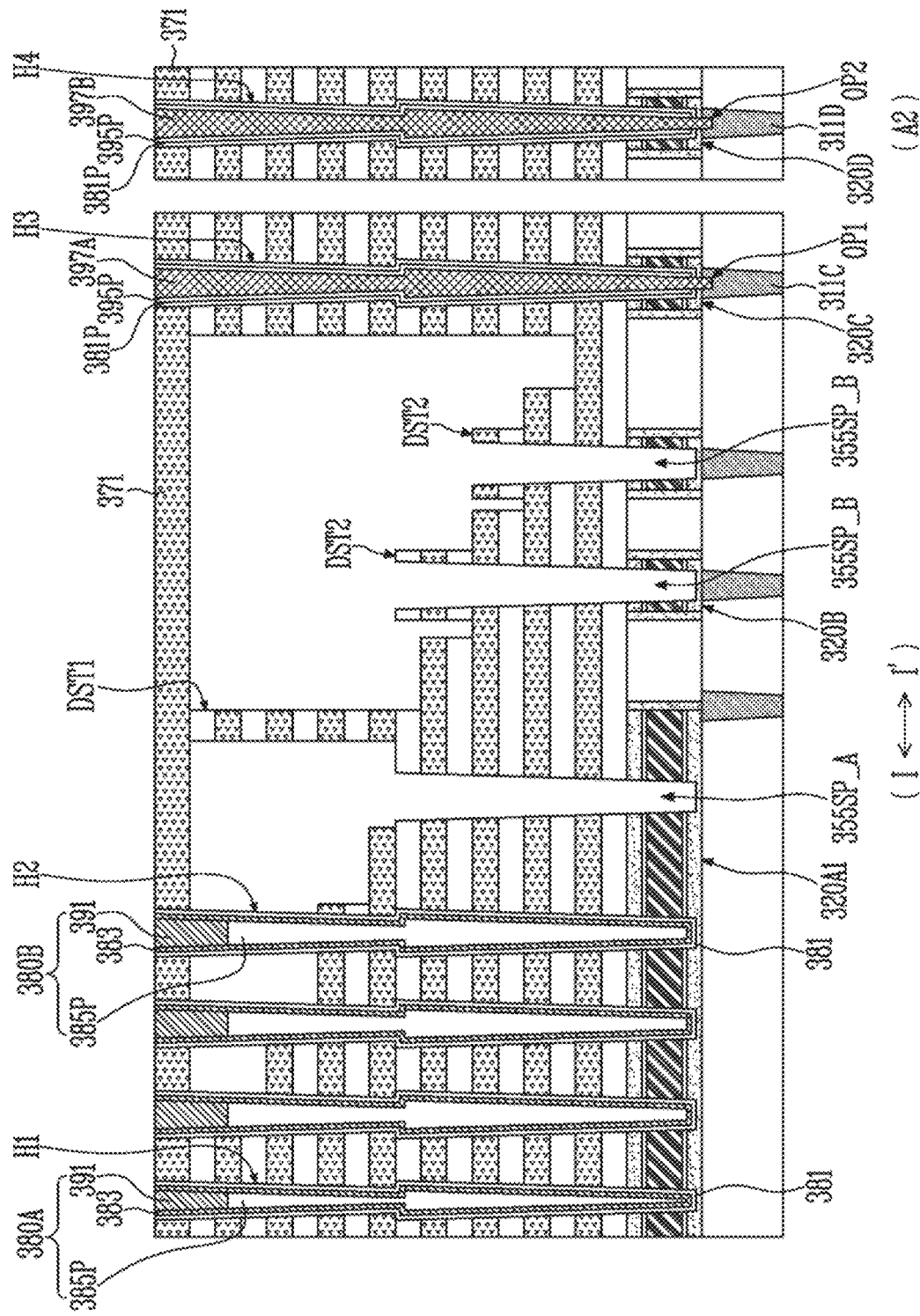

Referring to FIG. 13I, step ST11A may include a channel structure 380A, a second support pillar 380B, a first contact plug 397A, and a second contact plug 397B. Forming the channel structure 380A, the second support pillar 380B, the first contact plug 397A, and the second contact plug 397B may include filling the third and fourth holes H3 and H4 and the first and second openings OP1 and OP2 with a conductive material, and planarizing the conductive material and the doped semiconductor layer 391L as shown in FIG. 13H.

The conductive material may include various materials capable of transferring an electrical signal. The doped semiconductor layer 391L may remain as a capping pattern 391.

Through the processes as described above with reference to FIGS. 13A to 13I, the channel structure 380A may be formed in the first hole H1, the second support pillar 380B may be formed in the second hole H2, the first contact plug 397A may fill the third hole H3 and the first opening OP1, and the second contact plug 397B may fill the fourth hole H4 and the second opening OP2. Each of the channel structure 380A and the second support pillar 380B may include the channel layer 383, the core insulating pattern 385P, and the capping pattern 391. The first contact plug 397A may contact the third lower contact plug 311C, and the second contact plug 397B may contact the fourth lower contact plug 311D.

Though not shown in FIGS. 13A to 13I, in an embodiment, the capping pattern 391 and the core insulating pattern 385P may be omitted, and each of the channel structure 380A and the second support pillar 380B may include the channel layer 383 filling the central area of the memory layer 381.

According to an embodiment of the present disclosure, the dummy memory layer 381P surrounding each of the first contact plug 397A and the second contact plug 397B may be formed using a process of forming the memory layer 381. The dummy memory layer 381P may serve as an insulating structure for insulating the first contact plug 397A and the second contact plug 397B.

Figure 14B:
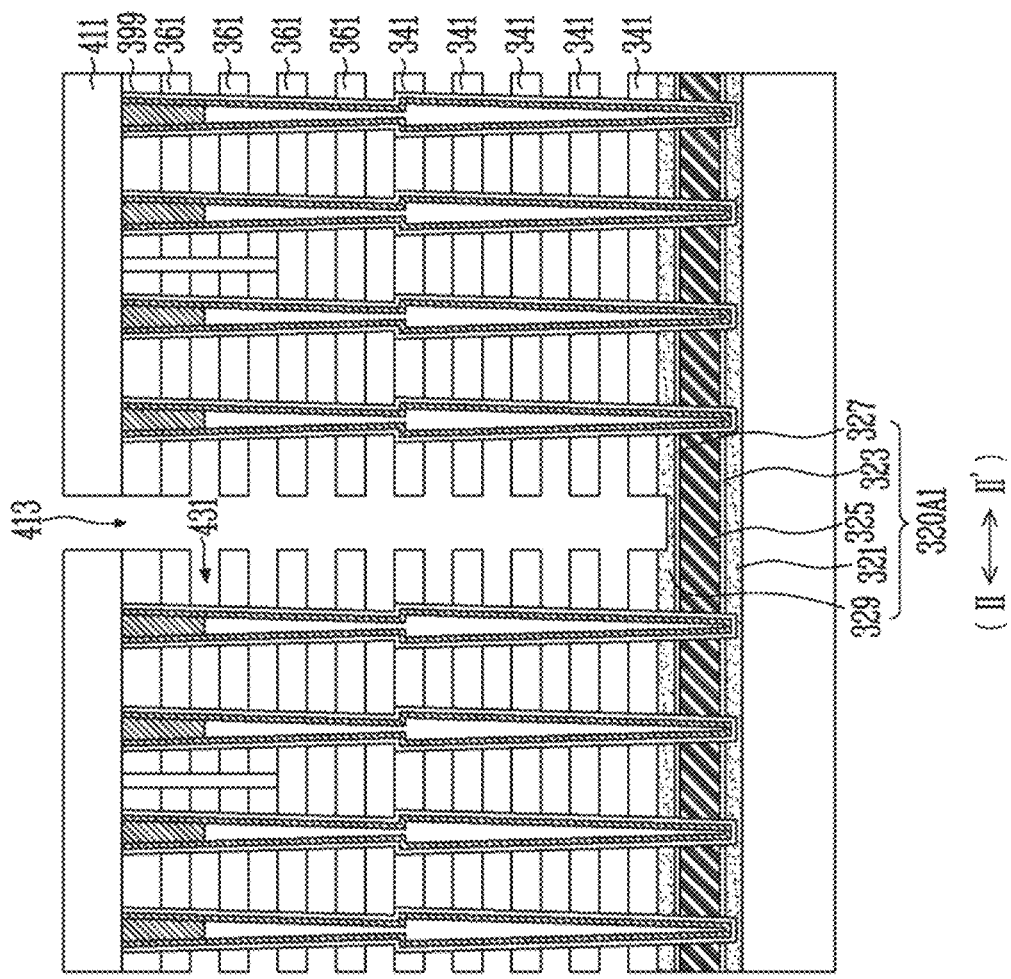
Figure 14C:
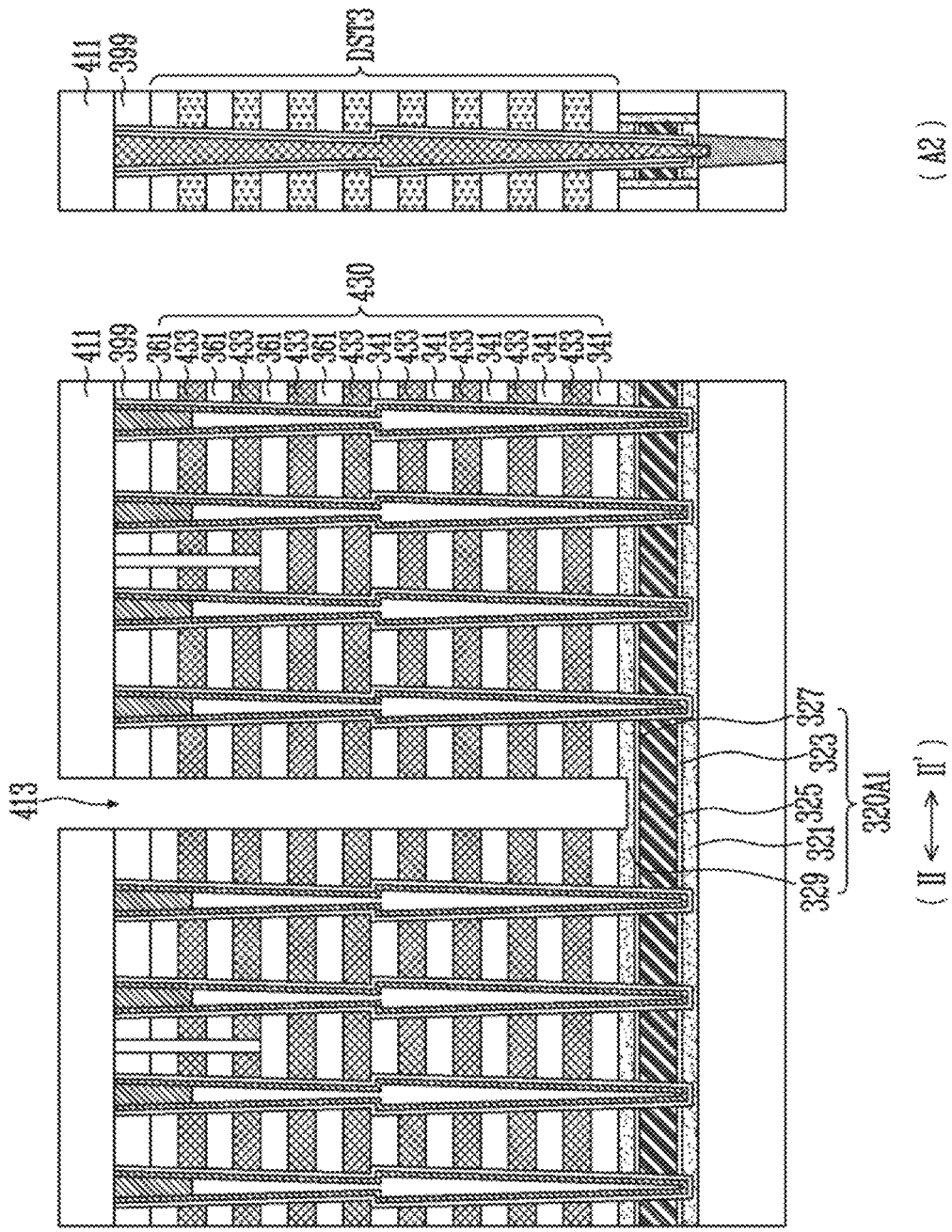

FIGS. 14A to 14C are cross-sectional diagrams illustrating an embodiment of step ST13A shown in FIG. 7.

Referring to FIG. 14A, before step ST13A is performed, the mask pattern 371 as shown in FIG. 13I may be removed and a region from which the mask pattern 371 is removed may be filled with a first upper insulating layer 399. The first upper insulating layer 399 may surround an upper end of each of the channel structure 380A, the second support pillar 380B, the first contact plug 397A and the second contact plug 397B as shown in FIG. 13I. After the first upper insulating layer 399 is formed, an upper slit may be formed, an isolation layer 401 filling the upper slit may be formed, and a second upper insulating layer 411 may be formed on the first upper insulating layer 399. The second upper insulating layer 411 may extend to surround the channel structure 380A, the second support pillar 380B, the first contact plug 397A and the second contact plug 397B as shown in FIG. 13I. The upper slit may correspond to the upper slit USI as shown in FIGS. 2 and 3B.

Step ST13A may include forming a slit 413 passing through the second upper insulating layer 411, the first upper insulating layer 399, the second stacked body 360, and the first stacked body 340. The slit 413 may overlap with the preliminary first semiconductor pattern 302A1. The second semiconductor layer 329 of the preliminary first semiconductor pattern 302A1 may be exposed by a bottom surface of the slit 413.

Referring to FIG. 14B, step ST13A may include selectively removing the first and second sacrificial layers 343 and 363 through the slit 413. The slit 413 may overlap with the first area A1 of the substrate as shown in FIG. 1 and the second area A2 of the substrate may be separated from the first area A1 and the slit 413. The first and second sacrificial layers 343 and 363 may be selectively removed so that a portion of each of the first and second sacrificial layers 343 and 363 may remain in the second area A2, and another portion of each of the first and second sacrificial layers 343 and 363 overlapping with the first area A1 may be removed.

Hereinafter, areas from which the first and second sacrificial layers 343 and 363 are removed may be referred to as gate areas 431. The gate areas 431 may be defined between the first and second interlayer insulating layers 341 and 361.

The first and second sacrificial layers 343 and 363 remaining in the second area A2 and the first and second interlayer insulating layers 341 and 361 overlapping with the same may form a third dummy stacked body DST3. The third dummy stacked body DST3 may correspond to the dummy stacked body DST as shown in FIG. 4.

Referring to FIG. 14C, step ST13A may include forming conductive patterns 433 in the gate areas 431 as shown in FIG. 14B.

The conductive patterns 433 may be formed by forming a barrier metal layer extending along surfaces of the gate areas 431, forming a conductive layer thick enough to fill the gate areas 431 on the barrier metal layer, and etching the barrier metal layer and the conductive layer to separate the same into the conductive patterns 433. As a result, a gate stacked structure 430 including the first and second interlayer insulating layers 341 and 361 and the conductive patterns 433 may be formed.

Figure 16A:
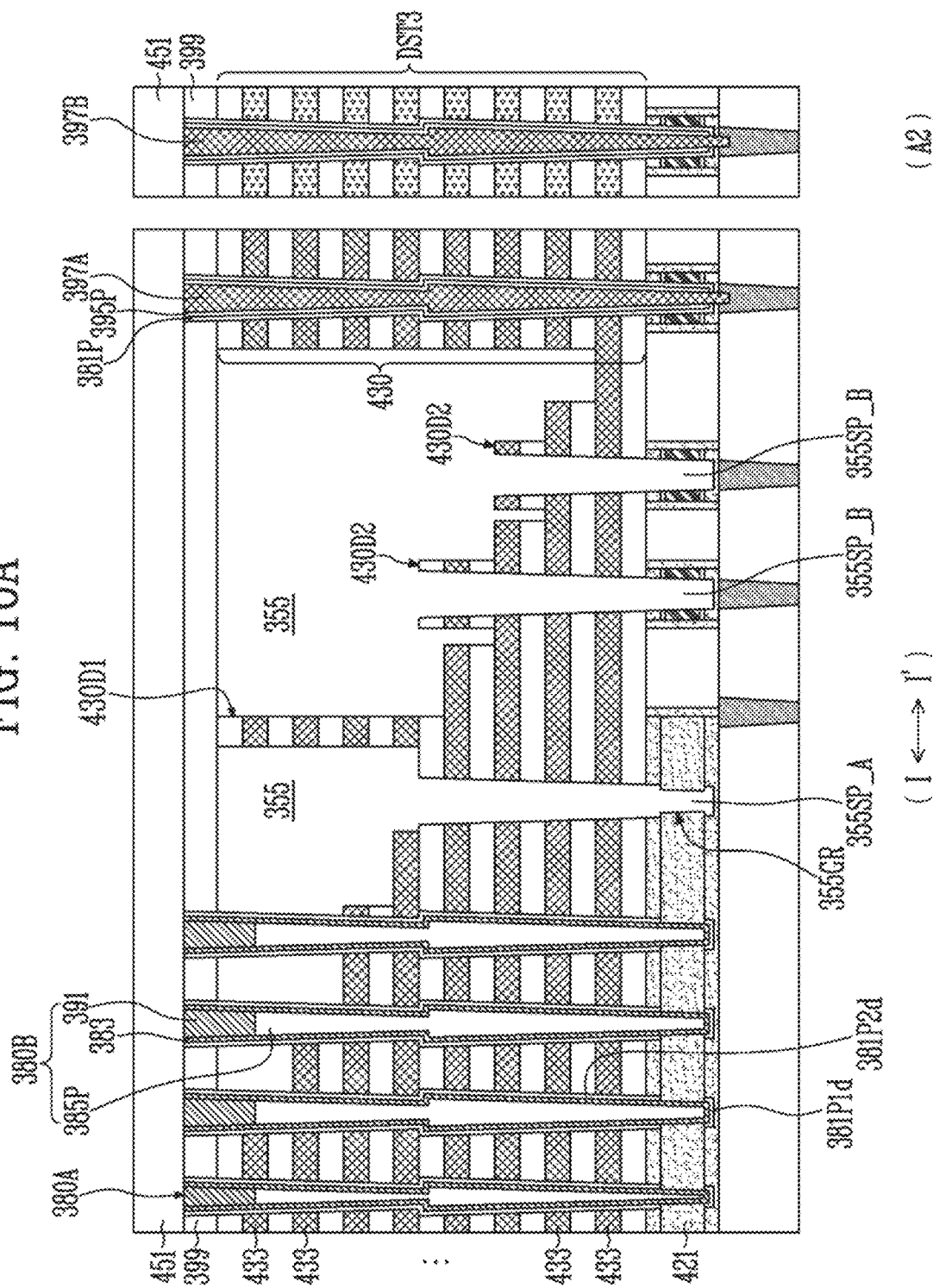
FIGS. 16A and 16B are cross-sectional views illustrating processes of forming a bit line contact plug, gate contact plugs, a first upper contact plug and a second upper contact plug.

The gate stacked structure 430 formed using the above-described processes with reference to FIGS. 14A to 14C may extend to surround the channel structure 380A, the first support pillars 355SP_A and 355SP_B, the second support pillar 380B, and the first contact plug 397A. As shown in FIG. 16A, the first contact plug 397A may be insulated from the conductive patterns 433 of the gate stacked structure 430 by the dummy memory layer 381P. Therefore, according to an embodiment, operating characteristics of the semiconductor memory device may be ensured without forming a barrier structure for blocking the formation of the conductive patterns 433 around the first contact plug 397A. Therefore, according to an embodiment of the present disclosure, increase in levels of difficulty and processing failure caused by manufacturing processes of the barrier structure may be prevented.

Through the processes described above with reference to FIGS. 14A to 14C, while the first and second sacrificial layers 343 and 363 are replaced by conductive pattern 433, the channel structure 380A, the first support pillars 355SP_A and 355SP_B, the second support pillar 380B, and the first contact plug 397A may serve as supports.

Through the processes described above with reference to FIGS. 14A to 14C, the first and second sacrificial layers 343 and 363 of the first and second dummy structures DST1 and DST2, as shown in FIG. 13I, adjacent to the slit 413 may be replaced by the conductive patterns 433. As a result, as shown in FIG. 16A, first and second dummy gate stacked structures 430D1 and 430D2 may be defined.

Hereinafter, subsequent processes performed after step ST13A may be described with reference to FIGS. 15A to 15D and 16A and 16B.

FIGS. 15A to 15D are cross-sectional views illustrating a process of forming a channel connecting pattern 421.

Referring to FIG. 15A, a sidewall insulating layer 415 may be formed on a sidewall of the slit 413 to protect the gate stacked structure 430.

Subsequently, the second semiconductor layer 329 may be etched so that the slit 413 may extend into the sacrificial layer 325 of the preliminary first semiconductor pattern 320A1. In this manner, the second semiconductor layer 329 of the preliminary first semiconductor pattern 320A1 may be penetrated by the slit 413 and the sacrificial layer 325 may be exposed through the bottom surface of the slit 413. The second and third semiconductor patterns 320B and 320C as shown in FIG. 13I and the fourth semiconductor pattern 320D which do not overlap with the slit 413 may remain without being etched.

Referring to FIG. 15B, the sacrificial layer 325 of the preliminary first semiconductor pattern 302A1 as shown in FIG. 15A may be removed to expose the memory layer 381 through the slit 413. The first semiconductor layer 321 and the second semiconductor layer 329 may be protected by the first protective layer 323 and the second protective layer 327.

Figure 15C:
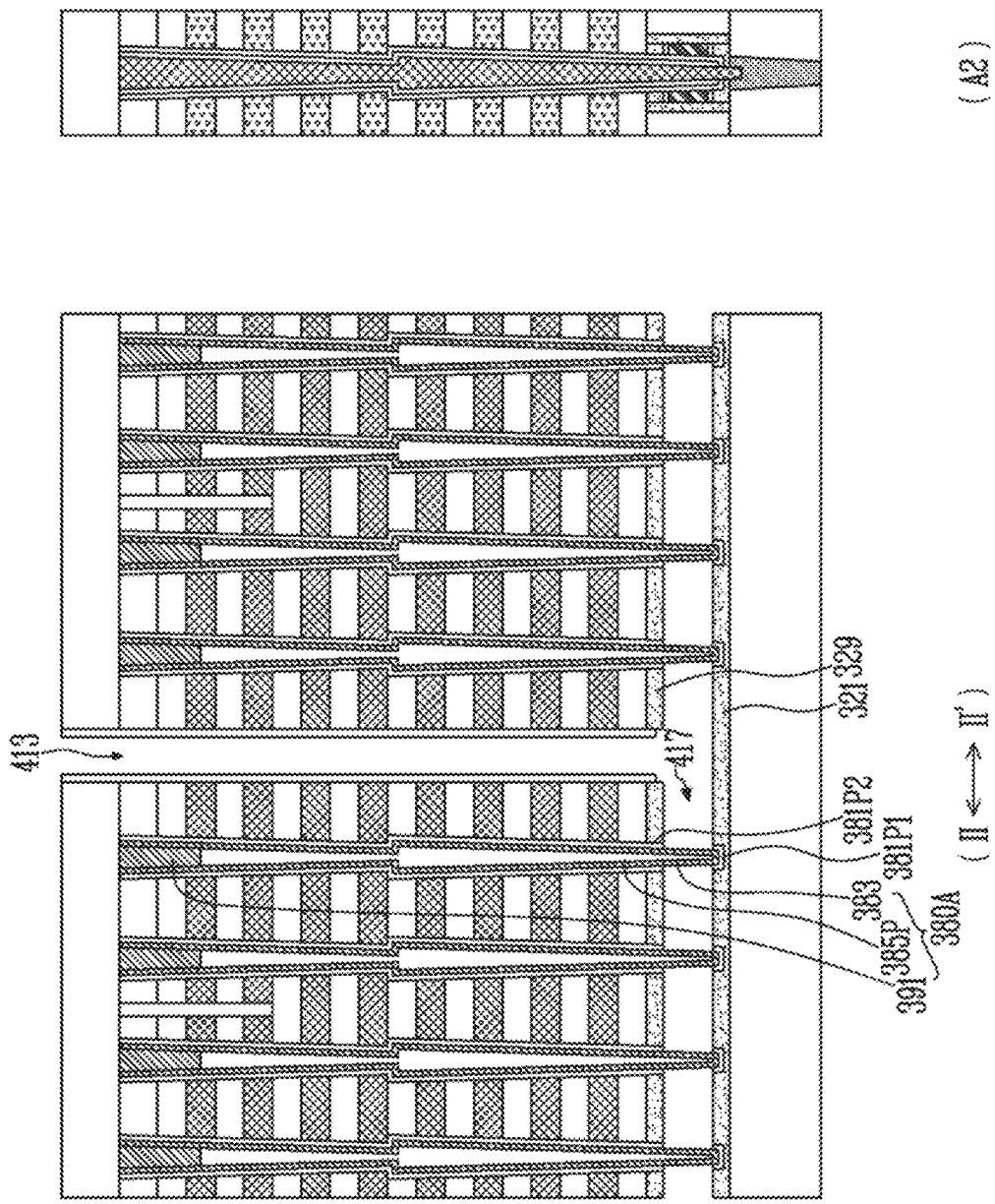

Referring to FIG. 15C, by removing the exposed area of the memory layer 381 as shown in FIG. 15B, the memory layer 381 may be separated into a first memory pattern 381P1 and a second memory pattern 381P2, and a sidewall of the channel structure 380A may be exposed. During an etch process of removing the memory layer 381, the first and second protective layers 323 and 327 of the preliminary first semiconductor pattern 320A1 a shown in FIG. 15B are removed, so that the first semiconductor layer 321 and the second semiconductor layer 329 of the preliminary first semiconductor pattern 320A1 may be exposed.

Hereinafter, space arranged between the first semiconductor layer 321 and the second semiconductor layer 329 and extended between the first memory pattern 381P1 and the second memory pattern 381P2 may be defined as a horizontal space 417. The horizontal space may be formed to expose the channel layer 383 of the channel structure 380A.

During an etch process of the horizontal space 417, the memory layer surrounding the second support pillar 380B may be separated into a first dummy pattern 381P1$d$ and a second dummy pattern 381P2$d$ as shown in FIG. 16A. During an etch process of forming the horizontal space 417, as shown in FIG. 16A, a groove 355GR may be formed in a sidewall of the first insulating pillar 355SP_A.

Figure 15D:
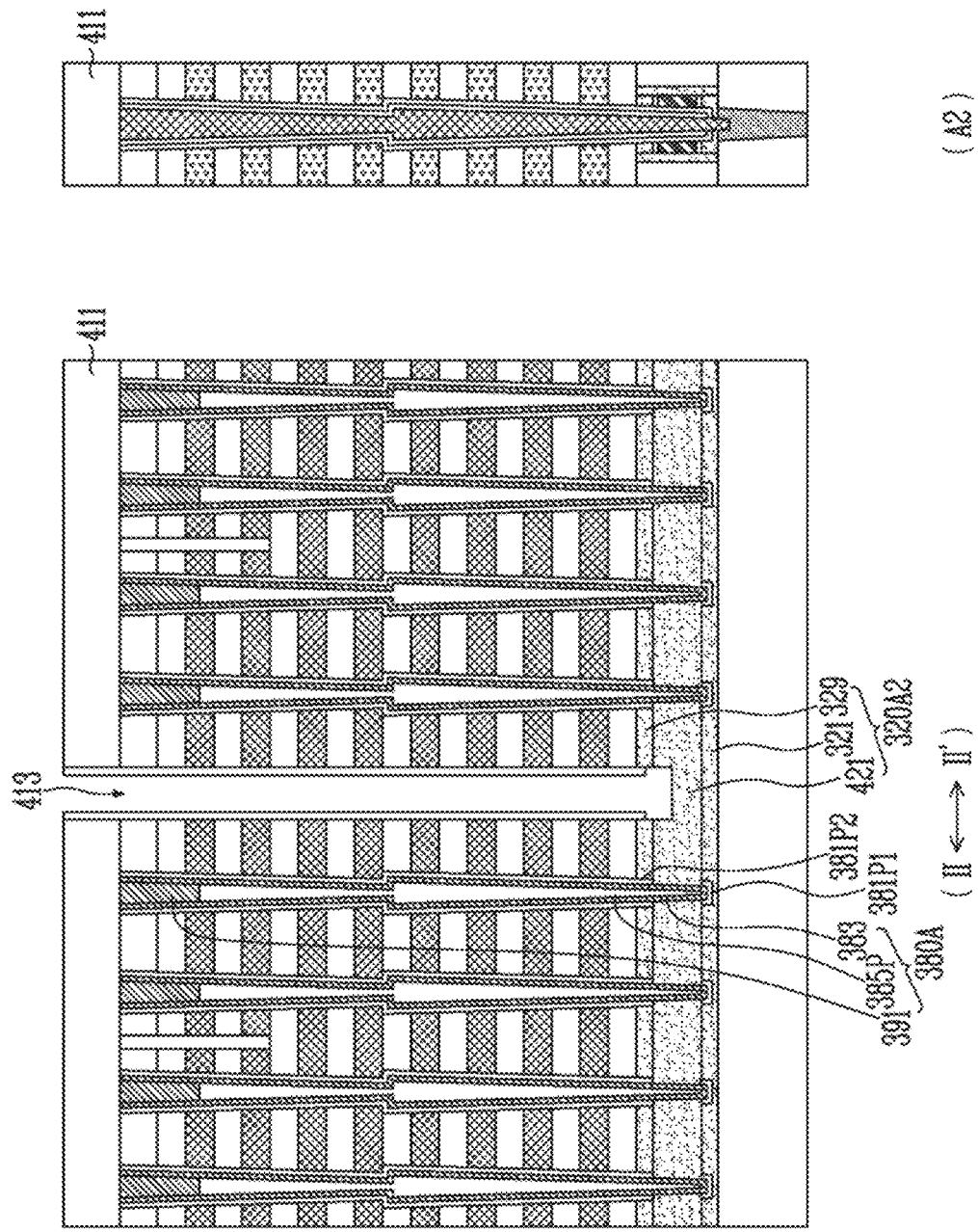

Referring to FIG. 15D, the horizontal space 417 as shown in FIG. 15C may be filled with the channel connecting pattern 421. The channel connecting pattern 421 may contact the first and second semiconductor layers 321 and 329 and the channel layer 383. The channel connecting pattern 421 may include n type impurities or p type impurities.

The channel connecting pattern 421 may be formed by selective growth, for example, selective epitaxial growth (SEG) using at least one of the first and second semiconductor layers 321 and 329 as a seed layer. In an embodiment, the channel connecting pattern 421 may be formed using a non-selective method such as chemical vapor deposition (CVD).

Through the processes described with reference to FIGS. 15A to 15D, a first semiconductor pattern 320A2 including the first semiconductor layer 321, the second semiconductor layer 329, and the channel connecting pattern 421 may be formed.

The channel connecting pattern 421 may extend between the first memory pattern 381P1 and the second memory pattern 381P2 and extend between the first dummy pattern 381P1$d$ and the second dummy pattern 381P2$d$ to contact the channel layer 383 of the second support pillar 380B as shown in FIG. 16A. As shown in FIG. 16A, the channel connecting pattern 421 may extend to fill the groove 355GR of the first insulating pillar 355SP_A.

Though not shown in FIG. 15D, after an insulating material or a conductive material filling the slit 413 is formed, a planarizing process may be performed. By the planarizing process, an upper surface of the second upper insulating layer structure 411 may be exposed.

Figure 16B:
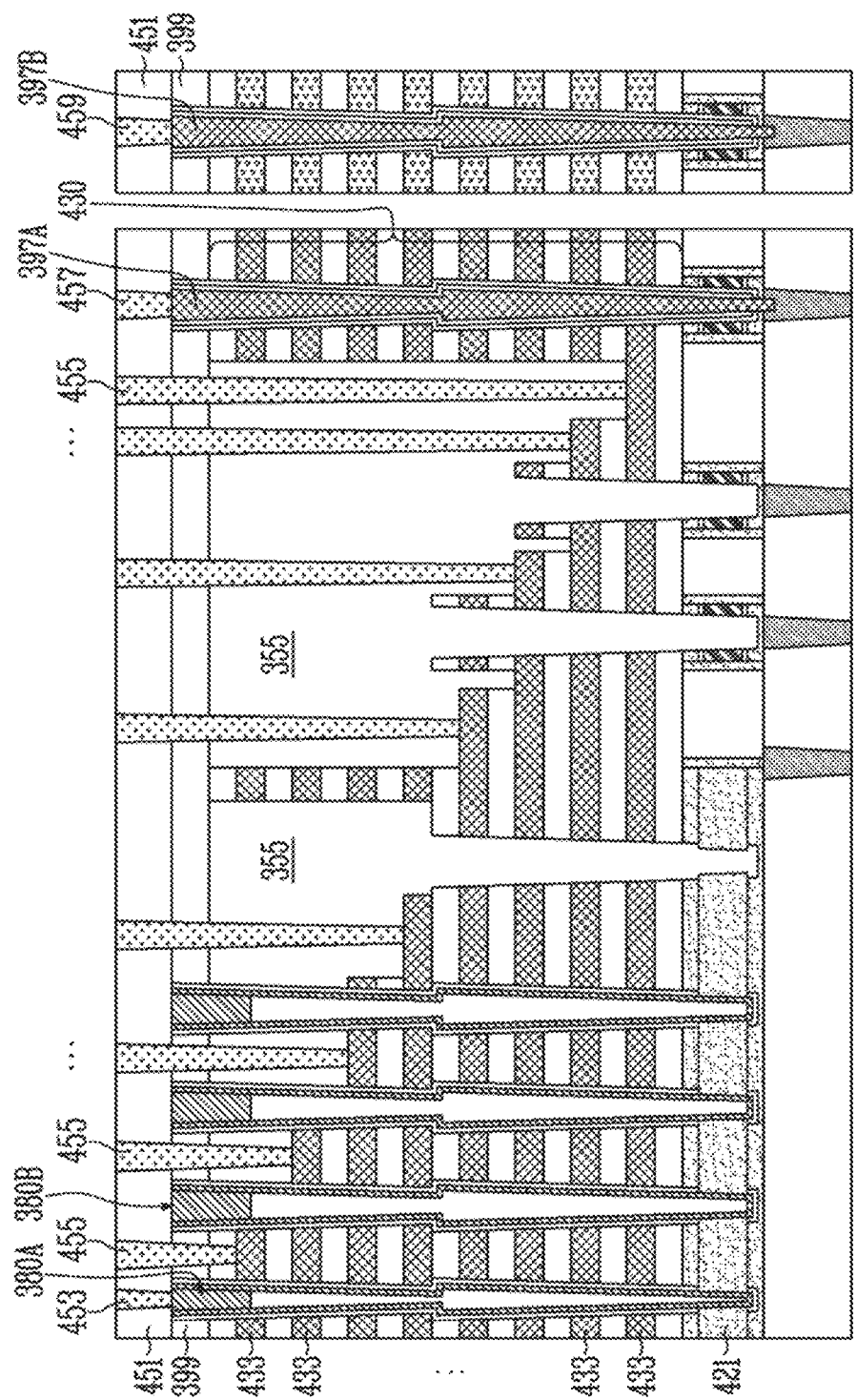

FIGS. 16A and 16B are cross-sectional views illustrating processes of forming a bit line contact plug 453, gate contact plugs 455, a first upper contact plug 457, and a second upper contact plug 459.

Referring to FIG. 16A, a third upper insulating layer 451 may be formed on the first upper insulating layer 399. The third upper insulating layer 451 may extend to cover the channel structure 380A, the second support pillar 380B, the first contact plug 397A and the second contact plug 397B.

Referring to FIG. 16B, the bit line contact plug 453, the gate contact plugs 455, the first upper contact plug 457, and the second upper contact plug 459 passing at least one of the third upper insulating layer 451, the first upper insulating layer 399, and the insulating layer 355 may be formed.

The bit line contact plug 453 may pass through the third upper insulating layer 451 so as to contact the channel structure 380A. The gate contact plugs 455 may pass through the first upper insulating layer 399 and the insulating layer 355 overlapping with the stepped structure to contact the conductive patterns 433 of the gate stacked structure 430, respectively. The second upper contact plug 457 may pass through the third upper insulating layer 451 to contact the first contact plug 397A. Second upper insulating layer 459 may pass through the third upper insulating layer 451 to contact the second contact plug 397B.

Hereinafter, processes of forming the bit line BL as shown in FIG. 1 may be performed. The bit line BL may be coupled to the bit line contact plug 453.

Figure 17B:
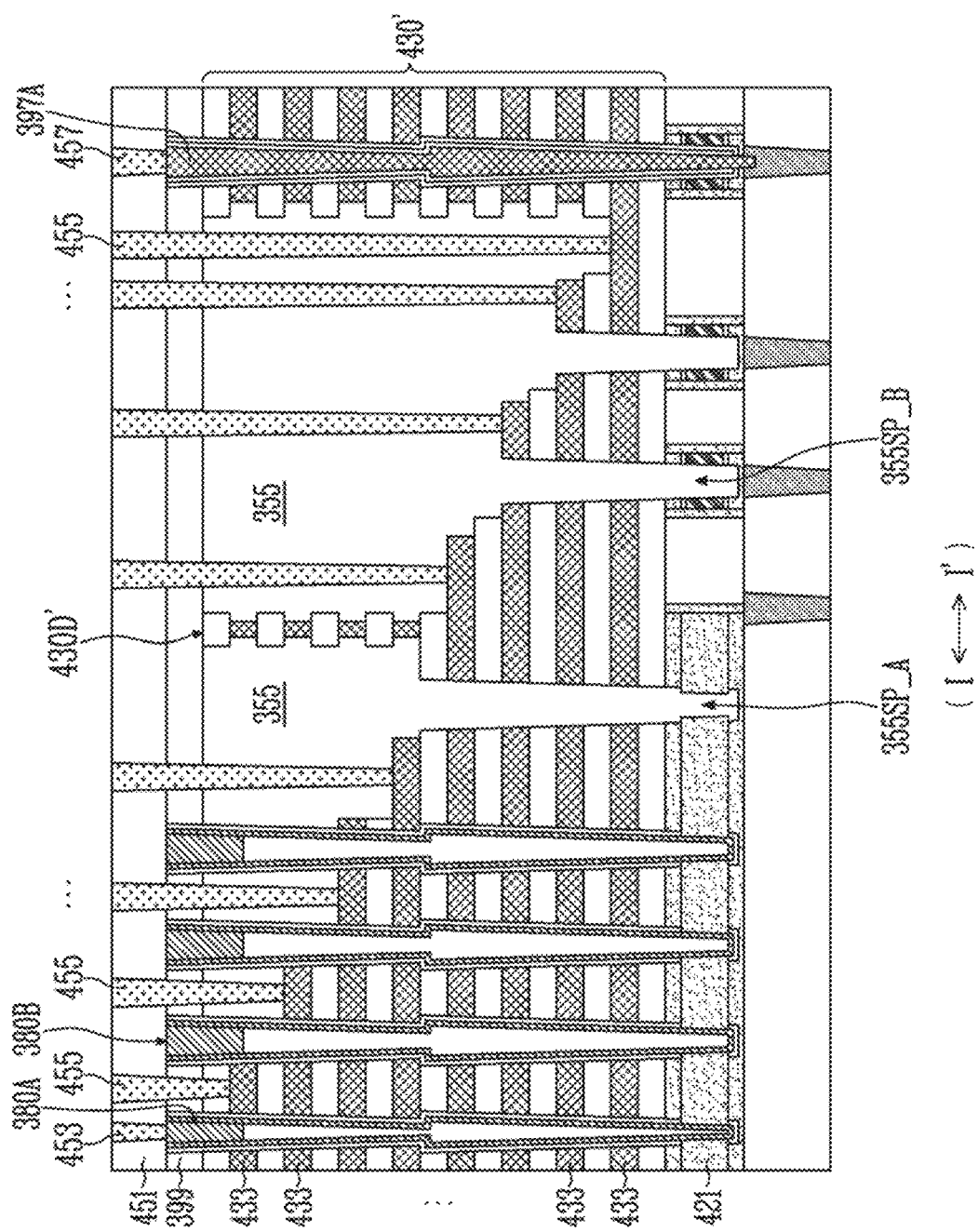
FIG. 17B is a cross-sectional view illustrating a semiconductor memory device manufactured by subsequent processes performed after the cleaning process.

FIG. 17A is a cross-sectional view illustrating a cleaning process performed after step ST7A as shown in FIG. 7 and FIG. 17B is a cross-sectional view illustrating a semiconductor memory device manufactured by subsequent processes performed after the cleaning process.

Referring to FIG. 17A, a cleaning process may be formed after step ST1A described with reference to FIGS. 8A and 8B, step ST3A described with reference to FIGS. 9A to 9C, step ST5A described with reference to FIG. 10, and step ST7A described with reference to FIGS. 11A and 11B are performed. By the cleaning process, a portion of each of the first sacrificial layers 343 of the first stacked body 340 and a portion of each of the second sacrificial layers 363 of the second stacked body 360 may be removed.

Hereinafter, as described above with reference to FIG. 12A, the third and fourth sacrificial pillars 353C and 353D as shown in FIG. 11B may be removed.

By the above-described cleaning process and the process of removing the third and fourth sacrificial pillars, the second dummy stacked body DST2 described with reference to FIG. 11B may be removed from a lower stepped structure LSW' of the first stacked body 340. In addition, unevenness may be formed on a sidewall of a first dummy stacked body DST1' remaining on the first stacked body 340. In addition, unevenness may be formed on the sidewall of each of the first stacked body 340 and the second stacked body 360 overlapping with the third semiconductor pattern 320C. The first interlayer insulating layers 341 forming steps of the lower stepped structure LSW' may remain longer than the first sacrificial layers arranged on the first interlayer insulating layers 341 toward the side. The second interlayer insulating layers 361 forming the steps of the first upper stepped structure USW1' may remain longer than the second sacrificial layers 363 arranged on the second interlayer insulating layers 361 toward the side.

Referring to FIG. 17B, through the processes described with reference to FIG. 12B, the insulating layer 355 extending to cover the first upper stepped structure USW1' and the lower stepped structure LSW' may be formed. In the same manner as described with reference to FIG. 12B, portions of the insulating layer 355 may be defined as the first support pillars 355SP_A and 355S_B.

Subsequently, step ST11A described with reference to FIGS. 13A to 13I, step ST13A described with reference to FIGS. 14A to 14C, and forming the channel connecting pattern 421 described with reference to FIGS. 15A to 15D may be sequentially performed. Therefore, a gate stacked structure 430' including the first upper stepped structure USW1' and the lower stepped structure LSW' as shown in FIG. 17A and having an uneven sidewall may be formed. In addition, a dummy gate stacked structure 430D' having the unevenness as shown in FIG. 17A may be formed.

The gate stacked structure 430' may include the conductive patterns 433 surrounding the channel structure 380A, the first support pillars 355SP_A and 355SP_B, the second support pillar 380B, and the first contact plug 397A through step ST11A described with reference to FIGS. 13A to 13I and step ST13A described with reference to FIGS. 14A to 14C.

Subsequently, through the processes described above with reference to FIGS. 16A and 16B, a bit line contact plug 453, the gate contact plug 455, the gate contact plugs 455, and the first upper contact plug 457 may be formed.

Figure 18:
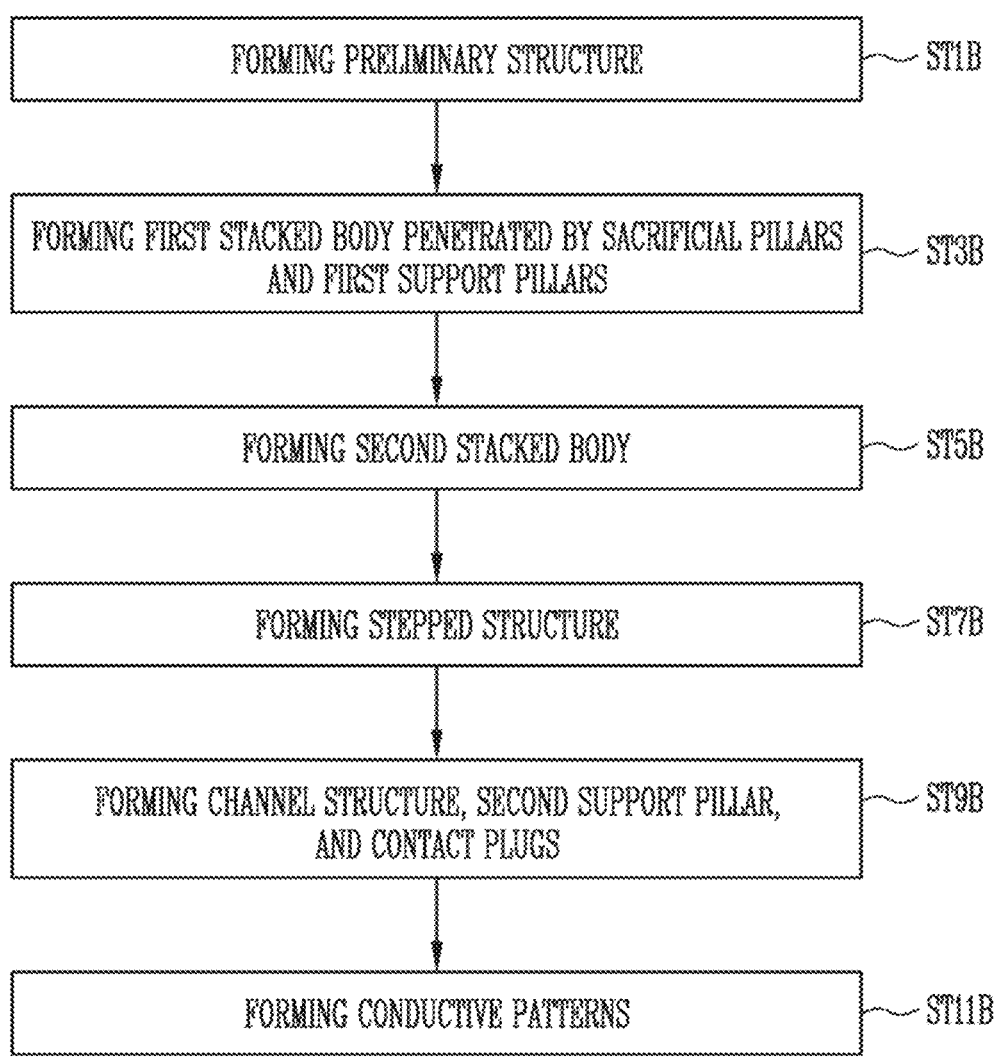
FIG. 18 is a schematic flowchart illustrating a method of manufacturing a semiconductor memory device according to an embodiment of the present disclosure.

FIG. 18 is a schematic flowchart illustrating a method of manufacturing a semiconductor memory device according to an embodiment of the present disclosure.

Referring to FIG. 18, a method of manufacturing a semiconductor memory device may include step ST1B of forming a preliminary structure, step ST3B of forming a first stacked body penetrated by sacrificial pillars and first support pillars, step ST5B of forming a second stacked body, step ST7B of forming a stepped structure, step ST9B of forming a channel structure, a second support pillar, and contact plugs, and step ST11B of forming conductive patterns.

Step ST1B may be performed after the substrate 201 including the lower structure LS as described above with reference to FIG. 6 is formed. In other words, the preliminary structure may be formed on the substrate 201 including the lower structure LS as described above with reference to FIG. 6.

FIGS. 19A to 19E are cross-sectional views of structures corresponding to processes according to a manufacturing method of FIG. 18. FIGS. 19A to 19E are cross-sectional diagrams illustrating structures corresponding to manufacturing processes that are formed on the first area A1 of the substrate described above with reference to FIG. 1. The cross-sectional views illustrating the structures formed on the first area A1 according to manufacturing processes are taken along line I-I' of FIG. 2.

Figure 19A:
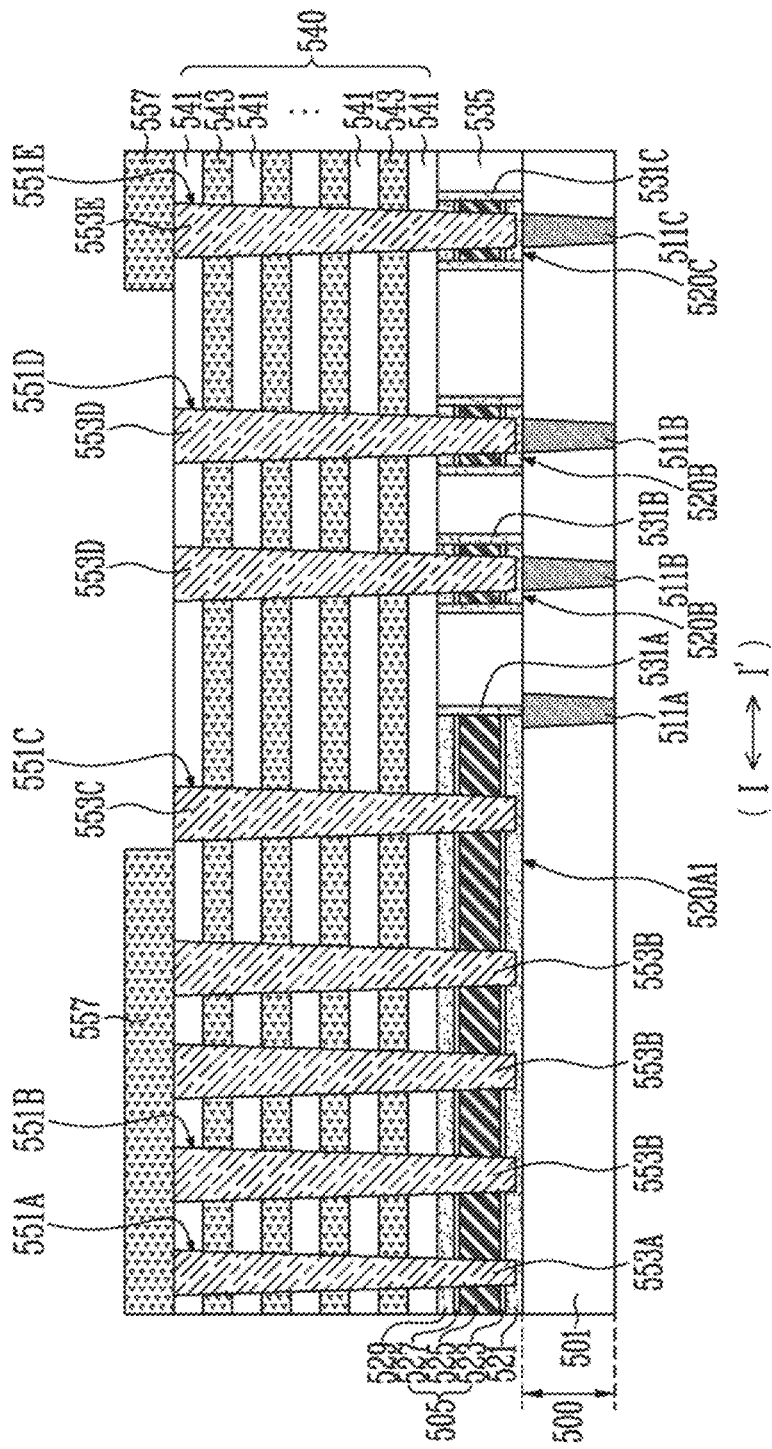

Referring to FIG. 19A, step ST1B may include forming semiconductor patterns 520A1 to 520C and forming vertical doped semiconductor patterns 531A to 531C. The semiconductor patterns 520A1 to 520C and the vertical doped semiconductor patterns 531A to 531C may be formed on a substrate including a lower structure 500.

The lower structure 500 may include a lower insulating layer 501 penetrated by first to third lower contact plugs 511A to 511C. The first to third lower contact plugs 511A to 511C may correspond to the first to third lower contact plugs 11A to 11C, respectively, as described above with reference to FIG. 6, respectively. Although the lower structure 500 shows a portion of the lower structure LS as described with reference to FIG. 6, the semiconductor patterns 520A1 to 520C may be formed on the substrate 201 including the lower structure LS as shown in FIG. 6.

Each of the semiconductor patterns 520A1 to 520C may include a first semiconductor layer 521, a sacrificial stacked body 505, and a second semiconductor layer 529 that are stacked sequentially on each other. The semiconductor patterns 520A1 to 520C may include a preliminary first semiconductor pattern 520A1 overlapping with the first lower contact plug 511A, second semiconductor patterns 520B overlapping with the second lower contact plugs 511B, and a third semiconductor pattern 520C overlapping with the third lower contact plug 511C.

The first semiconductor layer 521, a first protective layer 523, a sacrificial layer 525, and a second protective layer 527 of the sacrificial stacked body 505, and the second semiconductor layer 529 may include the same materials as the first semiconductor layer 321, the first protective layer 323, the sacrificial layer 325, and the second protective layer 327 of the sacrificial stacked body 305, and the second semiconductor layer 329, respectively, as described above with FIG. 8A.

In the same manner as described with reference to FIG. 8B, step ST1B may include forming vertical doped semiconductor patterns 531A to 531C, and filling space between the semiconductor patterns 520A1 to 520C with a gap-filling insulating layer 535.

Subsequently, step ST3B may be performed using the same processes and materials as described above with reference to FIGS. 9A to 9C. At step ST3B, a first stacked body 540 including first interlayer insulating layers 541 and first sacrificial layers 543 stacked alternately with each other may be formed, and first to fifth lower holes 551A to 551E passing through the first stacked body 540 may be filled with first to fifth sacrificial pillars 553A to 553E, respectively.

The first lower hole 551A, the first sacrificial pillar 553A filling the first lower hole 551A, the second lower hole 551B, the second sacrificial pillar 553B filling the second lower hole 551B, the third lower hole 551C, and the third sacrificial pillar 553C filling the third lower hole 551C may overlap with the preliminary first semiconductor pattern 520A1. The arrangement of the first to third lower holes 551A to 551C may be the same as the arrangement of the first to third lower holes 351A to 351C as described with FIG. 9B. The first lower hole 551A, the first sacrificial pillar 553A filling the first lower hole 551A, the second lower hole 551B, the second sacrificial pillar 553B filling the second lower hole 551B, the third lower hole 551C, and the third sacrificial pillar 553C filling the third lower hole 551C may pass through the first stacked body 540, the second semiconductor layer 529, and the sacrificial stacked body 505 and may extend into the first semiconductor layer 521.

Each of the fourth lower holes 551D and the fourth sacrificial pillars 553D filling the fourth lower holes 551D may overlap with the corresponding second semiconductor pattern 520B, may pass through the first stacked body 540, the second semiconductor layer 529, and the sacrificial stacked body 505, and may extend into the first semiconductor layer 521. Each of the fifth lower holes 551E and the fifth sacrificial pillars 553E filling the fifth lower holes 551E may overlap with the corresponding third semiconductor pattern 520C, may pass through the first stacked body 540, the second semiconductor layer 529, and the sacrificial stacked body 505, and may extend into the first semiconductor layer 521.

Step ST3B may include forming a mask pattern 557 including an opening through which the third sacrificial pillar 553C and the fourth sacrificial pillars 553D on the first stacked body 540 are opened. The mask pattern 557 may cover the first sacrificial pillar 553A, the second sacrificial pillar 553B, and the fifth sacrificial pillar 553E.

Figure 19B:
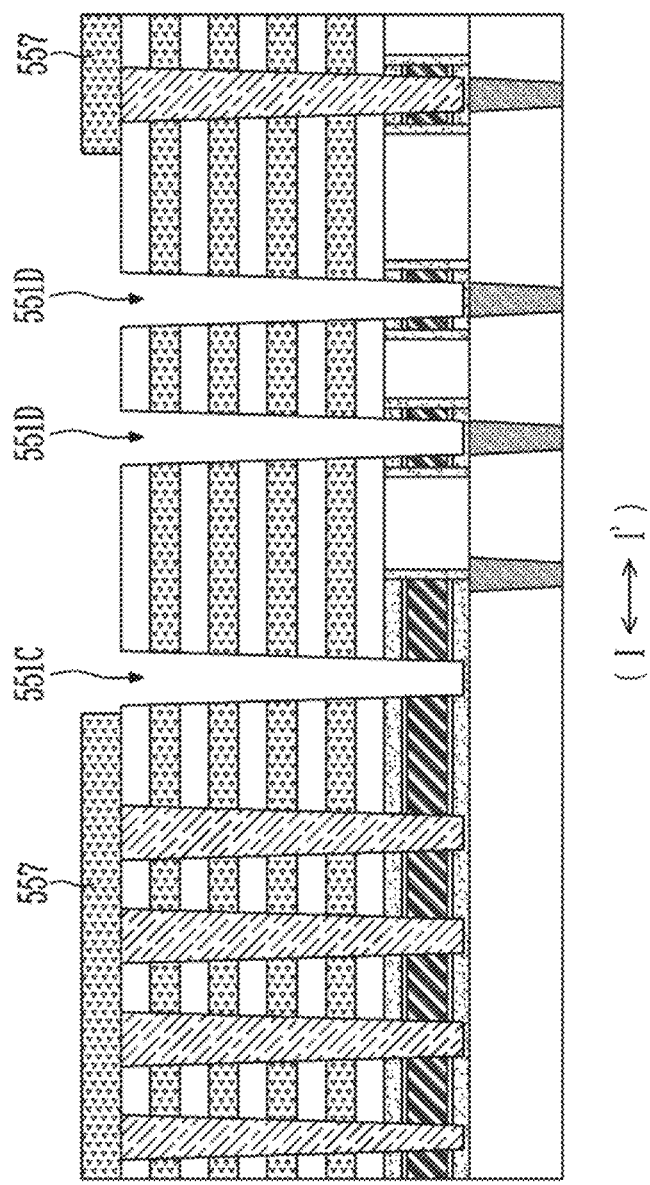

Referring to FIG. 19B, step ST3B may include opening the third lower hole 551C and the fourth lower holes 551D by removing the third sacrificial pillars 553C and the fourth sacrificial pillars 553D as shown in FIG. 19A by an etch process using the mask pattern 557 as an etch barrier.

Referring to FIG. 19C, step ST3B may include removing the mask pattern 557 as shown in FIG. 19B and forming first support pillars 559A and 559B in the third lower hole 551C and the fourth lower holes 551D, respectively. Each of the first support pillars 559A and 559B may include an insulating material. The first support pillars 559A and 559B may include a first insulating pillar 559A and second insulating pillars 559B. The first insulating pillar 559A may fill the third lower hole 551C and the second insulating pillars 559B may fill the fourth lower holes 551D, respectively. The first insulating pillar 559A may overlap with the preliminary first semiconductor pattern 520A1, and the second insulating pillars 559B may overlap with the second semiconductor patterns 520B, respectively.

Figure 19D:
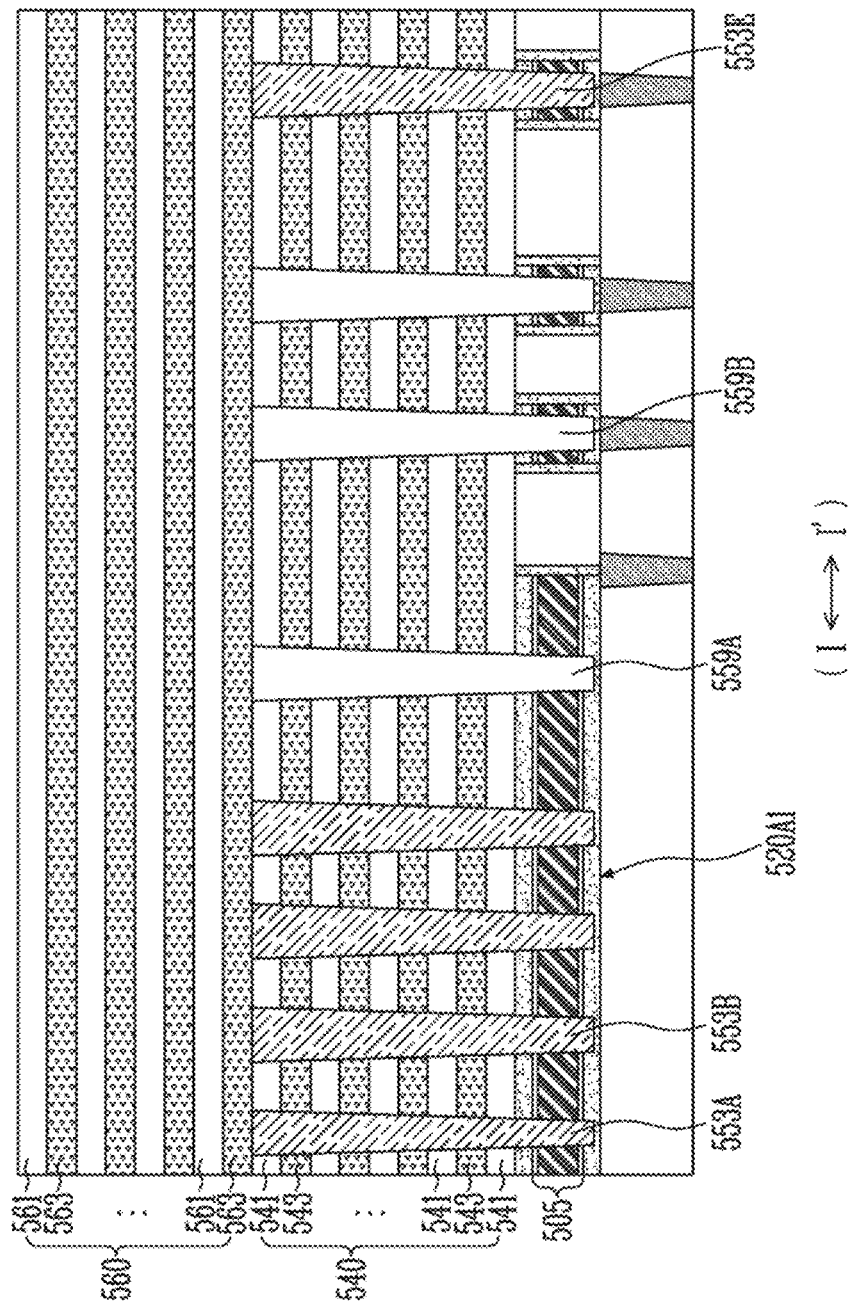

Referring to FIG. 19D, step ST5B may include forming a second stacked body 560 on the first stacked body 540 penetrated by the first and second sacrificial pillars 553A and 553B, the first support pillars 559A and 559B, and the fifth sacrificial pillar 553E.

The second stacked body 560 may include second sacrificial layers 563 and second interlayer insulating layers 561 that extend to cover the first and second sacrificial pillars 553A and 553B, the first support pillars 559A and 559B, and the fifth sacrificial pillar 553E and are stacked alternately with each other. The second sacrificial layers 563 may include the same material as the first sacrificial layers 543 and the second interlayer insulating layers 561 may include the same material as the first interlayer insulating layers 541.

Subsequently, through step ST7B, an upper stepped structure may be formed on the second stacked body 560, and a lower stepped structure may be formed on the first stacked body 540. Step ST7B may be formed using the processes as described above with reference to FIGS. 11A and 11B, or the processes as described above with reference to FIG. 17A.

Figure 19E:
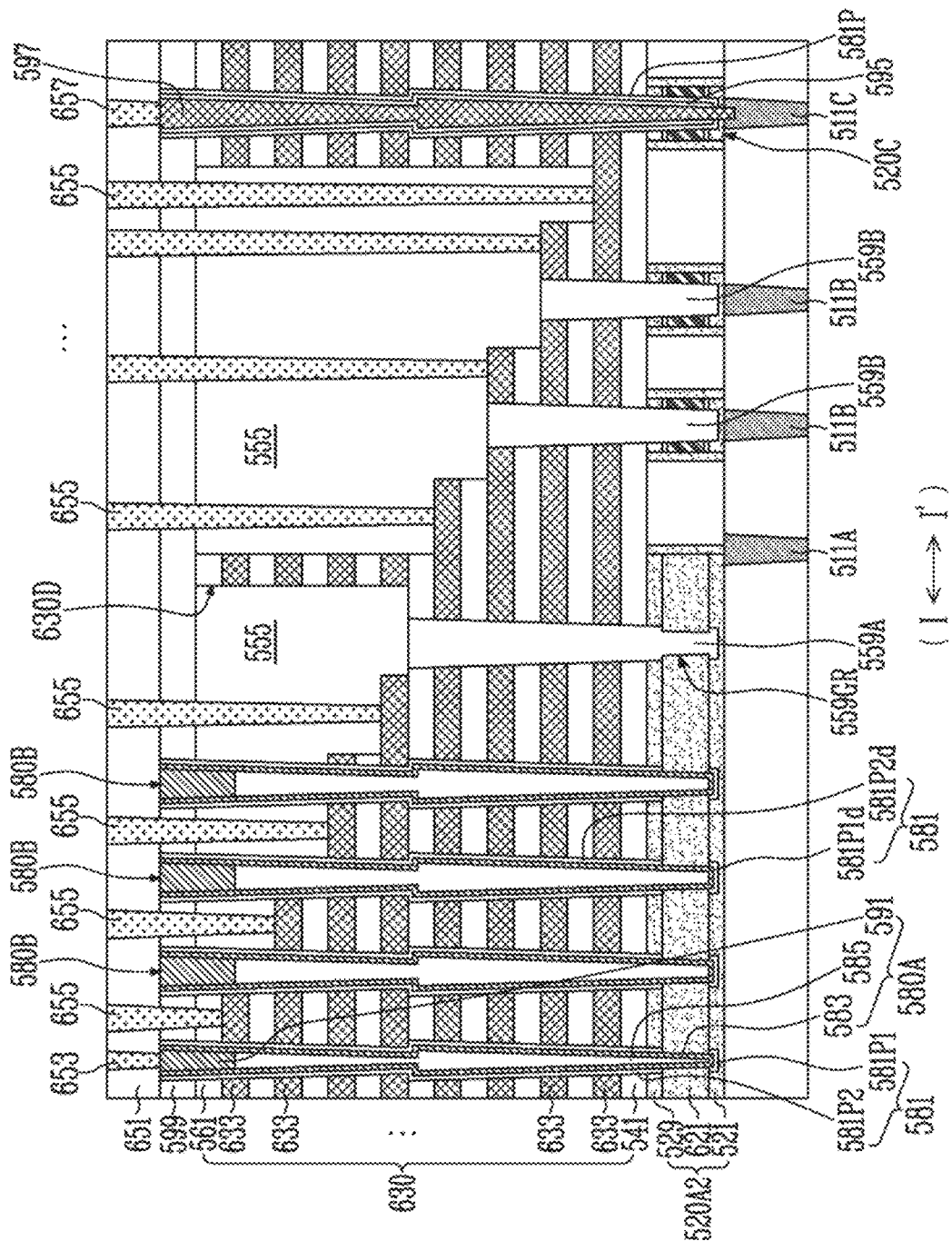

Referring to FIG. 19E, after step ST7B, an insulating layer 555 covering the stepped structure may be formed. The level difference caused by the stepped structure may be relieved by the insulating layer 555.

Subsequently, through step ST9B, a channel structure 580A, a second support pillar 580B, and a contact plug 597 may be formed. Step ST9B may be performed in the same manner as step ST11A described above with reference to FIGS. 13A to 13I.

The channel structure 580A and the second support pillar 580B formed at step ST9B may be formed in holes that pass through the first stacked body 540 and the second stacked body 560 as shown in FIG. 19D and overlap with the preliminary first semiconductor pattern 520A1. At step ST9B, each of the channel structure 580A and the second support pillar 580B may be formed on a memory layer 581 formed on the surface of the corresponding hole. Each of the channel structure 580A and the second support pillar 580B may include a channel layer 583, a core insulating pattern 585, and a capping pattern 591 as described above with reference to FIGS. 3A and 3B.

The contact plug 597 formed at step ST9B may be formed in a hole that passes through the first stacked body 540 and the second stacked body 560 as shown in FIG. 19D and overlaps with the third semiconductor pattern 520C. The contact plug 597 may pass through a dummy memory layer 581P and an oxide layer 595 formed on the surface of the corresponding hole, and through the third semiconductor pattern 520C so as to contact the third lower contact plug 511C.

Subsequently, as shown in FIG. 14A, a first upper insulating layer 599 surrounding the channel structure 580A, the second support pillar 580B, and the contact plug 597 may be formed.

Subsequently, at step ST11B, the first sacrificial layers 543 and the second sacrificial layers 563 as shown in FIG. 19D may be replaced by conductive patterns 633, so that a gate stacked structure 630 surrounding the channel structure 580A, the first support pillars 559A and 559B, the second support pillar 580B, and the contact plug 597 may be formed. While the conductive patterns 633 are formed, a dummy gate stacked structure 630D may be formed on a stepped structure of the gate stacked structure 630. Step ST11B may be performed in the same manner as step ST13A as described with reference to FIGS. 14A to 14C.

Subsequently, using the processes as described above with reference to FIGS. 15A to 15D, the sacrificial stacked body 505 of the preliminary first semiconductor pattern 520A1 as shown in FIG. 19D may be replaced by a channel connecting pattern 621. As a result, a first semiconductor pattern 520A2 coupled to the channel structure 580A may be defined.

By the channel connecting pattern 621, the memory layer 581 surrounding the channel structure 580A may be separated into a first memory pattern 585P1 and a second memory pattern 581P2. By the channel connecting pattern 621, the memory layer 581 surrounding the second support pillar 580B may be separated into a first dummy pattern 581P1*d* and a second dummy pattern 581P2. While the channel connecting pattern 621 is formed, a groove 559GR may be formed on a sidewall of the first insulating pillar 559A, and the channel connecting pattern 621 may extend to fill the groove 559GR.

Subsequently, through the processes described above with reference to FIGS. 16A and 16B, an upper insulating layer 651, a bit line contact plug 653, gate contact plugs 655, and an upper contact plug 657 may be formed.

Figure 20A:
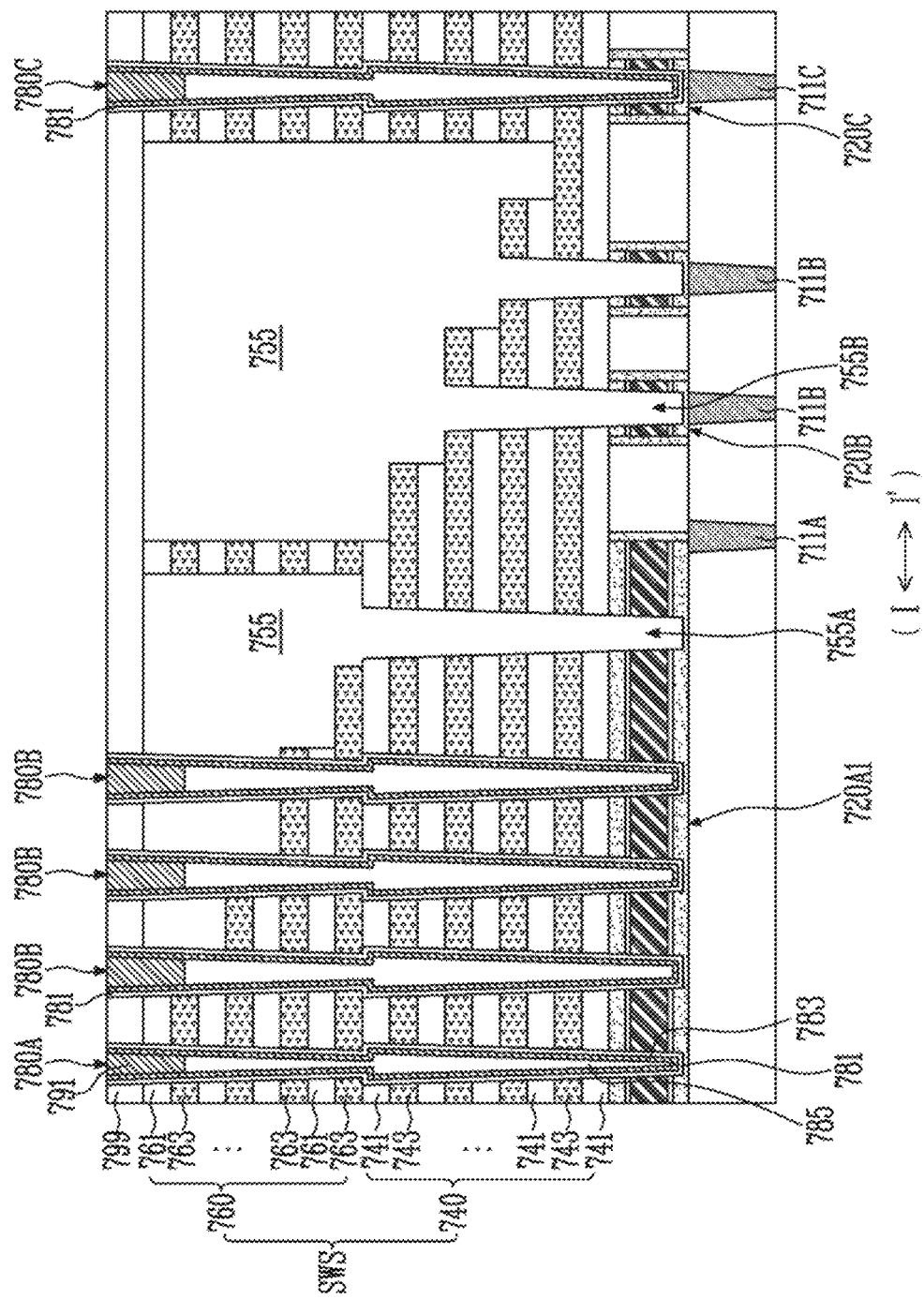
FIGS. 20A, 20B, and 20C are cross-sectional views illustrating a method of manufacturing a semiconductor memory device according to an embodiment of the present disclosure.
Figure 20B:
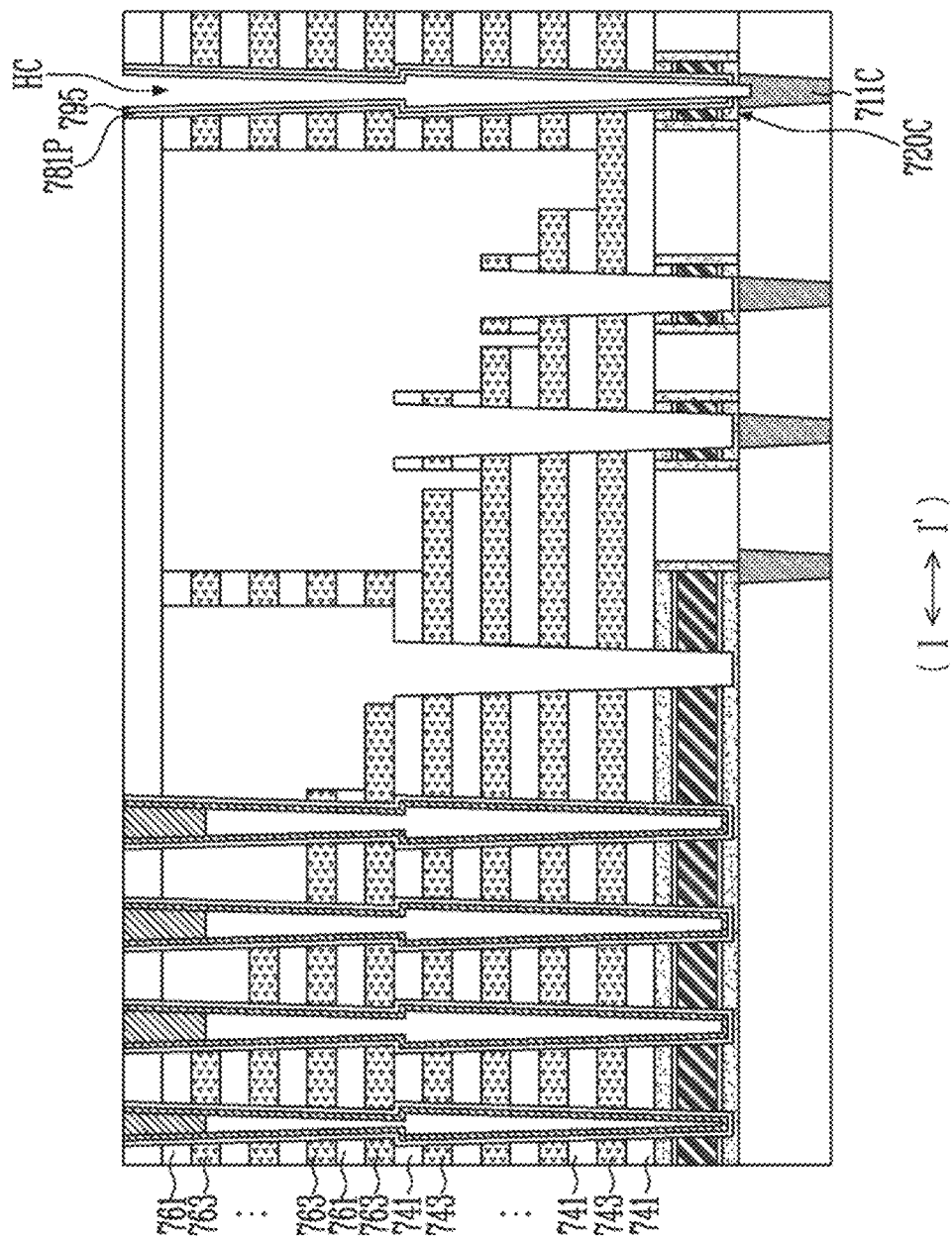
Figure 20C:
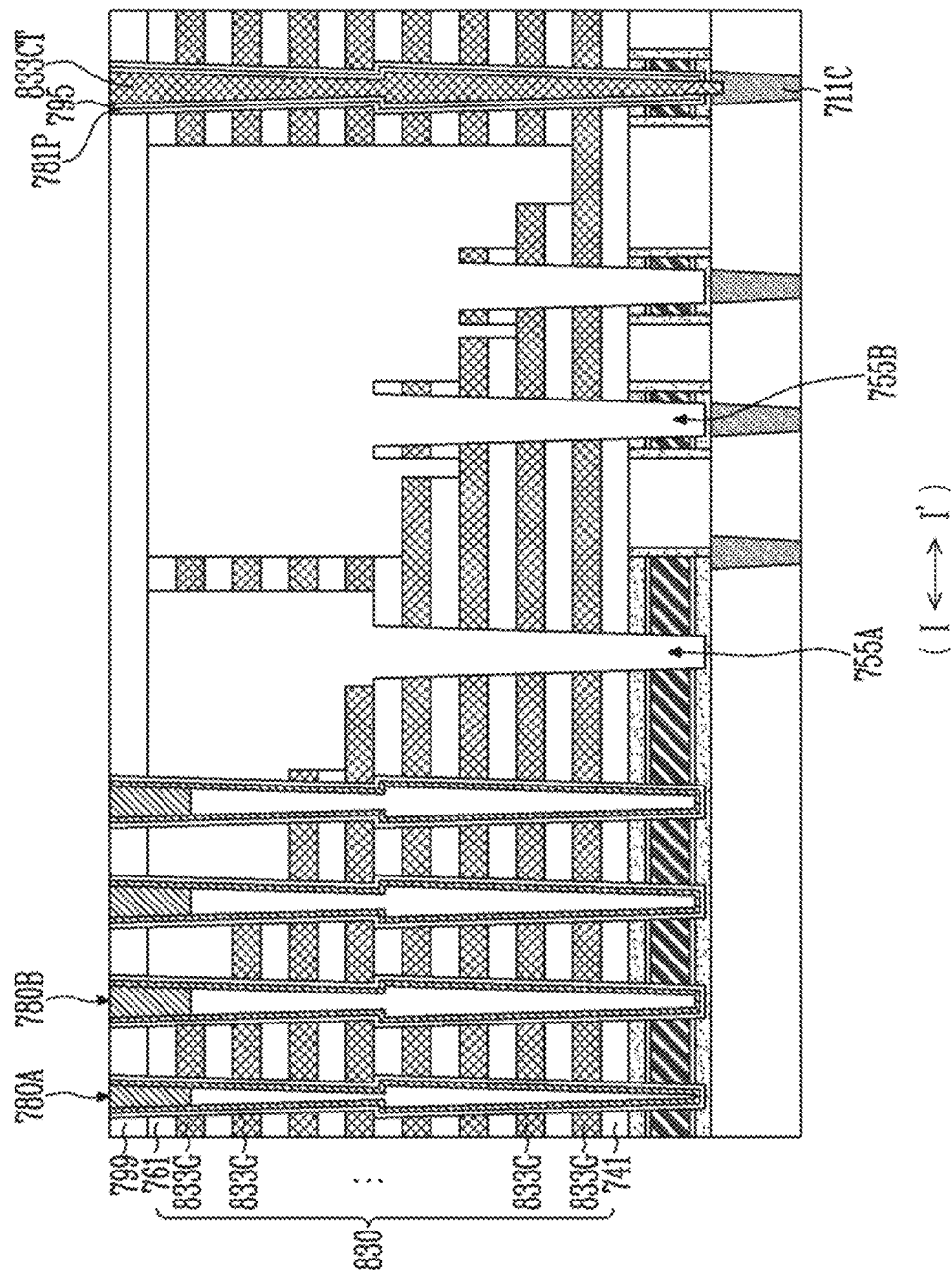

FIGS. 20A to 20C are cross-sectional views illustrating a method of manufacturing a semiconductor memory device according to an embodiment of the present disclosure. FIGS. 20A to 20C are cross-sectional diagrams illustrating structures corresponding to manufacturing processes that are formed on the first area A1 of the substrate described above with reference to FIG. 1. The cross-sectional views illustrating the structures formed on the first area A1 according to manufacturing processes are taken along line I-I' of FIG. 2. Hereinafter, a detailed description of overlapping configurations will be omitted.

Referring to FIG. 20A, semiconductor patterns 720A1 to 720C overlapping first to third lower contact plugs 711A to 711C may be formed using the processes as described above with reference to FIGS. 8A and 8B. The semiconductor patterns 720A1 to 720C may include a preliminary first semiconductor pattern 720A1 coupled to the first lower contact plug 711A, second semiconductor patterns 720B coupled to the second lower contact plugs 711B, respectively, and a third semiconductor pattern 720C coupled to the third lower contact plug 711C.

Subsequently, a stepped stacked body SWS surrounding a channel structure 780A, first support pillars 755A and 755B, a second support pillar 780B, and a preliminary plug 780 may be formed.

The stepped stacked body SWS may include a first stacked body 740 and a second stacked body 760. The first stacked body 740 may extend to overlap the semiconductor patterns 720A1 to 720C and have a lower stepped structure. The first stacked body 740 may include first interlayer insulating layers 741 and first sacrificial layers 743 stacked alternately with each other. The second stacked body 760 may include second sacrificial layers 763 and second interlayer insulating layers 761 stacked alternately with each other on the first stacked body 740. The second stacked body 760 may extend to overlap the preliminary first semiconductor pattern 720A1 and have an upper stepped structure.

The channel structure 780A, the second support pillar 780B, and a preliminary plug 780C may be formed in holes passing through the first stacked body 740 and the second stacked body 760. The channel structure 780A and the second support pillar 780B may overlap with the preliminary first semiconductor pattern 720A1 and extend into the preliminary first semiconductor pattern 720A1. The preliminary plug 780C may overlap with the third semiconductor pattern 720C and extend into the third lower semiconductor pattern 720C. Each of the channel structure 780A, the second support pillar 780B, and the preliminary plug 780C may be arranged on a memory layer 781 formed on the surface of the corresponding hole. Each of the channel structure 780A, the second support pillar 780B and the preliminary plug 780C may include a channel layer 783, a core insulating pattern 785, and a capping pattern 791. The channel layer 783, the core insulating pattern 785, and the capping pattern 791 may include the same materials as the channel layer 83, the core insulating pattern 85, and the capping pattern 91, respectively, as described above with reference to FIGS. 3A and 3B.

The first support pillars 755A and 755B may extend from the insulating layer 755 covering the upper stepped structure and the lower stepped structure of the stepped stacked structure SWS, or may be formed separately from the insulating layer 755. The first support pillars 755A and 755B may pass through the first stacked body 740. The first support pillars 755A and 755B may include a first insulating pillar 755A and second insulating pillars 755B. The first insulating pillar 755A may overlap with the preliminary first semiconductor pattern 720A1 and extend into the preliminary first semiconductor pattern 720A1. The second insulating pillars 755B may overlap with the second semiconductor patterns 720B, respectively, and extend into the second semiconductor patterns 720B.

The stepped stacked body SWS surrounding the channel structure 780A, the first support pillars 755A and 755B, the second support pillar 780B, and the preliminary plug 780C may be formed by plagiarizing a doped semiconductor layer 291L to expose the mask pattern 371 as shown in FIG. 13E after performing the above-described processes with reference to FIGS. 9A to 9C, 10, 11A and 11B, 12A and 12B, and 13A to 13E. Subsequently, the mask pattern 371 may be replaced by a first upper insulating layer 799. As a result, upper ends of the channel structure 780A, the second support pillar 780B and the preliminary plug 780C may be surrounded by the first upper insulating layer 799.

Referring to FIG. 20B, a contact hole HC through which the third lower contact plug 711C is exposed may be formed. The process of forming the contact hole HC may include removing the preliminary plug 780C to expose the memory layer 781 as shown in FIG. 20A, depositing an oxide layer 795 on the memory layer 781, and forming an opening passing through the oxide layer 795 and the memory layer 781 to expose the third lower contact plug 711C. Hereinafter, the memory layer remaining around the contact hole HC is referred to as a dummy memory layer 781P.

Referring to FIG. 20C, the contact hole HC as shown in FIG. 20B may be filled with a contact plug 833CT at the same time as the first and second sacrificial layers 743 and 763 as shown in FIG. 20B may be replaced by conductive patterns 833G.

The first sacrificial layers 743 and the second sacrificial layers 763 may be replaced by the conductive patterns 833G, so that a gate stacked body 830 surrounding the channel structure 780A, the first support pillars 755A and 755B, the second support pillar 780B, and the contact plug 833CT may be formed. Processes of replacing the first sacrificial layers 743 and the second sacrificial layers 763 with the conductive patterns 833G may be performed in the same manner as step ST13A as described above with reference to FIGS. 14A to 14C.

The contact plug 833CT may be formed at the same time as the conductive patterns 833G by filling the contact hole HC as shown in FIG. 20B with the conductive material provided when the conductive patterns 833G are formed. According to this embodiment, the contact plug 833CT and the conductive patterns 833G may include the same conductive material.

Subsequent processes including the processes as described with reference to FIGS. 15A to 15D and the processes as described with reference to FIGS. 16A and 16B may then be performed.

Figure 21:
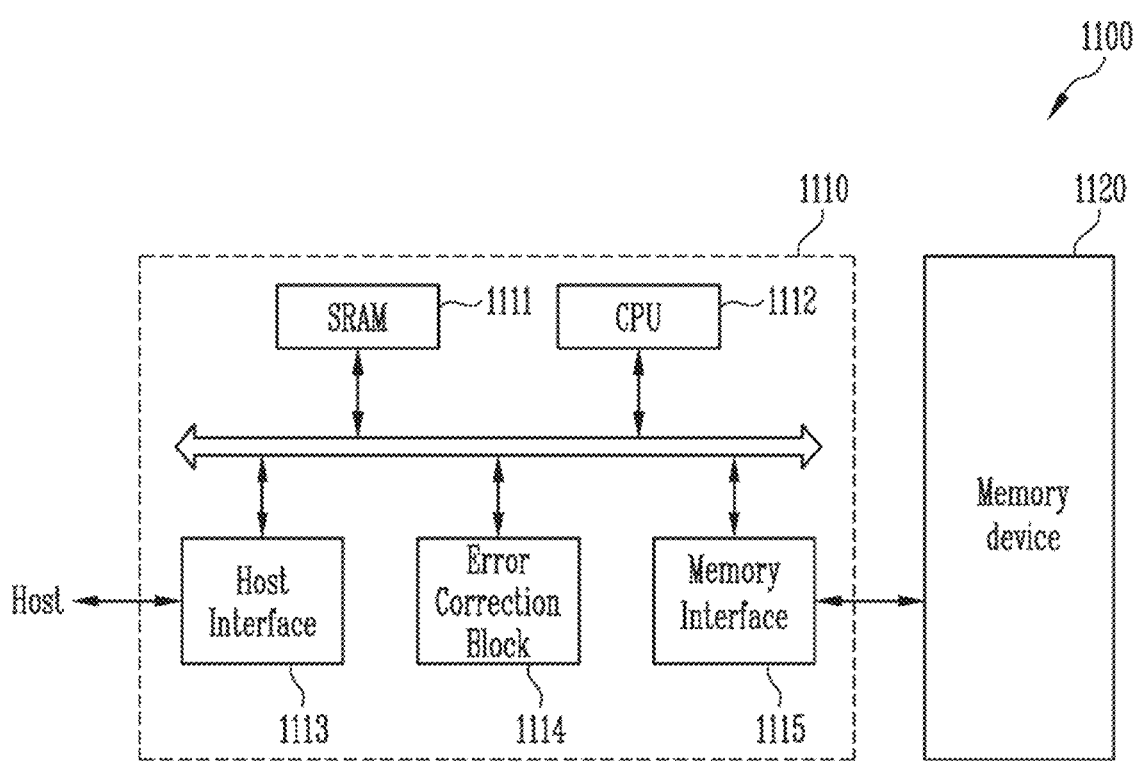
FIG. 21 is a block diagram illustrating the configuration of a memory system according to an embodiment of the present disclosure.

FIG. 21 is a block diagram illustrating the configuration of a memory system 1100 according to an embodiment of the present disclosure.

Referring to FIG. 21, the memory system 1100 may include a memory device 1120 and a memory controller 1110.

The memory device 1120 may be a multi-chip package composed of a plurality of flash memory chips. The memory device 1120 may include a first stack including a lower stepped structure, a support pillar passing through the first stack and including an insulating layer, a second stack opening the lower stepped structure and the support pillar and including an upper stepped structure, and a channel structure passing through the first stack and the second stack.

The memory controller 1110 may be configured to control the memory device 1120 and include a static random access memory (SRAM) 1111, a central processing unit (CPU) 1112, a host interface 1113, an error correction block 1114, and a memory interface 1115. The SRAM 1111 may serve as an operation memory of the CPU 1112, the CPU 1112 may perform a control operation for data exchange of the memory controller 1110, and the host interface 1113 may include a data exchange protocol of a host accessing the memory system 1100. In addition, the error correction block 1114 may detect and correct errors included in the data read from the memory device 1120, and the memory interface 1115 may perform interfacing with the memory device 1120. The memory controller 1110 may further include a read-only memory (ROM) that stores code data to interface with the host.

The memory system 1100 having the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of the interface protocols including Universal Serial Bus (USB), MultiMedia Card (MMC), Peripheral Component Interconnection-Express (PCI-E), Serial Advanced Technology Attachment (SATA), Parallel Advanced Technology Attachment (PATA), Small Computer Small Interface (SCSI), Enhanced Small Disk Interface (ESDI), and Integrated Drive Electronics (IDE).

Figure 22:
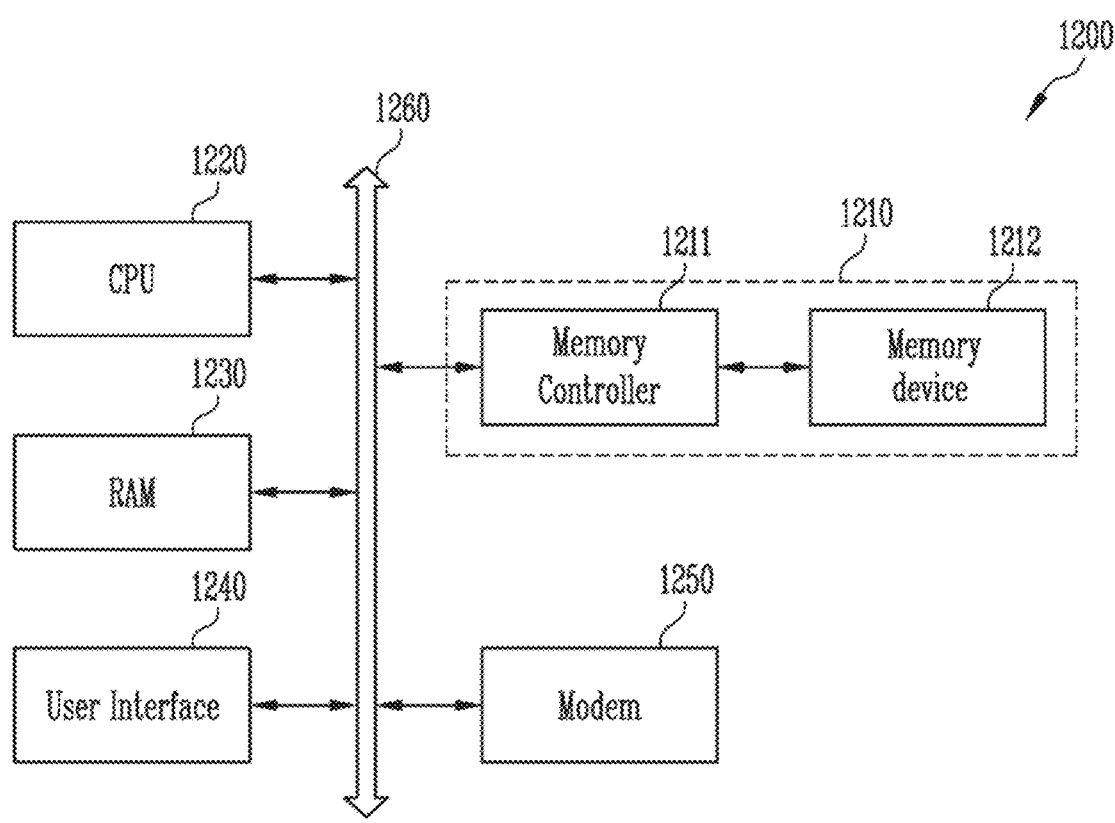
FIG. 22 is a block diagram illustrating the configuration of a computing system according to an embodiment of the present disclosure.

FIG. 22 is a block diagram illustrating the configuration of a computing system 1200 according to an embodiment of the present disclosure.

Referring to FIG. 22, the computing system 1200 may include a CPU 1220, Random Access Memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, an application chipset, an image processor, a mobile DRAM, and the like may be further included.

The memory system 1210 may include a memory device 1212 and a memory controller 1211. The memory device 1212 may include a first stack including a lower stepped structure, a support pillar passing through the first stack and including an insulating layer, a second stack opening the lower stepped structure and the support pillar and including an upper stepped structure, and a channel structure passing through the first stack and the second stack.

According to the present disclosure, structural stability of a first stacked body having a lower stepped structure and stability of manufacturing processes may be improved by a pillar structure penetrating the first stacked body.

According to the present disclosure, after a second stacked body is formed on the first stacked body, a stepped structure of the first stacked body and a stepped structure of the second stacked body may be separately formed, so that processes for forming the stepped structures may be simplified.

What is claimed is:
1. A semiconductor memory device, comprising:
a first stack including lower conductive patterns separated from each other and stacked over a substrate to form a lower stepped structure;
a second stack including upper conductive patterns separated from each other and stacked over the first stack to form an upper stepped structure, wherein the second stack does not overlap with the lower stepped structure;
an insulating layer covering the lower stepped structure and the upper stepped structure;
a first support pillar extending from the insulating layer to pass through the first stack;
a channel structure passing through the second stack and the first stack;
a memory layer adjacent to a sidewall of the channel structure; and
a channel connecting pattern arranged between the substrate and the first stack, the channel connecting pattern penetrating the memory layer to contact the channel structure,
wherein the channel connecting pattern extends into a groove included in the first support pillar.
2. A semiconductor memory device, comprising:
a first stack including lower conductive patterns separated from each other and stacked over a substrate to form a lower stepped structure;
a second stack including upper conductive patterns separated from each other and stacked over the first stack to form an upper stepped structure, wherein the second stack does not overlap with the lower stepped structure;

an insulating layer over the lower stepped structure of the first stack and the upper stepped structure of the second stack;
a channel structure passing through a cell array region of each of the second stack and the first stack; and
a memory layer adjacent to a sidewall of the channel structure,
wherein the insulating layer extends into the lower stepped structure to pass through a contact region of the first stack so that stepped structure layers are on both sides of the insulating layer, and
wherein the insulating layer extends through the first stack and connects with a channel connecting pattern.

3. The semiconductor memory device of claim 1, further comprising:
isolation layers formed in the substrate to divide first active regions and a second active region of the substrate from each other;
transistors of a peripheral circuit formed on the first active regions; and
a discharge impurity region formed in the second active region.

4. The semiconductor memory device of claim 3, further comprising:
a semiconductor layer arranged between the substrate and the channel connecting pattern, the semiconductor layer surrounding a lower portion of the channel structure and a lower portion of the memory layer; and
a first lower contact plug connected to a first semiconductor pattern including the channel connecting pattern and the semiconductor layer and the discharge impurity region,
wherein the memory layer is penetrated by the channel connecting pattern to be separated into a first memory pattern and a second memory pattern.

5. The semiconductor memory device of claim 4, wherein the first support pillar overlaps with the first semiconductor pattern.

6. The semiconductor memory device of claim 4, further comprising:
a second semiconductor pattern separated from the first semiconductor pattern;
a second lower contact plug connected to the second semiconductor pattern and the discharge impurity region; and
a second support pillar overlapping with the second semiconductor pattern and extending into the second semiconductor pattern.

7. The semiconductor memory device of claim 3, further comprising:
a lower contact plug connected to one of the transistors;
a third semiconductor pattern overlapping with the lower contact plug and separated from a first semiconductor pattern;
a contact plug passing through the second stack, the first stack, and the third semiconductor pattern to contact the lower contact plug; and
a dummy memory layer arranged between the contact plug and each of the first stack and the second stack to surround a sidewall of the contact plug, the dummy memory layer including a same material as the memory layer.

8. The semiconductor memory device of claim 7, wherein the contact plug, the lower conductive patterns and the upper conductive patterns include a same conductive material as each other.

9. The semiconductor memory device of claim 3, further comprising:
a lower contact plug connected to one of the transistors;
a fourth semiconductor pattern overlapping with the lower contact plug;
a dummy stacked body overlapping with the fourth semiconductor pattern;
a contact plug passing through the dummy stacked body and the fourth semiconductor pattern to contact the lower contact plug; and
a dummy memory layer surrounding a sidewall of the contact plug.

10. The semiconductor memory device of claim 9, wherein the contact plug, the lower conductive patterns and the upper conductive patterns include a same conductive material as each other.

11. A semiconductor memory device, comprising:
a substrate including a first area and a second area;
a first semiconductor pattern and a second semiconductor pattern overlapping with the first area and separated from each other in a plane parallel to an upper surface of the substrate;
a first stack including lower conductive patterns separately stacked over the first and second semiconductor patterns to form a lower stepped structure;
a first insulating pillar passing through the first stack and extending into the first semiconductor pattern;
a second insulating pillar passing through the first stack and extending into the second semiconductor pattern;
a second stack including upper conductive patterns separately stacked over the first stack to form an upper stepped structure, wherein the second stack does not overlap with the lower stepped structure and the first and second insulating pillars;
a channel structure passing through the second stack and the first stack and extending into the first semiconductor pattern; and
a memory layer adjacent to a sidewall of the channel structure.

12. The semiconductor memory device of claim 11, wherein the first semiconductor pattern comprises:
a semiconductor layer extending to cover a lower portion of the channel structure, a lower portion of the memory layer, and a lower portion of the first insulating pillar; and
a channel connecting pattern arranged on the semiconductor layer to surround the channel structure and the first insulating pillar,
wherein the memory layer is penetrated by the channel connecting pattern to be separated into a first memory pattern and a second memory pattern so that the channel connecting pattern contacts the channel structure.

13. The semiconductor memory device of claim 12, wherein the first insulating pillar overlaps with the first semiconductor pattern and includes a groove into which the channel connecting pattern is inserted.

14. The semiconductor memory device of claim 11, further comprising:
isolation layers formed in the substrate to divide first active regions and a second active region of the substrate from each other;
transistors of a peripheral circuit formed on the first active regions;
a discharge impurity region formed in the second active region;
a first lower contact plug connected to the discharge impurity region and the first semiconductor pattern;

a second lower contact plug connected to the discharge impurity region and the second semiconductor pattern;

a third lower contact plug connected to one of the transistors;

a third semiconductor pattern overlapping with the third lower contact plug and separated from the first and second semiconductor patterns on the plane;

a contact plug coupled to the third lower contact plug and extending to penetrate the third semiconductor pattern; and a dummy memory layer surrounding a sidewall of the contact plug and including a same material as the memory layer.

15. The semiconductor memory device of claim 14, wherein the third semiconductor pattern overlaps with the first area;

wherein the first and second stacks overlap with the third semiconductor pattern; and wherein the contact plug and the dummy memory layer extend to pass through the first stack and the second stack.

16. The semiconductor memory device of claim 14, further comprising a dummy stacked body including interlayer insulating layers and sacrificial layers stacked alternately on the third semiconductor pattern, wherein the third semiconductor pattern overlaps with the second area, and wherein the contact plug and the dummy memory layer extend to penetrate the dummy stacked body.

\* \* \* \* \*